United States Patent
Fukami et al.

(10) Patent No.: US 8,592,930 B2
(45) Date of Patent: Nov. 26, 2013

(54) MAGNETIC MEMORY ELEMENT, MAGNETIC MEMORY AND INITIALIZING METHOD

(75) Inventors: Shunsuke Fukami, Tokyo (JP);
Tetsuhiro Suzuki, Tokyo (JP);
Kiyokazu Nagahara, Tokyo (JP);
Norikazu Ohshima, Tokyo (JP);
Nobuyuki Ishiwata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/504,071

(22) PCT Filed: Oct. 21, 2010

(86) PCT No.: PCT/JP2010/068590
§ 371 (c)(1),
(2), (4) Date: Jul. 16, 2012

(87) PCT Pub. No.: WO2011/052475
PCT Pub. Date: May 5, 2011

(65) Prior Publication Data
US 2012/0278582 A1    Nov. 1, 2012

(30) Foreign Application Priority Data
Oct. 26, 2009 (JP) ................................. 2009-245947

(51) Int. Cl.
*H01L 29/82* (2006.01)
*G11C 11/02* (2006.01)

(52) U.S. Cl.
USPC ........... 257/421; 257/422; 257/423; 257/424; 257/427; 257/E29.323; 438/3; 365/158; 365/171; 365/172; 365/173; 360/324.2; 360/326

(58) Field of Classification Search
USPC ........ 257/20, 414, 421–427, E29.323; 438/3; 365/157–158, 171–173; 360/324–326
See application file for complete search history.

(56) References Cited

U.S. PATENT DOCUMENTS

2010/0193889 A1*  8/2010  Nagahara et al. ............. 257/421

FOREIGN PATENT DOCUMENTS

| JP | 2004-153248 A | 5/2004 |
|----|---------------|--------|
| JP | 2005-191032 A | 7/2005 |
| JP | 2005-209251 A | 8/2005 |
| JP | 2008-147488 A | 6/2008 |

(Continued)

OTHER PUBLICATIONS

Noboru Sakimura, et al., "MRAM Cell Technology for Over 500-MHz SoC", IEEE Journal of Solid-State Circuits, Apr. 2007, pp. 830-838, vol. 42, No. 4.

(Continued)

*Primary Examiner* — Jami M Valentine
(74) *Attorney, Agent, or Firm* — Sughrue Mion, PLLC

(57) ABSTRACT

A magnetic memory element includes: a first magnetization free layer; a non-magnetic layer; a reference layer; a first magnetization fixed layer group; and a first blocking layer. The first magnetization free layer is composed of ferromagnetic material with perpendicular magnetic anisotropy and includes a first magnetization fixed region, a second magnetization fixed region and a magnetization free region. The non-magnetic layer is provided near the first magnetization free layer. The reference layer is composed of ferromagnetic material and provided on the non-magnetic layer. The first magnetization fixed layer group is provided near the first magnetization fixed region. The first blocking layer is provided being sandwiched between the first magnetization fixed layer group and the first magnetization fixed region or in the first magnetization fixed layer group.

20 Claims, 41 Drawing Sheets

(56) References Cited

FOREIGN PATENT DOCUMENTS

| WO | 2009/019949 A1 | 2/2009 |
|---|---|---|
| WO | 2009/078244 A1 | 6/2009 |
| WO | 2009/122990 A1 | 10/2009 |

OTHER PUBLICATIONS

A. Yamaguchi, et al., "Real-Space Observation of Current-Driven Domain Wall Motion in Submicron Magnetic Wires", Physical Review Letters, Feb. 19, 2004, pp. 077205-1-077205-4, vol. 92, No. 7.

S. Fukami, et al., "Micromagnetic analysis of current driven domain wall motion in nanostrips with perpendicular magnetic anisotropy", Journal of Applied Physics, Jan. 31, 2008, pp. 07E718-1-07E718-3, vol. 103.

Tomohiro Koyama, et al., "Control of Domain Wall Position by Electrical Current in Structured Co/Ni Wire with Perpendicular Magnetic Anisotropy", Applied Physics Express, Oct. 10, 2008, pp. 101303-1-101303-3, vol. 1.

\* cited by examiner

US 8,592,930 B2

MAGNETIC MEMORY ELEMENT, MAGNETIC MEMORY AND INITIALIZING METHOD

CROSS REFERENCE TO RELATED APPLICATION

This application is a National Stage of International Application No. PCT/JP2010/068590 filed Oct. 21, 2010, claiming priority based on Japanese Patent Application No. 2009-245947 filed Oct. 26, 2009, the contents of all of which are incorporated herein by reference in their entirety.

TECHNICAL FIELD

The present invention relates to a magnetic memory element, a magnetic memory and an initializing method. Particularly, the present invention relates to a magnetic memory element, a magnetic memory and an initializing method, to which domain wall motion is applied and which is composed of material having perpendicular magnetic anisotropy.

BACKGROUND ART

A magnetic memory, especially a magnetic random access memory (MRAM) operates as a nonvolatile memory capable of a high-speed operation and rewriting an infinite number of times. Therefore, some types of MRAMs have been put into practical use, and some types of MRAMs have been developing to improve their general versatility. In the MRAM, a magnetic material is used as a memory element, and data is stored in the memory element as a magnetization direction of the memory element. Some methods for switching the magnetization direction of the memory element are proposed. Those methods have in common with usage of a current. To put a MRAM into practical use, it is important to reduce the writing current as much as possible. According to the non-patent literature 1 (N. Sakimura et al., "MRAM Cell Technology for Over 500-MHz SoC", IEEE Journal of Solid-State Circuits, vol. 42, p. 830 (2007)), it is required that the wiring current should be reduced to be equal to or less than 0.5 mA, preferably equal to or less than 0.2 mA. This is because the minimum layout can be applied to the 2T-1MTJ (Two transistors—One Magnetic tunnel junction) circuit configuration proposed in the non-patent literature 1 to realize the cost performance equal to or more than that of the existing volatile memory.

The most general method of writing data in a MRAM is to switch a magnetization direction of a magnetic memory element by a magnetic field which is generated by passing a current through a wiring line for a writing operation prepared on the periphery of the magnetic memory element. Since this method uses a magnetization switching caused by the magnetic field, the MRAM can theoretically perform writing at a speed of 1 nano-second or less and thus, the MRAM is suitable for a high-speed MRAM. However, a magnetic field for switching magnetization of a magnetic material securing thermal stability and resistance against external disturbance magnetic field is generally a few dozens of [Oe]. In order to generate such magnetic field, a writing current of about a few mA is needed. In this case, a chip area is necessarily large and power consumed for writing increases. Therefore, this MRAM is not competitive with other kinds of random access memories. In addition, when a size of a memory cell is miniaturized, a writing current further increases and is not scaling, which is not preferable.

Recently, as methods to solving these problems, following two methods are proposed. The first method is a method using a spin transfer magnetization switching. This method uses a lamination layer including a first magnetic layer (magnetization free layer) which has magnetization that can be switched, and a second magnetic layer (reference layer) which is electrically connected to the first magnetic layer and has magnetization that is fixed. In the method, the magnetization in the first magnetic layer (magnetization free layer) is switched by using an interaction between spin-polarized conduction electrons and localized electrons in the first magnetic layer (magnetization free layer) when a current flows between the second magnetic layer (reference layer) and the first magnetic layer (magnetization free layer). A reading operation is carried out by using a magnetoresistive effect generated between the first magnetic layer (magnetization free layer) and the second magnetic layer (reference layer). Therefore, the MRAM using the spin transfer magnetization switching method is an element having two terminals. The spin transfer magnetization switching is generated when a current density is equal to or more than a certain value. Accordingly, as the size of the element decreases, the writing current is also reduced. In other words, the spin transfer magnetization switching method is excellent in scaling performance. However, generally, an insulating film is provided between the first magnetic layer (magnetization free layer) and the second magnetic layer (reference layer) and a relatively large current should be made to flow through the insulating film in the writing operation. Thus, there are problems regarding resistance to writing and reliability. In addition, there is concern that a writing error occurs in the reading operation because a current path of the writing operation is the same as that of the reading operation. As mentioned above, although the spin transfer magnetization switching method is excellent in scaling performance, there are some obstacles to put it into practical use.

On the other hand, the second method, which is a magnetization switching method using a current induced domain wall motion effect, can solve the above-mentioned problems that the spin transfer magnetization switching method is confronted with. For example, a MRAM using the current induced domain wall motion effect is disclosed in the patent literature 1 (Japanese patent publication JP2005-191032A). Regarding the above MRAM using the current induced domain wall motion effect, in the first magnetic layer (magnetization free layer) having the magnetization which can be switched, generally, magnetization of both end portions is fixed such that the magnetization of one end portion is approximately anti-parallel to that of the other end portion. In the case of such magnetization arrangement, a domain wall is introduced into the first magnetic layer. Here, as reported in the non-patent literature 2 (A. Yamaguchi et al., "Real-Space Observation of Current-Driven Domain Wall Motion in Sub-micron Magnetic Wires", Physical Review Letters, vol. 92, p. 077205 (2004)), when a current flows through the domain wall, the domain wall moves in the direction same as the direction of the conduction electrons. Therefore, the data writing can be realized by making the current flow inside the first magnetic layer (magnetization free layer). The data reading is realized by using the magnetoresistive effect caused by a magnetic tunnel junction provided in a region where the domain wall moves. Therefore, the MRAM using the current induced domain wall motion method is an element having three terminals, and fits in the 2T-1MTJ configuration proposed in the above-mentioned non-patent literature 1. The current induced domain wall motion is generated when the current density is equal to or more than a certain value. Thus, this MRAM has the scaling property similar to the MRAM using the spin transfer magnetization switching. In addition, in the MRAM element using the current induced domain wall motion, the writing current does not flow through the insulating layer in the magnetic tunnel junction and the current path of the writing operation is different from that of the reading operation. Consequently, the above-mentioned problems caused in the spin transfer magnetization switching can be solved.

Meanwhile, in the non-patent literature 2, a current density of approximately $1 \times 10^8$ A/cm$^2$ is required for the current induced driven domain wall motion. For example, it is assumed that a width and a thickness of a layer where the domain wall motion arises are 100 nm and 10 nm, respectively. In this case, the writing current is 1 mA. This cannot satisfy the above-described condition for the writing current. However, as described in the non-patent literature 3 (S. Fukami et al., "Micromagnetic analysis of current driven domain wall motion in nanostrips with perpendicular magnetic anisotropy", Journal of Applied Physics, vol. 103, p. 07E718 (2008)), it is reported that, by using a material having perpendicular magnetic anisotropy as a ferromagnetic layer (magnetization free layer) where the current induced domain wall motion arises, the writing current can be sufficiently reduced. Because of this, in the case of manufacturing an MRAM using the current induced domain wall motion, it is preferable to use a ferromagnetic material having perpendicular magnetic anisotropy as a layer (magnetization free layer) where the domain wall motion arises.

As a related art, Japanese patent publication JP2004-153248A (corresponding to U.S. Pat. No. 7,218,484 (B2)) discloses a magnetoresistive effect element, a manufacturing method of the same, a magnetic head and a magnetic reproducing device. In the magnetoresistive effect element includes a magnetoresistive effect film, a pair of electrodes and a phase separating layer. The magnetoresistive effect film includes: a first ferromagnetic layer whose magnetization direction is substantially fixed in one direction; a second ferromagnetic layer whose magnetization direction is varied depending on an external magnetic field; and a middle layer formed between the first and second ferromagnetic layers. The pair of electrodes is electrically connected to the magnetoresistive effect film such that it can make a sense current flow in a direction approximately perpendicular to a film surface of the magnetoresistive effect film. The phase separating layer includes a first phase and a second phase into which alloy composed of a several kind of elements is separated within a solid phase. One of the first phase and the second phase contains at least one element selected from a group consist of oxygen, nitrogen, fluorine and carbon with high density. The phase separating layer is formed between the pair of electrodes.

Japanese patent publication JP2005-209251A discloses an initializing method of a magnetic memory. In the initializing method of a magnetic memory, the magnetic memory includes: magnetic memory elements in each of which a memory layer holding information by a magnetization state of a magnetic material is composed of a plurality of magnetic layers; and, first wiring lines and second wiring lines intersecting with each other, wherein the magnetic memory elements are provided near intersection points where the first wiring lines and the second wiring lines intersect with each other. In the initializing method, by stopping of applying current pulses to the first wiring lines and current pulses to the second wiring lines at approximately the same time, magnetization stats of the memory layers of the magnetic memory elements are made to be in the same state.

Japanese patent publication JP2008-147488A discloses a magnetoresistive effect element and a MRAM. The magnetoresistive effect element includes: at least two of first magnetization fixed layers whose magnetization direction is fixed; a magnetization free layer whose magnetization direction is variable and which is formed on a first plane; and a second magnetization fixed layer which is connected to the magnetization free layer through a non-magnetic layer and whose magnetization direction is fixed. The two first magnetization fixed layers are arranged facing the second magnetization fixed layer through the magnetization free layer and are magnetically coupled with the magnetization free layer. Both of the magnetization of the two first magnetization fixed layer has a component in a first direction perpendicular to the first plane. In a data writing operation, a writing current is made to flow from one end of the magnetization free layer to the other end within the first plane.

CITATION LIST

Patent Literature

[PTL 1] JP2005-191032A
[PTL 2] JP2004-153248A
[PTL 3] JP2005-209251A
[PTL 4] JP2008-147488A

Non Patent Literature

[NPL 1] N. Sakimura et al., "MRAM Cell Technology for Over 500-MHz SoC", IEEE Journal of Solid-State Circuits, vol. 42, p. 830 (2007).
[NPL 2] A. Yamaguchi et al., "Real-Space Observation of Current-Driven Domain Wall Motion in Submicron Magnetic Wires", Physical Review Letters, vol. 92, p. 077205 (2004).
[NPL 3] S. Fukami et al., "Micromagnetic analysis of current driven domain wall motion in nanostrips with perpendicular magnetic anisotropy", Journal of Applied Physics, vol. 103, p. 07E718 (2008).
[NPL 4] T. Koyama et al., "Control of Domain Wall Position by Electrical Current in Structured Co/Ni Wire with Perpendicular Magnetic Anisotropy" Applied Physics Express, vol. 1, p. 101303 (2008).

SUMMARY OF INVENTION

Here, in the case of manufacturing a MRAM in which the current induced domain wall motion is applied to an information writing method and a layer where the domain wall motion arises is composed of the material with perpendicular magnetic anisotropy, it is required that the layer (the magnetization free layer) where the domain wall motion arises includes: two regions (magnetization fixed regions) in which their magnetization is fixed anti-parallel to each other; and a region (a domain wall motion region) in which the domain wall motion arises. Here, as the magnetization fixed regions, a first magnetization fixed region whose magnetization is fixed in a first direction and a second magnetization fixed region whose magnetization is fixed in a second direction are required. Therefore, in the case of manufacturing the MRAM, a process (initialization) that the magnetization of the first fixed region and the magnetization of the second fixed region are fixed anti-parallel to each other is required.

To perform the initialization, applying of an external magnetic field is considered. In this case, the magnitude of the magnetic field capable of the initialization is limited to a certain finite range (an initialization margin). Here, it is difficult that the initialization margin obtain is made larger only if magnetic properties of the first magnetization fixed region is made different from those of the second magnetization fixed region. For making a capacity larger and making a fabrication yield higher, it is preferable that the initialization margin is as large as possible and a structure applicable to the initialization can be manufactured as easy as possible.

An object of the present invention is to provide a structure and an initializing method that can acquire a large initialization margin in a MRAM in which the current induced domain wall motion is applied to an information writing method and a layer where the domain wall motion arises is composed of material with perpendicular magnetic anisotropy.

A magnetic memory element of the present invention includes: a first magnetization free layer; a non-magnetic layer; a reference layer; a first magnetization fixed layer group; and a first blocking layer. The first magnetization free layer is composed of ferromagnetic material with perpendicular magnetic anisotropy and includes a first magnetization fixed region, a second magnetization fixed region and a magnetization free region coupled with the first magnetization fixed region and the second magnetization fixed region. The non-magnetic layer is provided near the first magnetization free layer. The reference layer is composed of ferromagnetic material and provided on the non-magnetic layer. The first magnetization fixed layer group is provided near the first magnetization fixed region. The first blocking layer is provided being sandwiched between the first magnetization fixed layer group and the first magnetization fixed region or in the first magnetization fixed layer group.

A magnetic memory of the present invention includes: the above-described plurality of magnetic memory elements configured to be arranged in a matrix; and a control circuit configured to control writing and reading of data to and from each of the plurality of magnetic memory elements.

An initializing method of a magnetic memory element of the present invention includes: applying a first magnetic field to the magnetic memory element in a direction approximately perpendicular to an upper surface of a first magnetization free layer; and applying a second magnetic field whose absolute value is smaller than that of the first magnetic field to the magnetic memory element in a direction opposite to that of the first magnetic field. Here, the magnetic memory element includes: the first magnetization free layer; a non-magnetic layer; a reference layer; a first magnetization fixed layer group; and a first blocking layer. The first magnetization free layer is composed of ferromagnetic material with perpendicular magnetic anisotropy and includes a first magnetization fixed region, a second magnetization fixed region and a magnetization free region coupled with the first magnetization fixed region and the second magnetization fixed region. The non-magnetic layer is provided near the first magnetization free layer. The reference layer is composed of ferromagnetic material and provided on the non-magnetic layer. The first magnetization fixed layer group is provided near the first magnetization fixed region. The first blocking layer is provided being sandwiched between the first magnetization fixed layer group and the first magnetization fixed region or in the first magnetization fixed layer group.

An initializing method of a magnetic memory of the present invention includes: performing the above-described initializing method of a magnetic memory element on a plurality of magnetic memory elements. Here, the magnetic memory includes: the plurality of magnetic memory elements configured to be arranged in a matrix. Each of the plurality of the magnetic memory elements includes: the first magnetization free layer; anon-magnetic layer; a reference layer; a first magnetization fixed layer group; and a first blocking layer. The first magnetization free layer is composed of ferromagnetic material with perpendicular magnetic anisotropy and includes a first magnetization fixed region, a second magnetization fixed region and a magnetization free region coupled with the first magnetization fixed region and the second magnetization fixed region. The non-magnetic layer is provided near the first magnetization free layer. The reference layer is composed of ferromagnetic material and provided on the non-magnetic layer. The first magnetization fixed layer group is provided near the first magnetization fixed region. The first blocking layer is provided being sandwiched between the first magnetization fixed layer group and the first magnetization fixed region or in the first magnetization fixed layer group.

According to the present invention, in a MRAM in which the current induced domain wall motion is applied to an information writing method and a layer where the domain wall motion arises is composed of material with perpendicular magnetic anisotropy, a structure and an initializing method that can acquire a large initialization margin can be provided.

DESCRIPTION OF EMBODIMENTS

A magnetic memory element, a magnetic memory and an initializing method according to exemplary embodiments of the present invention will be described with reference to accompanying drawings. The magnetic memory according to the exemplary embodiment of the present invention includes a plurality of magnetic memory cells arranged in an array, each magnetic memory cell including the magnetic memory element.

(Structure)

Figure 1A:
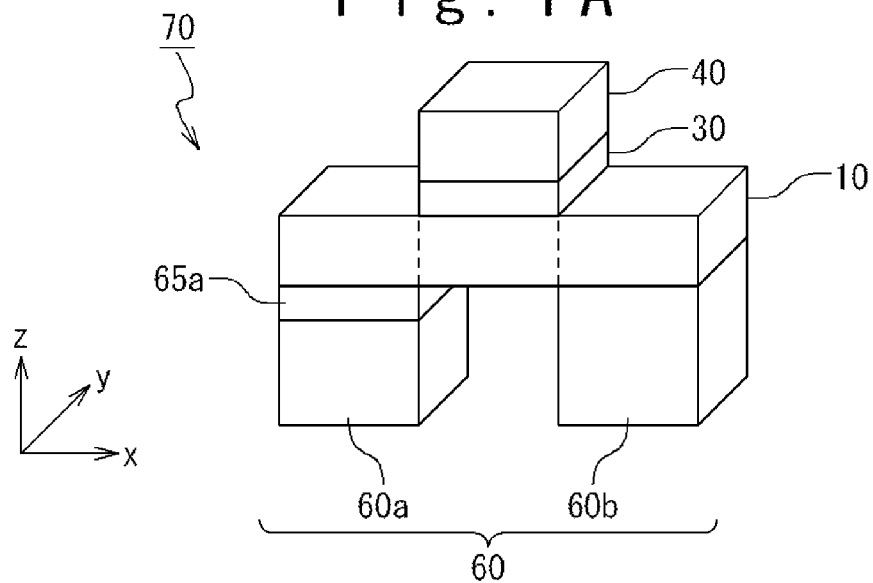
FIG. 1A schematically shows a typical structure of a main portion of a magnetic memory element according to an exemplary embodiment of the present invention.
Figure 1B:
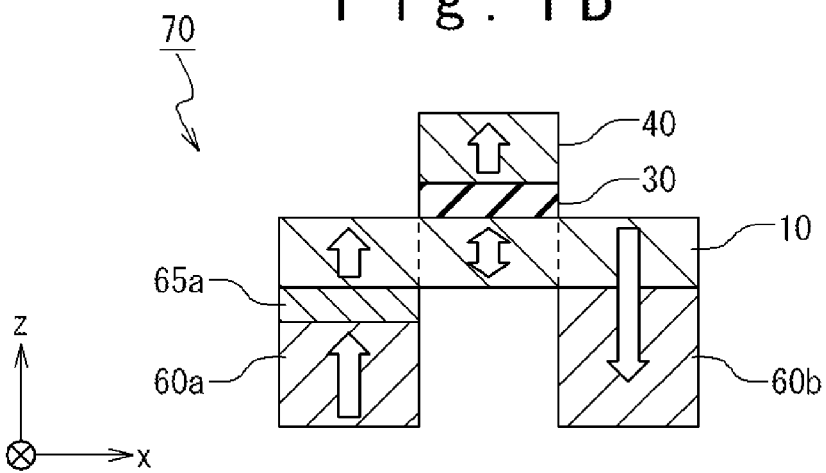
FIG. 1B schematically shows the typical structure of the main portion of the magnetic memory element according to the exemplary embodiment of the present invention.
Figure 1C:
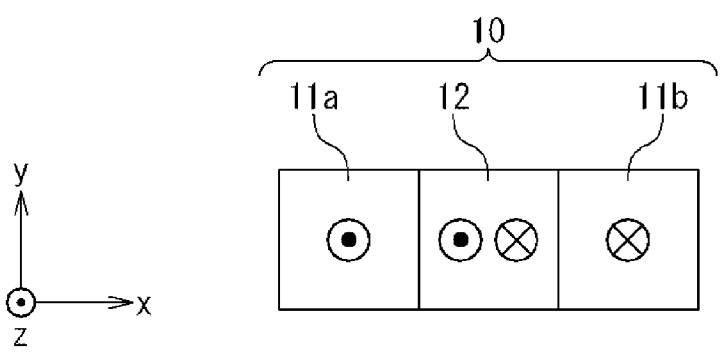
FIG. 1C schematically shows the typical structure of the main portion of the magnetic memory element according to the exemplary embodiment of the present invention.

First, a structure of the magnetic memory element according to the exemplary embodiment of the present invention will be described. FIGS. 1A to 1C schematically show a typical structure of a main portion of the magnetic memory element according to the exemplary embodiment of the present invention. FIG. 1A shows its perspective view. FIG. 1B shows its x-z sectional view. FIG. 1C shows its x-y sectional view. Here, in the x-y-z coordinate system shown in the drawings, the z axis indicates the direction perpendicular to the substrate surface, and the x and y axes indicate the directions parallel to the substrate surface.

A magnetic memory element 70 according to the exemplary embodiment of the present invention includes a first magnetization free layer 10, a non-magnetic layer 30, a reference layer 40, a magnetization fixed layer group 60, and a blocking layer 65. FIG. 1C is a plane view schematically showing the first magnetization free layer 10. The first magnetization free layer 10 is composed of ferromagnetic material having perpendicular magnetic anisotropy. The first magnetization free layer 10 includes three regions of a first magnetization fixed region 11a, a second magnetization fixed region 11b, and a magnetization free region 12. The first magnetization fixed region 11a and the second magnetization fixed region 11b have the magnetization substantially fixed in one direction. The magnetization of the first magnetization fixed region 11a and the magnetization of the second magnetization fixed region 11b are fixed anti-parallel to each other. In the case of FIG. 1C, the magnetization of the first magnetization fixed region 11a and the magnetization of the second magnetization fixed region 11b are fixed in the +z direction and the −z direction, respectively. The magnetization of the magnetization free region 12 can be inverted. In this case, it can turn in any of the +z direction and the −z direction.

When the three regions in the first magnetization free layer 10 have the above-described magnetization structures, a domain wall is formed at any of a boundary between the first magnetization fixed region 11a and the magnetization free region 12 and a boundary between the second magnetization fixed region 11b and the magnetization free region 12, depending on the magnetization direction of the magnetization free region 12. In the case of FIG. 1C, when the magnetization direction of the magnetization free region 12 is in the +z direction, the domain wall is formed at the boundary between the second magnetization fixed region 11b and the magnetization free region 12. When the magnetization direction of the magnetization free region 12 is in the −z direction, the domain wall is formed at the boundary between the first magnetization fixed region 11a and the magnetization free region 12.

In addition, in the case of FIGS. 1A to 1C, the first magnetization fixed region 11a is adjacent to one end of the magnetization free region 12, and the second magnetization fixed region 11b is adjacent to the other end of the magnetization free region 12. In the example of FIG. 1C, the first magnetization fixed region 11a is adjacent to the end of the −x direction side of the magnetization free region 12, and the second magnetization fixed region 11b is adjacent to the end of the +x direction side of the magnetization free region 12.

Furthermore, in the case of FIGS. 1A to 1C, the first magnetization free layer 10, the non-magnetic layer 30 and the reference layer 40 are provided being laminated in this order. The reference layer 40 is composed of ferromagnetic material. The non-magnetic layer 30 is composed of non-magnetic material and preferably composed of insulating material. In this case, the three layers of the first magnetization free layer 10, the non-magnetic layer 30 and the reference layer 40 constitute the magnetic tunnel junction (MTJ). Here, the non-magnetic layer 30 and the reference layer 40 coupled with the first magnetization free layer 10 through the non-magnetic layer 30 are coupled with the magnetization free region 12 of the magnetization free layer 10. In addition, shapes of the non-magnetic layer 30 and the reference layer 40 are arbitrary.

In the case of FIGS. 1A to 1C, the reference layer 40 is preferably composed of ferromagnetic material with perpendicular magnetic anisotropy and has the magnetization fixed substantially in one direction. In the case of FIG. 1B, the magnetization of the reference layer 40 is fixed in the +z direction. In addition, even though it is not shown in the drawings, the reference layer 40 may have the following lamination structure. For example, the reference layer 40 may have the structure that three layers of a ferromagnetic material layer, a non-magnetic material layer and a ferromagnetic material layer are laminated in this order. Here, the non-magnetic material layer sandwiched between the two ferromagnetic material layers preferably has the function that the upper and lower ferromagnetic material layers are magnetically coupled in the anti-parallel directions (synthetic-ferrimagnetically coupled). Ru is exemplified as the non-magnetic material having such function. By providing the reference layer 40 as the lamination structure having the synthetic ferrimagnetic coupling, a leakage magnetic field to outside can be reduced and its magnetic influence on the first magnetization free layer 10 and other layers can be decreased. Additionally, an anti-ferromagnetic material layer may be adjacent to the reference layer 40. This is because, by providing the anti-ferromagnetic material layer adjacent to the reference layer 40 and performing a heat treatment on them in a magnetic field, the magnetization direction of the boundary surface can be fixed in one direction. Pt—Mn is exemplified as the typical anti-ferromagnetic material.

The magnetization fixed layer group 60 contains at least one of a ferromagnetic material layer and an anti-ferromagnetic material layer. The magnetization fixed layer group 60 makes the magnetization direction of the first magnetization fixed region 11a and the magnetization direction of the second magnetization fixed region 11b anti-parallel to each other and it also makes each magnetization fixed in one direction. As shown in FIG. 1, the magnetization fixed layer group 60 may include two regions of a first magnetization fixed layer group 60a and a second magnetization fixed layer 60b. Here, the first magnetization fixed layer group 60a is provided being magnetically coupled with the first magnetization fixed region 11a, and the second magnetization fixed layer group 60b is provided being magnetically coupled with the second magnetization fixed region 11b. Incidentally, the "magnetic coupling" described here includes not only the strong coupling by the exchange coupling but also the weak coupling by the magnetostatic coupling. In addition, in the example of FIGS. 1A to 1C, the first magnetization fixed layer group 60a and the second magnetization fixed layer group 60b are composed of ferromagnetic material. The first magnetization fixed layer group 60a and the first magnetization fixed region 11a are ferromagnetically coupled and the second magnetization fixed layer group 60b and the second magnetization fixed region 11b are ferromagnetically coupled.

The blocking layer 65 is provided adjacent to the magnetization fixed layer group 60 in the exemplary embodiment of the present invention. In the case of FIGS. 1A to 1C, the example is shown that the first blocking layer 65a is provided being sandwiched between the first magnetization fixed layer group 60a and the first magnetization fixed region 11a of the first magnetization free layer 10. Generally, the blocking layer 65 is provided being sandwiched between the magnetization fixed layer group 60 and the first magnetization free layer 10 or in the middle of the magnetization fixed layer group 60. By providing the blocking layer 65, the magnetization of the first magnetization fixed region 11a and the magnetization of the second magnetization fixed region 11b can be made to turn in the directions anti-parallel to each other. The specific method will be described later.

Even though it is not shown in the drawings, the first magnetization fixed region 11a and the second magnetization fixed region 11b are connected to respective different external wiring lines and the reference layer 40 is connected to another external wiring line. That is, the magnetic memory element 70 is an element with three terminals. Incidentally, when the first magnetization free layer 10 and the magnetization fixed layer group 60 are provided being electrically connected to each other, the magnetization fixed layer group 60 may be located on the path in which the first magnetization free layer 10 is connected to the external wiring lines. That is, in the example of FIG. 1, the first magnetization fixed layer group 60a and the second magnetization fixed layer group 60b may be connected to the respective different external wiring lines.

(Memory State)

Next, a memory state of the magnetic memory element according to the exemplary embodiment of the present invention will be described.

Figure 2A:
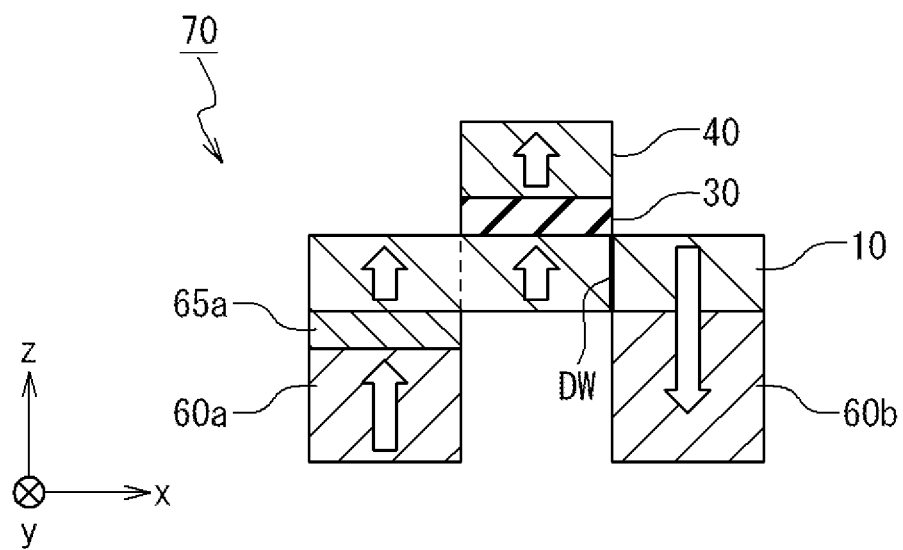
FIG. 2A schematically shows an example of a magnetization state in a memory state of one of "0" and "1" of the magnetic memory element according to the exemplary embodiment of the present invention.
Figure 2B:
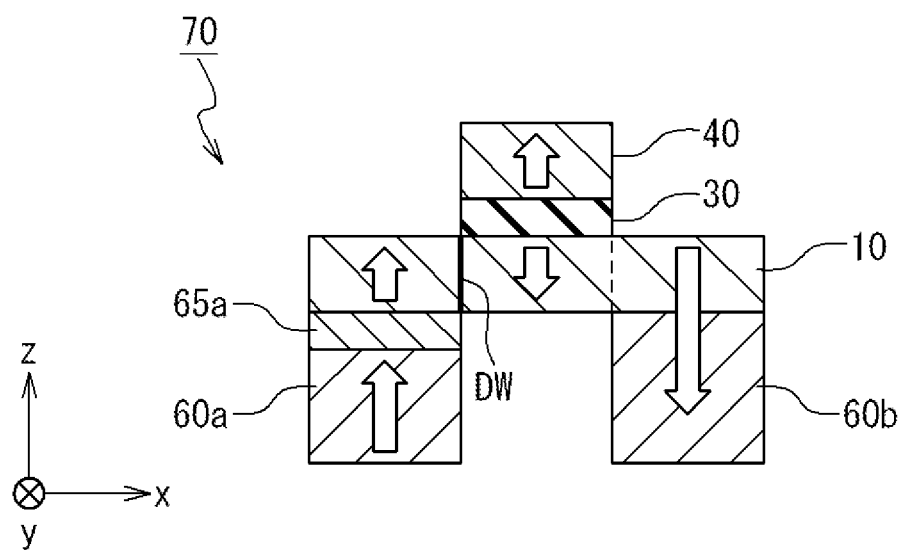
FIG. 2B schematically shows an example of a magnetization state in a memory state of the other of "0" and "1" of the magnetic memory element according to the exemplary embodiment of the present invention.

FIGS. 2A and 2B schematically show an example of a magnetization state in a memory state of respective "0" and "1" of the magnetic memory element according to the exemplary embodiment of the present invention. FIG. 2A shows the magnetization state in the "0" state. FIG. 2B shows the magnetization state in the "1" state. Here, it is assumed that the magnetization of the first magnetization fixed region 11a is fixed in the +z direction and the magnetization of the second magnetization fixed region 11b is fixed in the −z direction.

In the "0" state shown in FIG. 2A, the magnetization of the magnetization free region 12 has the +z direction component. In this case, the domain wall DW is formed at the boundary between the magnetization free region 12 and the second magnetization fixed region 11b. On the other hand, in the "1" state shown in FIG. 2B, the magnetization of the magnetization free region 12 has the −z direction component. In this case, the domain wall DW is formed at the boundary between the magnetization free region 12 and the first magnetization fixed region 11a. In FIGS. 2A and 2B, it is assumed that the magnetization of the reference layer 40 is fixed in the +z direction. In this case, in the "0" state shown in FIG. 2A and the "1" state shown in FIG. 2B, the magnetization configurations of the MTJ composed of the first magnetization free layer 10, the non-magnetic layer 30 and the reference layer 40 are parallel and anti-parallel, respectively. Therefore, when a current flows through the MTJ, a low resistance and a high resistance are realized, respectively. Here, the correspondence between the magnetization states and the memory states ("0", "1") defined in FIGS. 2A and 2B is arbitrary, and is not limited to this case.

(Writing Method)

Next, a method of writing information to the magnetic memory element according to the exemplary embodiment of the present invention will be described.

Figure 3A:
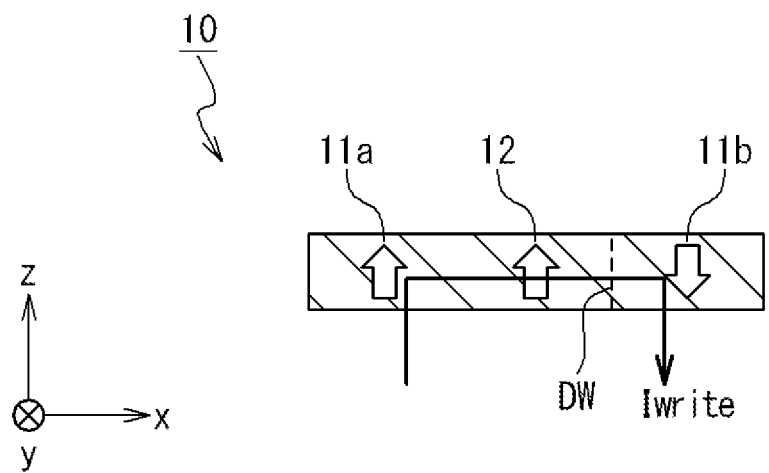
FIG. 3A schematically shows a method of writing information to the magnetic memory element according to the exemplary embodiment of the present invention.
Figure 3B:
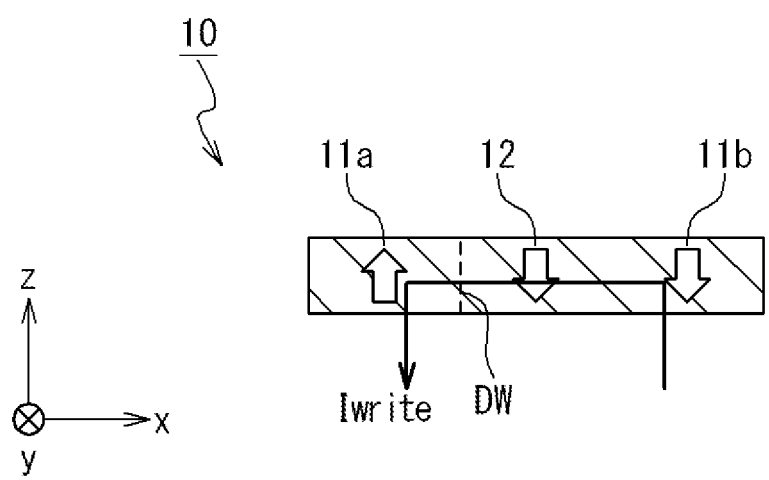
FIG. 3B schematically shows a method of writing information to the magnetic memory element according to the exemplary embodiment of the present invention.

FIGS. 3A and 3B schematically show a method of writing information to the magnetic memory element according to the exemplary embodiment of the present invention. Here, in FIGS. 3A and 3B, the layers other than the first magnetization free layer 10 are omitted for an easy way of understanding. Now, in the "0" state defined in FIG. 2A, the writing current is introduced in the direction (the +x direction) indicated by the arrow Iwrite in FIG. 3A. In this case, conduction electrons flow from the second magnetization fixed region 11b to the first magnetization fixed region 11a through the magnetization free region 12 in the first magnetization free layer 10. The spin transfer torque (STT) is applied to the domain wall DW formed at the boundary between the second magnetization fixed region 11b and the magnetization free region 12. As a result, the domain wall DW moves in the negative direction of the x axis. That is, the current induced domain wall motion arises. Here, conduction electrons decrease in the negative direction of the x axis farther away from the boundary between the magnetization free region 12 and the first magnetization fixed region 11a (because they also flow into the first magnetization fixed layer group 60a). Therefore, the domain wall DW stops at the boundary between the magnetization free region 12 and the first magnetization fixed region 11a. This state corresponds to the "1" state defined in FIG. 2B. As described above, the "1" writing can be performed.

In the "1" state defined in FIG. 2B, the writing current is introduced in the direction indicated by the arrow Iwrite in FIG. 3B. In this case, conduction electrons flow from the first magnetization fixed region 11a to the second magnetization fixed region 11b through the magnetization free region 12 in the first magnetization free layer 10. The spin transfer torque is applied to the domain wall DW formed at the boundary between the first magnetization fixed region 11a and the magnetization free region 12. As a result, the domain wall DW moves in the positive direction of the x axis. That is, the current induced domain wall motion arises. Here, conduction electrons decrease in the positive direction of the x axis farther away from the boundary between the magnetization free region 12 and the second magnetization fixed region 11b (because they also flow into the second magnetization fixed layer group 60b). Therefore, the domain wall DW stops at the boundary between the magnetization free region 12 and the second magnetization fixed region 11b. This state corresponds to the "0" state defined in FIG. 2A. As described above, the "0" writing can be performed. Incidentally, when the "0" writing is performed at the "0" state and when the "1" writing is performed at the "1" state, the state is not changed. That is, the over-writing can be performed.

(Reading Method)

Next, a method of reading information from the magnetic memory element according to the exemplary embodiment of the present invention will be described.

Figure 4A:
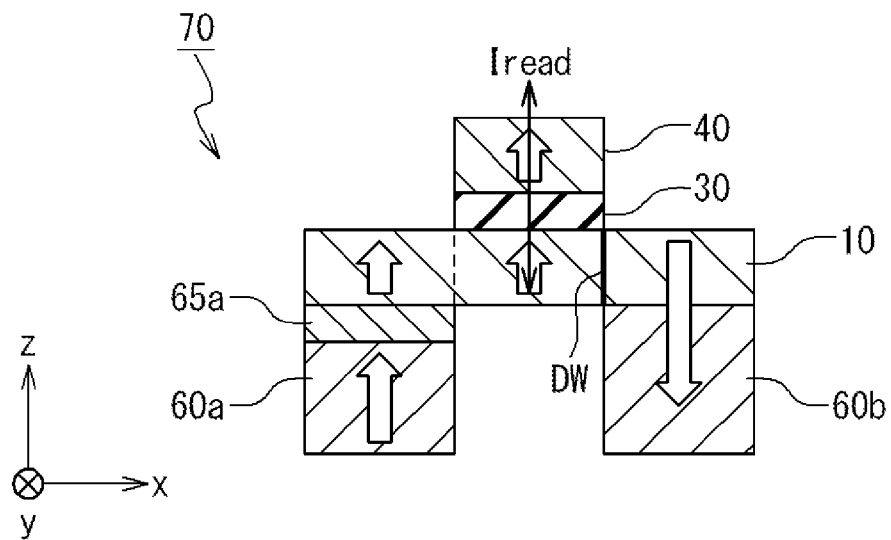
FIG. 4A schematically shows a method of reading information from the magnetic memory element according to the exemplary embodiment of the present invention.
Figure 4B:
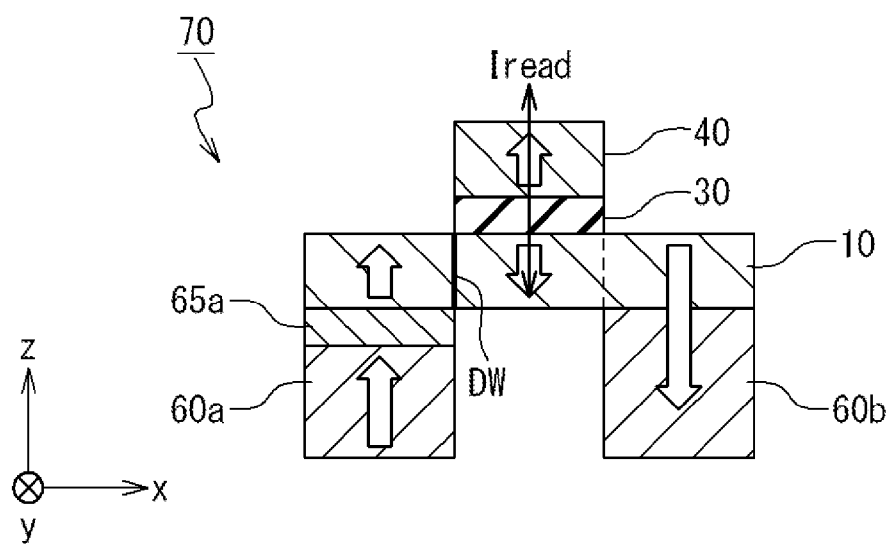
FIG. 4B schematically shows a method of reading information from the magnetic memory element according to the exemplary embodiment of the present invention.

FIGS. 4A and 4B schematically show a method of reading information from the magnetic memory element according to the exemplary embodiment of the present invention. Here, a method of reading information from the magnetic memory element 70 having the structure shown in FIG. 1 will be described. In the present exemplary embodiment, the information reading is performed by mainly using the tunneling magnetoresistive effect (the TMR effect). Therefore, the current Iread is introduced in a direction passing through the magnetic tunnel junction (the MTJ) composed of the first magnetization free layer 10 (the magnetization free region 12), the non-magnetic layer 30 and the reference layer 40. Here, the direction of the Iread is arbitrary.

As shown in FIG. 4A, when Iread is introduced in the "0" state defined in FIG. 2A, since the magnetization in the MTJ is in the parallel state, the low resistance can be realized. On the other hand, as shown in FIG. 4B, when Iread is introduced in the "1" state defined in FIG. 2B, since the magnetization in the MTJ is in the anti-parallel state, the high resistance can be realized. As described above, the information stored in the magnetic memory element 70 can be detected as the difference of the resistance value.

(Circuit Configuration)

Next, a circuit configuration for introducing the writing and reading currents into the magnetic memory cell 80 including the magnetic memory element 70 according to the exemplary embodiment of the present invention will be described.

Figure 5:
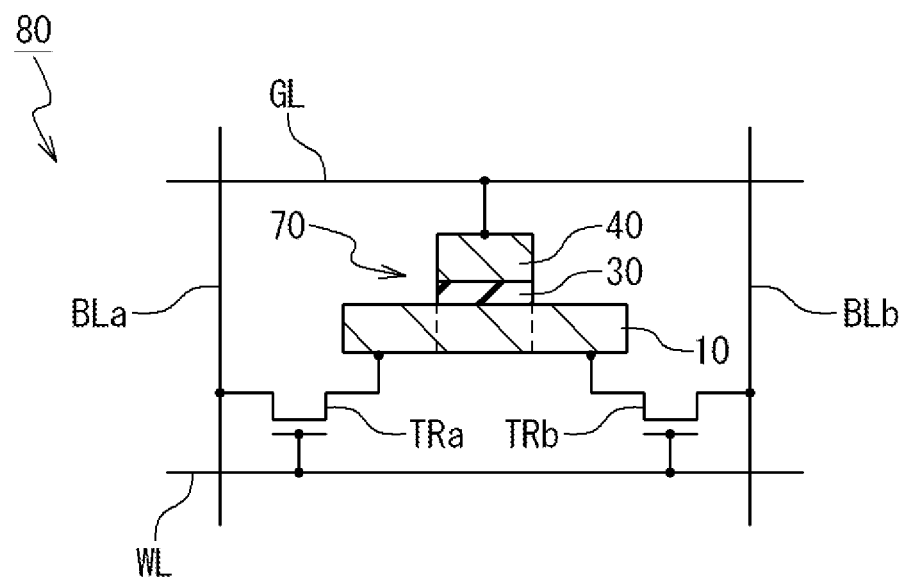
FIG. 5 shows a configuration example of a circuit for one bit of a magnetic memory cell according to the exemplary embodiment of the present invention.

FIG. 5 shows a configuration example of a circuit for one bit of the magnetic memory cell according to the exemplary embodiment of the present invention. In the example shown in FIG. 5, the magnetic memory element 70 is an element having three terminals and connected to a word line WL, a ground line GL, and a pair of bit lines BLa and BLb. For example, a terminal coupled with the reference layer 40 is connected to the ground line GL for reading. A terminal coupled with the first magnetization fixed region 11a (through the first magnetization fixed layer group 60a) is connected to one of a source and a drain of a transistor TRa, and the other is connected to the bit line BLa. A terminal coupled with the second magnetization fixed region 11b (through the second magnetization fixed layer group 60b) is connected to one of a source and a drain of a transistor TRb, and the other is connected to the bit line BLb. Gates of the transistors TRa and TRb are connected to the common word line WL.

At the data writing, the word line WL is set at the High level to make the transistors TRa and TRb turn on. One of the bit lines BLa and BLb is set at the High level, and the other is set at the Low level. As a result, through the first magnetization free layer 10 and the transistors TRa and TRb, the writing current flows between the bit lines BLa and BLb.

At the data reading, the word line WL is set at the High level to make the transistors TRa and TRb turn on. The bit line BLa is set at an open state. The bit line BLb is set at the High level. As a result, the reading current flows from the bit line BLb through the transistor TRb and the MTJ of the magnetic memory element 70 to the ground line GL. Consequently, the data reading by using the magnetoresistive effect can be performed.

Figure 6:
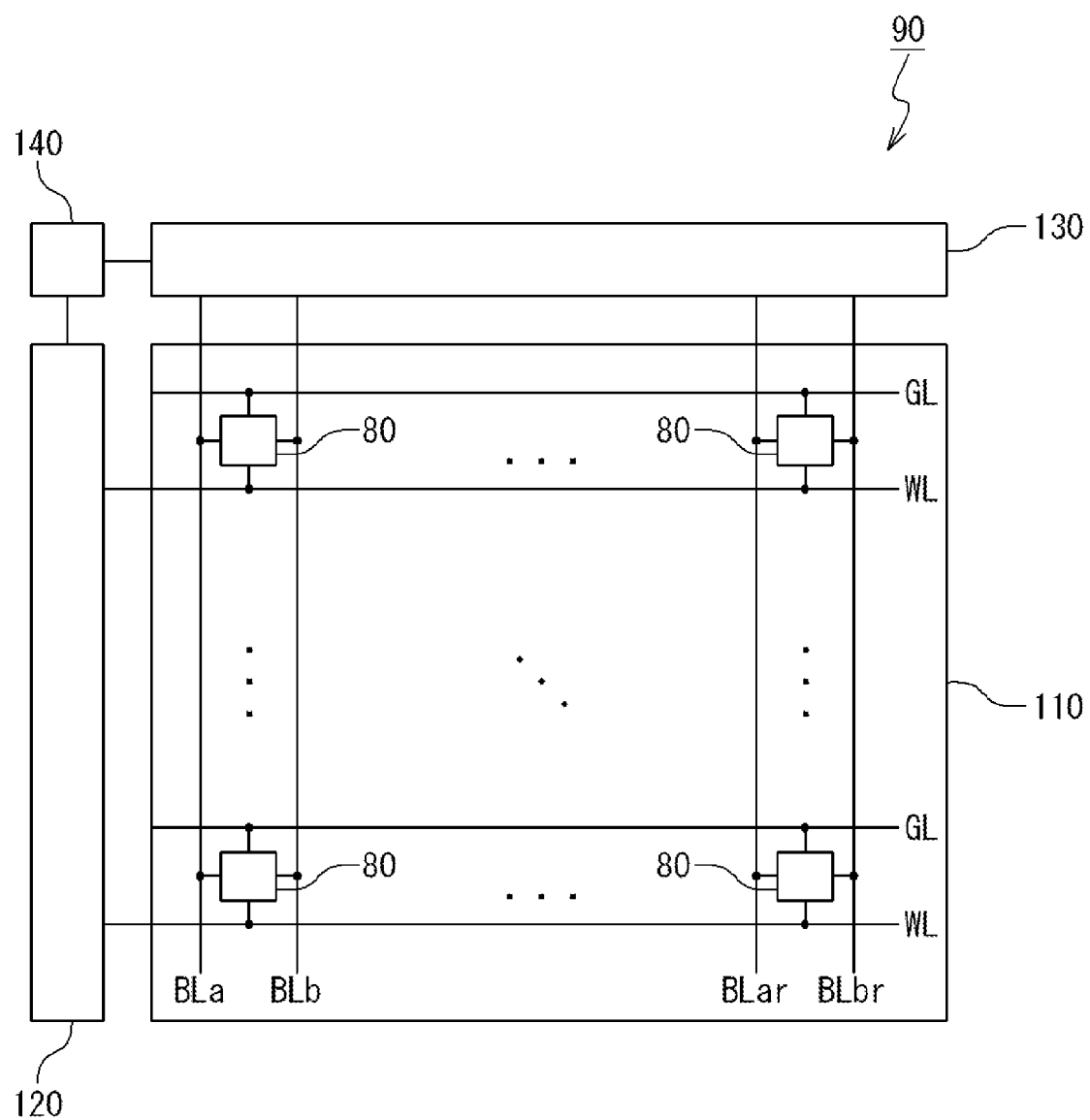
FIG. 6 is a block diagram showing an example of a configuration of a magnetic memory according to the exemplary embodiment of the present invention.

FIG. 6 is a block diagram showing an example of a configuration of a magnetic memory according to the exemplary embodiment of the present invention. The magnetic memory 90 includes a memory cell array 110, an X driver 120, a Y driver 130 and a controller 140. The memory cell array 110 includes a plurality of the magnetic memory cells 80 arranged in an array. Each magnetic memory cell 80 includes the above-described magnetic memory element 70. As shown in FIG. 5 in advance, each magnetic memory cell 80 is connected to the word line WL, the ground line GL and the pair of the bit lines BLa and BLb. The X driver 120 is connected to a plurality of the word lines WL, and drives a selected word line which is connected to an access target of the magnetic memory cell 80 in the plurality of the word lines WL. The Y driver 130 is connected to a plurality of the pairs of the bit lines BLa and BLb, and sets each bit line to a state corresponding to the data writing and the data reading. The controller 140 controls the X driver 120 and the Y driver 130 based on the data writing and the data reading. The X driver 120, the Y driver 130 and a controller 140 are deemed to be a control circuit controlling the data writing and the data reading. An MRAM is exemplified as the magnetic memory 90.

(Material)

Next, material which can be used for the first magnetization free layer 10, the non-magnetic layer 30, the reference layer 40, the magnetization fixed layer group 60 and the blocking layer 65 will be described.

The first magnetization free layer 10 is preferably composed of ferromagnetic material having perpendicular magnetic anisotropy as described above. Specifically, alloy material such as Fe—Pt alloy, Fe—Pd alloy, Co—Pt alloy, Co—Pd alloy, Tb—Fe—Co alloy, Gd—Fe—Co alloy, Tb—Fe alloy, Tb—Co alloy, Gd—Fe alloy, Gd—Co alloy, Co—Cr—Pt alloy, Co—Re—Pt alloy, Co—Ru—Pt alloy and Co—W alloy, and an alternately laminated film such as a Co/Pt lamination film, a Co/Pd lamination film, a Co/Ni lamination film, a Co/Cu lamination film, a Co/Ag lamination film, a Co/Au lamination film, a Fe/Pt lamination film, a Fe/Pd lamination film, a Fe/Au lamination film are exemplified. Particularly, among them, the inventors experimentally verify that the highly-controllable current induced domain wall motion can be achieved by using the Co/Ni lamination film (Non Patent Literature 4: T. Koyama et al., "Control of Domain Wall Position by Electrical Current in Structured Co/Ni Wire with Perpendicular Magnetic Anisotropy", Applied Physics Express, vol. 1, p. 101303 (2008)). Therefore, in light of this point, the Co/Ni lamination film is exemplified as the preferable material for the first magnetization free layer 10.

The non-magnetic layer 30 is preferably composed of insulating material. Specifically, Mg—O, Al—O, Al—N and Ti—O are exemplified.

The reference layer 40 is composed of, for example, ferromagnetic material with perpendicular magnetic anisotropy. In this case, the material which can be used for the reference layer 40 is omitted because it overlaps with the material which can be used for the first magnetization free layer 10 and is exemplified above. Here, since it is required that the magnetization of the reference layer 40 is strongly fixed, the material is magnetic material preferably as hard as possible. In light of this point, Fe—Pt alloy, Fe—Pd alloy, Co—Pt alloy, a Co/Pt lamination film, a Co/Pd lamination film and the like are preferable. In addition, it is required that the magnetization direction is fixed in one direction, and further, the leakage magnetic field to the outside is preferably small. Therefore, as described above, the lamination layer structure with synthetic ferrimagnetic coupling is preferable. That is, the reference layer 40 preferably has, for example, the lamination layer structure such as ferromagnetic material/Ru/ferromagnetic material. In addition, the reference layer 40 may be composed of ferromagnetic material with in-plane magnetic anisotropy. In this case, various kinds of magnetic material can be used. Typically, Co—Fe material and the like is exemplified. Incidentally, an exemplary embodiment in which the reference layer 40 is composed of material with in-plane magnetic anisotropy will be described later as a sixth modification example.

The magnetization fixed layer group 60 contains ferromagnetic material or anti-ferromagnetic material. Among them, in the example of the case that the magnetization fixed layer group 60 is composed of the first magnetization fixed layer group 60a and the second magnetization fixed layer group 60b as shown in FIG. 1 and each of the first magnetization fixed layer group 60a and the second magnetization fixed layer group 60b is formed of single ferromagnetic material, the material may be composed of ferromagnetic material having perpendicular magnetic anisotropy. The specifically usable material is omitted because it overlaps with the material exemplified as the first magnetization free layer 10. In addition, as the usable material in the case that the magnetization fixed layer group 60 is composed of anti-ferromagnetic material, Pt—Mn, Ir—Mn, Fe—Mn and Ni—O and the like are exemplified.

For the blocking layer 65, various kinds of material can be used. It is enough for the blocking layer 65 to be designed so as to weaken the strong exchange coupling between the magnetization free layer 10 and the magnetization fixed layer group 60 or within the magnetization fixed layer group 60, and the material to be used is not limited. The inventors can obtain desirable properties when Pt is used for the material of the blocking layer 65. Ferromagnetic material can also be used for the blocking layer 65. Specifically, NiFeB, CoZrB and the like are exemplified. Since the material also has a function as a base layer of the magnetization free layer 10, they are effective especially for a structure shown in FIG. 14 (described later).

(Initializing Method)

Next, an initializing method of a memory state of the magnetic memory element 70 according to the exemplary embodiment of the present invention will be described with reference to the drawings. In the exemplary embodiment of the present invention, the first magnetization free layer 10 includes the first magnetization fixed region 11a, the second magnetization fixed region 11b and the magnetization fixed region 12, and the magnetization of the first magnetization fixed region 11a and the magnetization of the second magnetization fixed region 11b are fixed in their directions anti-parallel to each other. Therefore, in manufacturing processes of the magnetic memory element 70 according to the exemplary embodiment, a process is required that the magnetization of the first magnetization fixed region 11a and the magnetization of the second magnetization fixed region 11b are made to turn in the directions anti-parallel to each other. Hereinafter, this process is referred to as the initialization.

Figure 7A:
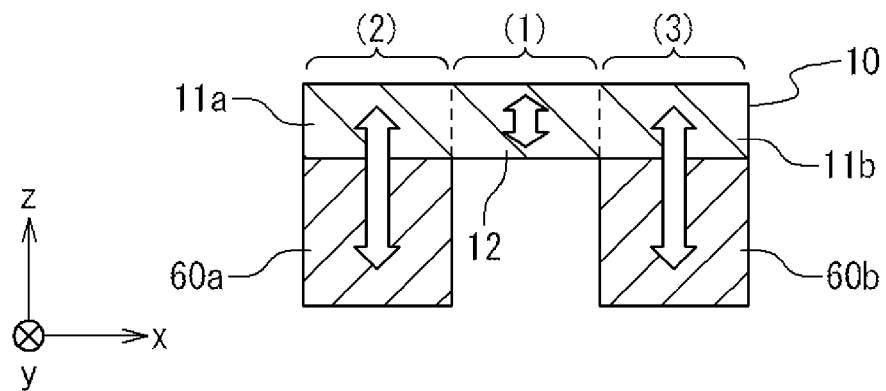
FIG. 7A schematically shows a part of the simplest structure of the magnetic memory element.

FIGS. 7A to 7F schematically show the initializing method of the magnetization state in the simplest structure of the magnetic memory element on which the information writing is performed by using the domain wall motion. FIG. 7A is a sectional view schematically showing "the simplest structure". Here, in FIGS. 7A to 7E, for an easy way of understanding, only the first magnetization free layer 10 and the magnetization fixed layer group 60 are shown and the others are omitted.

In the example shown in FIG. 7A to 7F, the first magnetization free layer 10 is composed of the first magnetization fixed region 11a, the second magnetization fixed region 11b and the magnetization free region 12, the first magnetization fixed region 11a is ferromagnetically coupled with the first magnetization fixed layer group 60a, and the second magnetization fixed region 11b is ferromagnetically coupled with the second magnetization fixed layer group 60b. Here, it is assumed that each of reverse magnetic fields of the first magnetization fixed layer group 60a and the second magnetization fixed layer group 60b is large enough as compared with that of the first magnetization free layer 10. In addition, it is assumed that the reverse magnetic field of the first magnetization fixed layer group 60a is small as compared with that of the second magnetization layer group 60b.

The initializing method of the simplest memory state for the structure shown in FIG. 7A will be described with reference to FIGS. 7B to 7F. FIGS. 7B to 7E schematically show the magnetization structure in the respective steps. FIG. 7F schematically shows a synthetic magnetization curve of a system composed of the first magnetization free layer 10 and the magnetization fixed layer group 60.

Figure 7B:
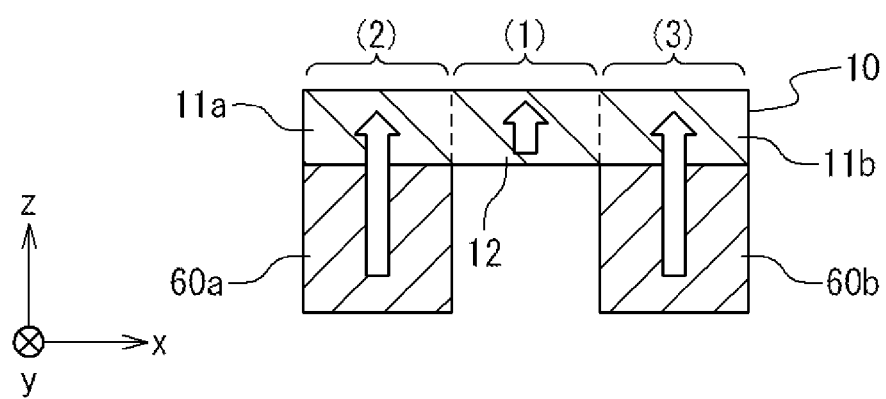
FIG. 7B schematically shows an initializing method of a magnetization state in the simplest structure of the magnetic memory element.
Figure 7C:
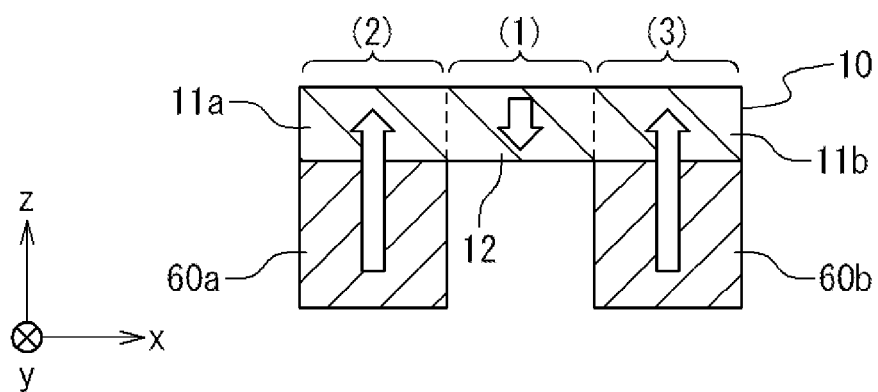
FIG. 7C schematically shows the initializing method of the magnetization state in the simplest structure of the magnetic memory element.
Figure 7D:
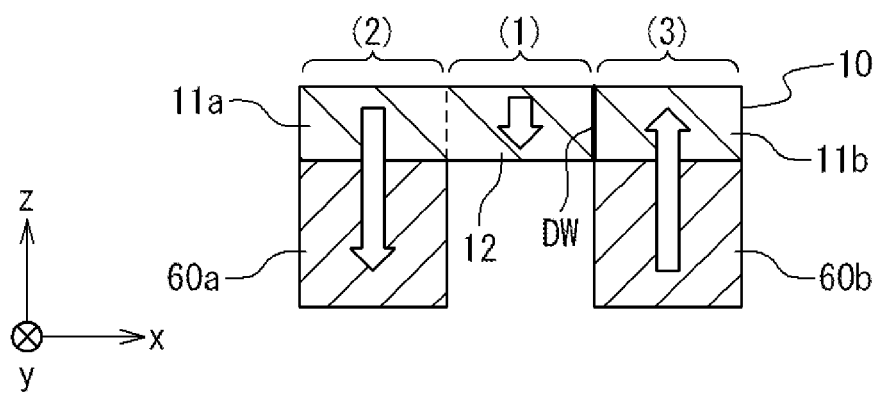
FIG. 7D schematically shows the initializing method of the magnetization state in the simplest structure of the magnetic memory element.
Figure 7E:
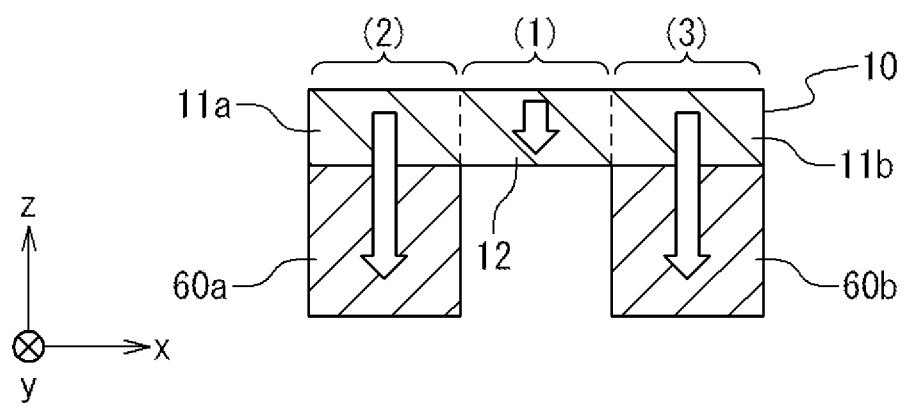
FIG. 7E schematically shows the initializing method of the magnetization state in the simplest structure of the magnetic memory element.
Figure 7F:
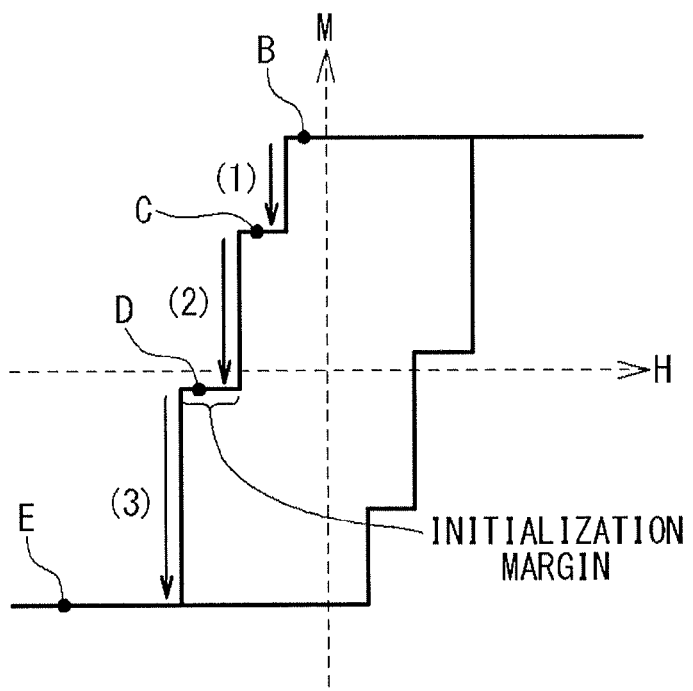
FIG. 7F schematically shows a synthetic magnetization curve of a system composed of a first magnetization free layer and a magnetization fixed layer group in the simplest structure of the magnetic memory element.

In the initializing processes shown in FIGS. 7B to 7F, first, a sufficiently large magnetic field is applied in one direction. Here, it is assumed that the direction of the magnetic field is the +z direction. In this case, the magnetization of all parts turns in the +z direction. This situation is shown in FIG. 7B.

Next, a magnetic field is being applied in the direction opposite to the first applied direction. In this case, the direction is the -z direction. As shown in FIG. 7C, the magnetization of the magnetization free region 12, of which the reverse magnetic field is the smallest, firstly turns in the -z direction. Here, domain walls are formed at both of the boundary between the first magnetization fixed region 11a and the magnetization free region 12 and the boundary between the second magnetization fixed region 11b and the magnetization free region 12.

Then, the magnetic field in the -z direction is being enlarged. Here, the domain wall motion arises in a part composed of the first magnetization fixed region 11a and the first magnetization fixed layer group 60a, of which the reverse magnetic field is smaller next to the magnetization free region 12, the magnetization of this part also turns in the -z direction. This situation is shown in FIG. 7D. The state after the initialization is realized, in which a single domain wall is introduced into the magnetization free layer 10. Incidentally, if the magnetic field in the -z direction is being enlarged further, the domain wall motion arises in a part composed of the second magnetization fixed region 11b and the second magnetization fixed layer group 60b, and the magnetization of this part also turns in the -z direction. This situation is shown in FIG. 7E. In this case, the domain wall does not exist.

FIG. 7F schematically shows the transition of the magnetization structure from FIG. 7B to FIG. 7E. Here, in FIG. 7F, the horizontal axis indicates the magnetic field (H) in the z direction applied from the outside, and the vertical axis indicates the synthetic magnetization (M) of the system composed of the first magnetization free layer 10 and the magnetization fixed layer group 60. In addition, the part of (1) in FIG. 7F indicates that the magnetization reversing arises in the magnetization free layer 12 as shown in FIG. 7C. The part of (2) indicates that the magnetization reversing further arises in the first magnetization fixed region 11a and the first magnetization fixed layer group 60a as shown in FIG. 7D. The part of (3) indicates that the magnetization reversing further arises in the second magnetization fixed region 11b and the second magnetization fixed layer group 60b as shown in FIG. 7E. The initialization margin in this system is the range from the magnetic field in which the domain wall motion arises at the part composed of the first magnetization fixed region 11a and the first magnetization fixed layer group 60a to the magnetic field in which the domain wall motion arises at the part composed of the second magnetization fixed region 11b and the second magnetization fixed layer group 60b. The range is indicated as the D (between (2) and (3)) in FIG. 7F.

Here, in the case of the initializing method shown in FIGS. 7B to 7F, there is a problem described below. In the case of the initializing method, as described above, the initialization margin is the range from the magnetic field in which the domain wall motion arises at the part composed of the first magnetization fixed region 11a and the first magnetization fixed layer group 60a to the magnetic field in which the domain wall motion arises at the part composed of the second magnetization fixed region 11b and the second magnetization fixed layer group 60b. In order to improve the success rate of the initialization, the initialization margin is preferably as high as possible. However, in the method shown in FIGS. 7B to 7F, generally, it is difficult to provide a large difference between magnetic fields, wherein one of the magnetic fields is that the domain wall motion arises at the part composed of the first magnetization fixed region 11a and the first magnetization fixed layer group 60a, and the other of the magnetic fields is that the domain wall motion arises at the part composed of the second magnetization fixed region 11b and the second magnetization fixed layer group 60b. As a result, it is difficult to realize the large initialization margin.

Figure 8A:
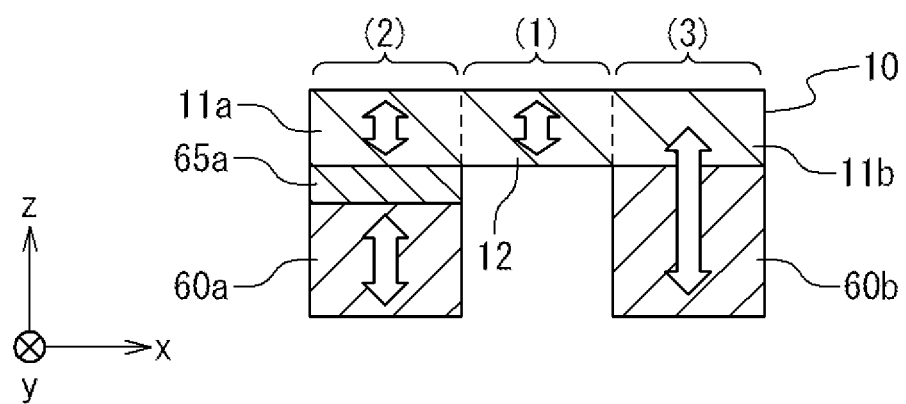
FIG. 8A schematically shows a part of a structure of the magnetic memory element according to the exemplary embodiment of the present invention.

In the exemplary embodiment of the present invention, this problem can be solved by providing the blocking layer 65 in at least one of the magnetization fixed layer groups. The mechanism will be described with reference to FIGS. 8A to 8J. FIGS. 8A to 8J schematically show the initializing method of the magnetization state in the magnetic memory element according to the exemplary embodiment of the present invention. FIG. 8A schematically shows a part of the structure of the magnetic memory element 70 according to the exemplary embodiment of the present invention. Here, in FIGS. 8A to 8H, for an easy way of understanding, only the first magnetization free layer 10, the magnetization fixed layer group 60 and the blocking layer 65 are shown and the others are omitted. In the exemplary embodiment of the present invention, the second magnetization fixed layer group 60b is ferromagnetically coupled strongly with the second magnetization fixed region 11b. On the other hand, the first magnetization fixed layer group 60a is ferromagnetically coupled with the first magnetization fixed region 11a, however, the coupling is weakened because the blocking layer 65 is inserted therebetween.

The initializing method of the memory state for the system as described above will be described with reference to FIGS. 8B to 8J. FIGS. 8B to 8H schematically show the magnetization structure in the respective steps. FIGS. 8I and 8J schematically show synthetic magnetization curves of a system composed of the first magnetization free layer 10 and the magnetization fixed layer group 60.

Figure 8B:
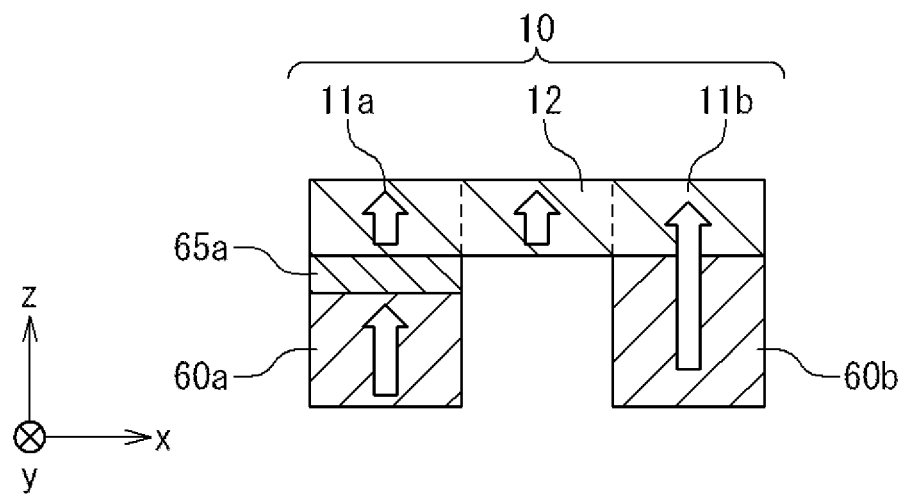
FIG. 8B schematically shows an initializing method of a magnetization state in the magnetic memory element according to the exemplary embodiment of the present invention.
Figure 8C:
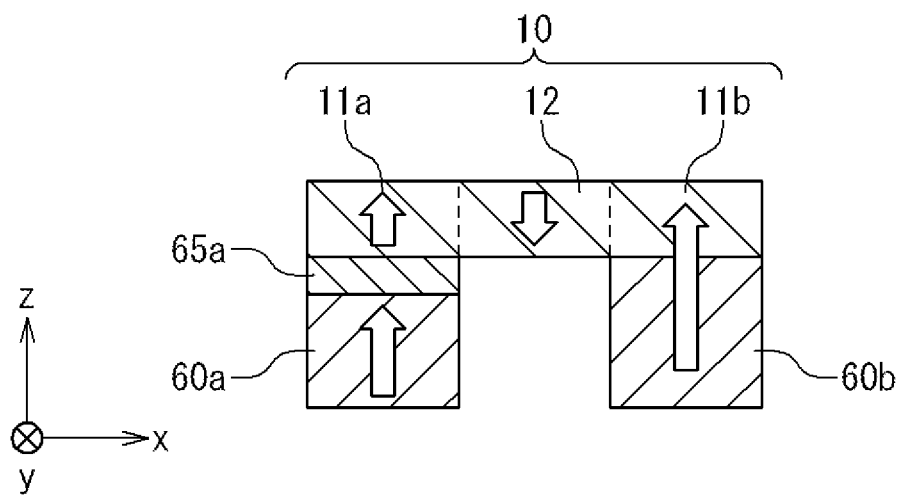
FIG. 8C schematically shows the initializing method of the magnetization state in the magnetic memory element according to the exemplary embodiment of the present invention.
Figure 8D:
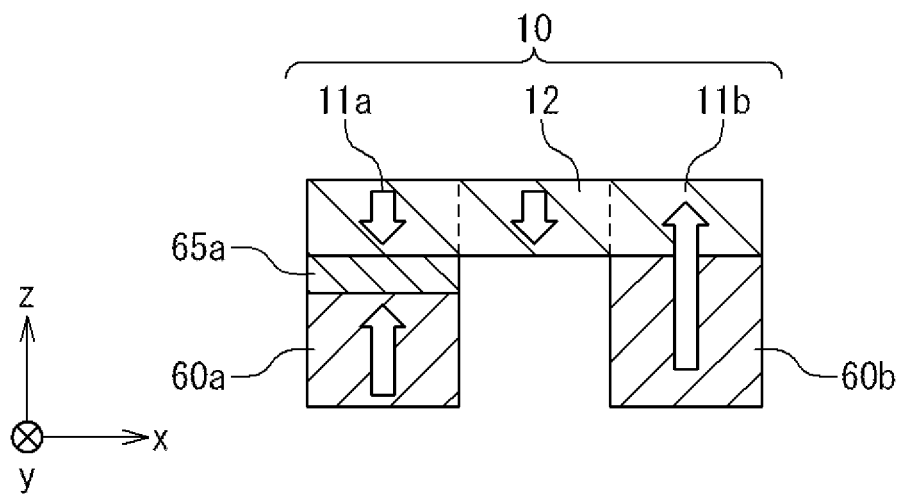
FIG. 8D schematically shows the initializing method of the magnetization state in the magnetic memory element according to the exemplary embodiment of the present invention.
Figure 8E:
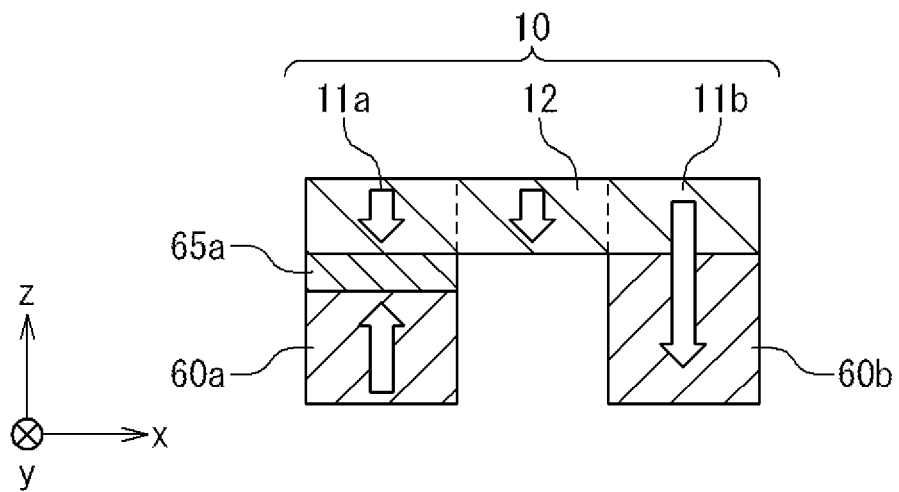
FIG. 8E schematically shows the initializing method of the magnetization state in the magnetic memory element according to the exemplary embodiment of the present invention.
Figure 8F:
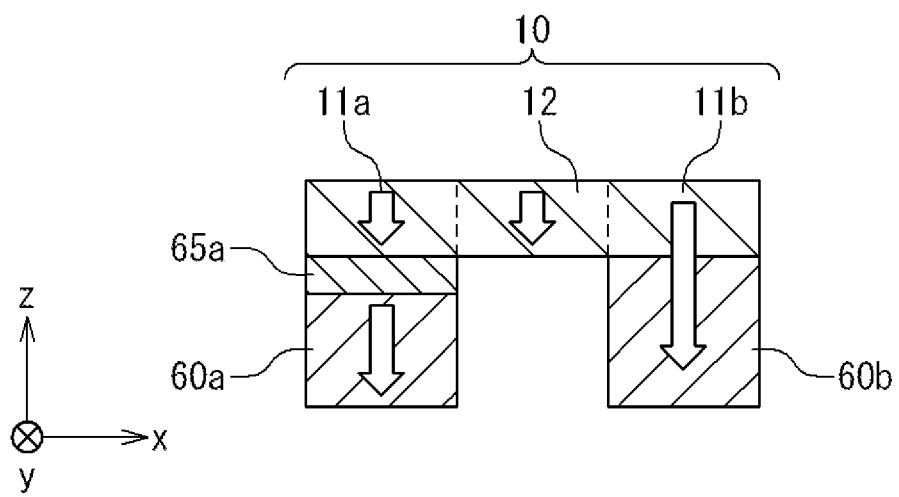
FIG. 8F schematically shows the initializing method of the magnetization state in the magnetic memory element according to the exemplary embodiment of the present invention.
Figure 8G:
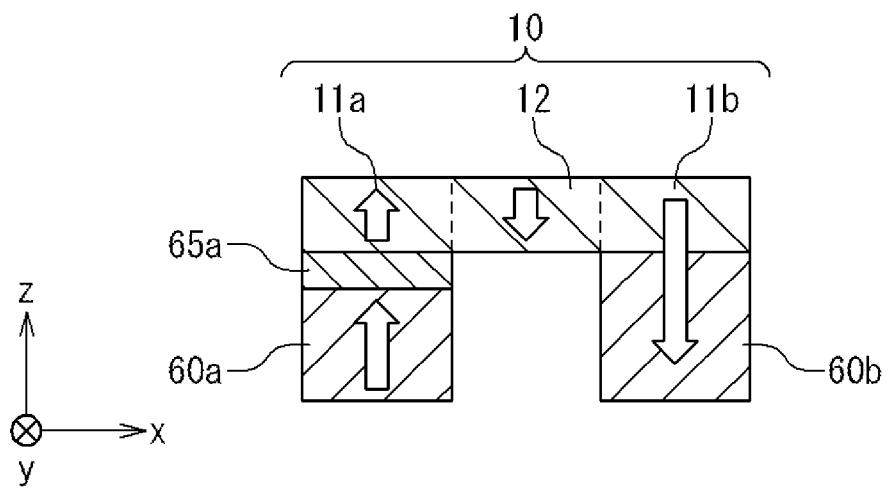
FIG. 8G schematically shows the initializing method of the magnetization state in the magnetic memory element according to the exemplary embodiment of the present invention.
Figure 8H:
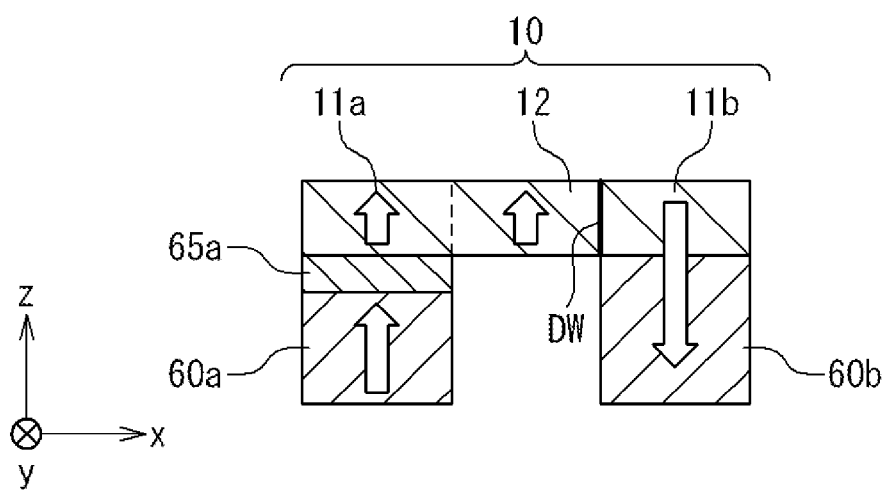
FIG. 8H schematically shows the initializing method of the magnetization state in the magnetic memory element according to the exemplary embodiment of the present invention.
Figure 8I:
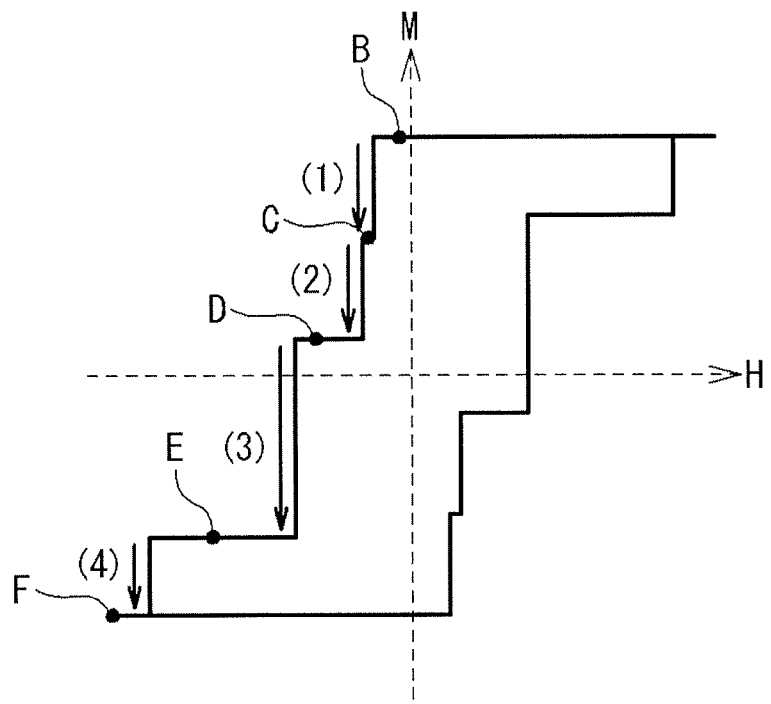
FIG. 8I schematically shows a synthetic magnetization curve of a system composed of a first magnetization free layer and a magnetization fixed layer group in the magnetic memory element according to the exemplary embodiment of the present invention.
Figure 8J:
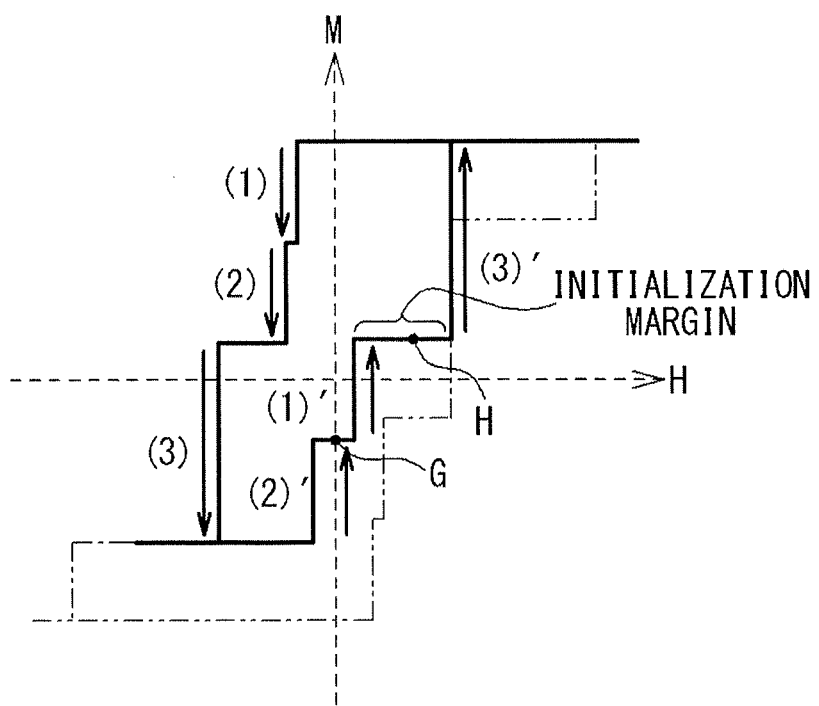
FIG. 8J schematically shows a synthetic magnetization curve of the system composed of the first magnetization free layer and the magnetization fixed layer group in the magnetic memory element according to the exemplary embodiment of the present invention.

In the initializing processes shown in FIGS. 8B to 8J, first, a sufficiently large magnetic field is applied in one direction. Here, it is assumed that the direction of the magnetic field is the +z direction. That is, the direction is nearly perpendicular to an upper side plane (or a lower side plane) of the first magnetization free layer 10 and an upward direction. Here, the nearly perpendicular means that it substantially perpendicular including measurement errors, setting errors or the like and there is no problem even if some misalignment from the perpendicular occurs due to measurement errors, restrictions of device setting or the like. In this case, the magnetization of all parts turns in the +z direction. This situation is shown in FIG. 8B. Next, a magnetic field is being applied in the direction opposite to the first applied direction. In this case, the direction is the −z direction. As shown in FIG. 8C, the magnetization of the magnetization free region 12, of which the reverse magnetic field is the smallest, firstly turns in the −z direction. Here, domain walls are formed at both of the boundary between the first magnetization fixed region 11a and the magnetization free region 12 and the boundary between the second magnetization fixed region 11b and the magnetization free region 12.

Then, the magnetic field in the −z direction is being enlarged. Here, the domain wall motion arises only in the first magnetization fixed region 11a, of which the reverse magnetic field is smaller next to the magnetization free region 12, and the magnetization of this part also turns in the −z direction. This situation is shown in FIG. 8D. As shown in FIG. 8D, the domain wall is formed only at the boundary between the magnetization free region 12 and the second magnetization fixed region 11b. Here, in the first magnetization fixed layer group 60a, since the magnetic coupling with the first magnetization fixed region 11a is weak, the magnetization reversing does not arise. Next, the magnetic field in the −z direction is being enlarged further. Here, the magnetization of the part composed of the second magnetization fixed region 11b and the second magnetization fixed layer group 60b, of which the magnetization reversing arises easier next to the first magnetization fixed region 11a, also turns in the −z direction. This situation is shown in FIG. 8E. Incidentally, if the magnetic field in the −z direction is being enlarged further, the magnetization of the first magnetization fixed layer group 60a is also reversed, and all of the magnetization turns in the −z direction. This situation is shown in FIG. 8F. In this case, the domain wall does not exist.

FIG. 8I schematically shows the transition of the magnetization structure from FIG. 8B to FIG. 8F described above as a magnetization curve. Here, in FIG. 8I, the horizontal axis indicates the magnetic field (H) in the z direction applied from the outside, and the vertical axis indicates the synthetic magnetization (M) of the system composed of the first magnetization free layer 10 and the magnetization fixed layer group 60. In addition, the part of (1) in FIG. 8I indicates that the magnetization reversing arises in the magnetization free layer 12 as shown in FIG. 8C. The part of (2) indicates that the magnetization reversing further arises in the first magnetization fixed region 11a as shown in FIG. 8D. The part of (3) indicates that the magnetization reversing further arises in the second magnetization fixed region 11b and the second magnetization fixed layer group 60b as shown in FIG. 8E. The part of (4) indicates that the magnetization reversing further arises in the first magnetization fixed layer group 60a as shown in FIG. 8F. The respective states shown in FIGS. 8B to 8F correspond to the portions of the B to F shown in the magnetization curve of FIG. 8I, respectively. Here, FIG. 8I indicates the full loop of the magnetization curve of the magnetic memory element 70.

Here, the initializing method of the magnetic memory element 70 according to the exemplary embodiment of the present invention is characterized in that a minor loop of the magnetization curve is used. Specific steps will be described below. After the state shown in FIG. 8E is provided, the applying of the magnetic field in the −z direction is finished, and then, the applying of the magnetic field in the +z direction is started. At this time, since the first magnetization fixed region 11a is ferromagnetically coupled weakly with the first magnetization fixed layer group 60a, firstly the magnetization of this region is reversed in the +z direction. This situation is shown in FIG. 8G. In this case, the domain wall is formed at the boundary between the first magnetization fixed region 11a and the magnetization free region 12. Next, when the magnetic field in the +z direction is being enlarged, the domain wall motion arises in the magnetization free region 12, the magnetization of the magnetization free region 12 is also reversed in the +z direction. This situation is shown in FIG. 8H. According this, the domain wall is formed at the boundary between the magnetization free region 12 and the second magnetization fixed region 11b. In the example shown in FIGS. 8B to 8E and FIGS. 8G to 8H, the initialization of the memory state of the magnetic memory element 70 is performed by the above described steps. Incidentally, if the magnetic field in the +z direction is being enlarged further, all of the regions are magnetized in the +z direction as shown in FIG. 8B again. Therefore, the initialization margin in this method is the range from the magnetic field in which the magnetization of the first magnetization fixed region 11a and the magnetization free region 12 is reversed to the magnetic field in which the magnetization of the second magnetization fixed region 11b and the second magnetization fixed layer group 60b is reversed.

FIG. 8J schematically shows the transition of the magnetization structure as the magnetization curve in the initializing method using the minor loop described above. Here, in FIG. 8J, the horizontal axis indicates the magnetic field (H) in the z direction applied from the outside, and the vertical axis indicates the synthetic magnetization (M) of the system composed of the first magnetization free layer 10 and the magnetization fixed layer group 60. In addition, the parts of (1) to (3) in FIG. 8J are the same as those in FIG. 8I. The part of (2)' indicates that the magnetization reversing arises in the first magnetization fixed region 11a as shown in FIG. 8G. The part of (1)' indicates that the magnetization reversing further arises in the magnetization free region 12 as shown in FIG. 8H. The respective states shown in FIGS. 8G to 8H correspond to the parts indicated as the G and H in the magnetization curve of FIG. 8J.

Incidentally, in the initializing method according to the present invention, in the system having the blocking layer 65, an essence is that an initializing method is performed using a minor loop. The respective steps described above are merely one example, and other method can be applied. The other example will be described later.

Effect

Next, effects acquired from the exemplary embodiment of the present invention will be described.

The first effect is that the perpendicular magnetization domain wall motion MRAM having the large initialization margin can be manufactured. As described above, in the perpendicular magnetization domain wall motion MRAM, the first magnetization free layer 10 where the domain wall moves is composed of the first magnetization fixed region 11a, the second magnetization fixed region 11b and the magnetization free layer 12, and it is necessary for the layer to perform the process, namely initialization, in which the magnetization of the first magnetization fixed region 11a and the magnetization of the second magnetization fixed region 11b are turned in the directions anti-parallel to each other. Generally, it is considered that the initialization is performed using the external magnetic field. In this case, the initialization margin that is the range allowable for the magnitude of the external magnetic field is preferably sufficiently large. By applying the present exemplary embodiment, the large initialization margin can be obtained.

The second effect is that the perpendicular magnetization domain wall motion MRAM can be easily manufactured. In the perpendicular magnetization domain wall motion MRAM, the magnetization of the first magnetization fixed region 11a and the magnetization of the second magnetization fixed region 11b in the first magnetization free layer 10 are turned in the directions anti-parallel to each other. Therefore, it is considered that the first magnetization fixed region 11a and the second magnetization fixed region 11b are arranged adjacent to the first magnetization fixed layer group 60a and the second magnetization fixed layer group 60b, respectively. In this structure, to perform the initialization, the method is considered in which the magnetic properties of the first magnetization fixed layer group 60a are made different from that of the second magnetization fixed layer group 60b. However, generally, it is difficult to make the magnetic properties of the first magnetization fixed layer group 60a sufficiently different from that of the second magnetization fixed layer group 60b to obtain the sufficient initialization margin. In the present exemplary embodiment, by not making the magnetic properties of the first magnetization fixed layer group 60a different from that of the second magnetization fixed layer group 60b but using the blocking layer 65, the magnitude of the magnetic coupling can be controlled. Such structure can be relatively easily manufactured. That is, the perpendicular magnetization domain wall motion MRAM with large initialization margin can be easily manufactured.

EXAMPLE

Figure 9:
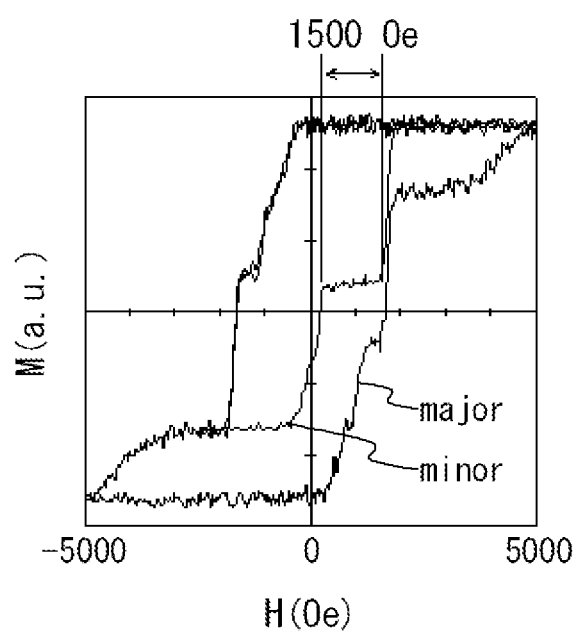
FIG. 9 shows a magnetization curve of an element to which the exemplary embodiment of the present invention is applied.

FIG. 9 shows a magnetization curve of an element to which the exemplary embodiment of the present invention is applied. Here, FIG. 9 indicates an average magnetization curve of approximately one hundred million elements. The horizontal axis indicates the magnetic field and the vertical axis indicates the magnetization. A Co/Ni lamination film is used for the first magnetization free layer 10, a Co/Pt lamination film is used for the first magnetization fixed layer group 60a and the second magnetization fixed layer group 60b, and a Pt film is used for the blocking layer 65. In FIG. 9, the major loop and the minor loop are shown. The major loop and the minor loop shown in FIG. 9 are approximately the same as those shown in FIGS. 8I and 8J. In this case, the initialization margin is approximately 1500 Oe. This value is a sufficiently large value for manufacturing a mega-bit class MRAM.

Modification Example

The magnetic memory element 70 described above may be provided using modification examples described below.

First Modification Example

Figure 10A:
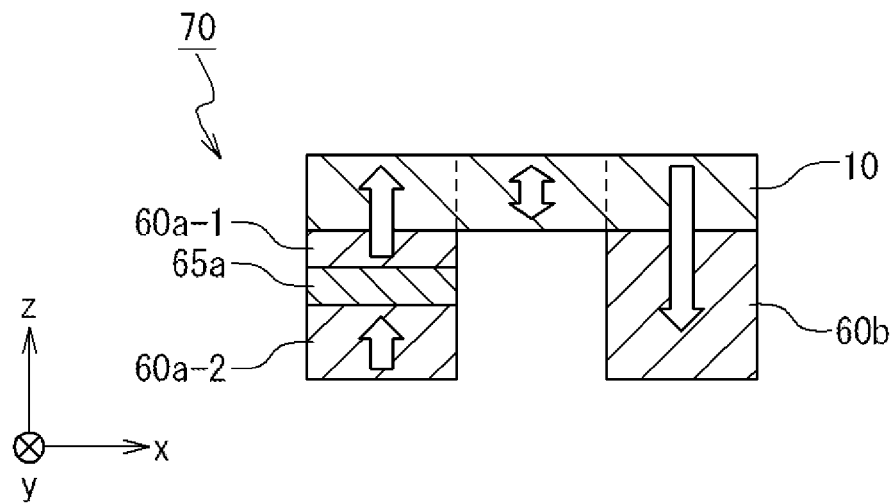
FIG. 10A schematically shows a structure of a first modification example of the magnetic memory element according to the exemplary embodiment of the present invention.
Figure 10B:
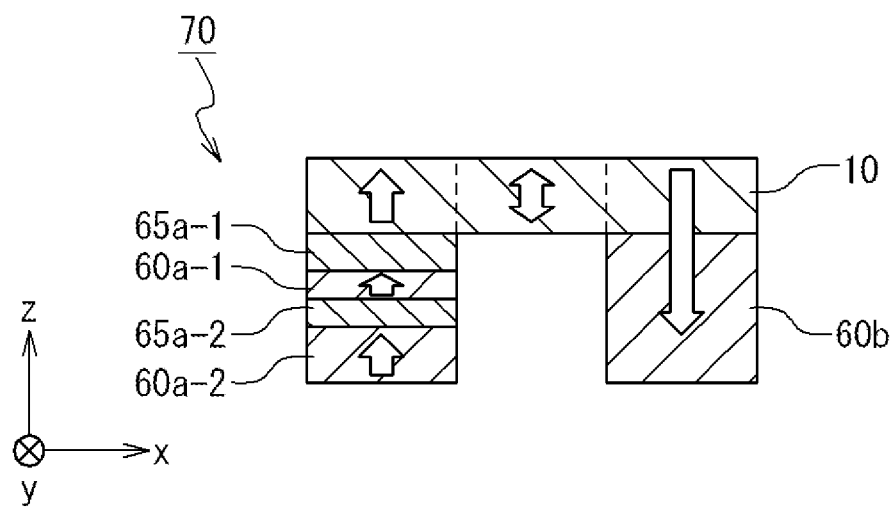
FIG. 10B schematically shows a structure of a first modification example of the magnetic memory element according to the exemplary embodiment of the present invention.

FIGS. 10A and 10B schematically show structures of a first modification example of the magnetic memory element according to the exemplary embodiment of the present invention. The first modification example relates to a position of the blocking layer 65.

In the exemplary embodiment shown in FIG. 1, the first blocking layer 65a as the blocking layer 65 is provided being sandwiched between the first magnetization fixed layer group 60a and the first magnetization fixed region 11a in the first magnetization free layer 10. However, in the present exemplary embodiment, the position of the blocking layer 65 is arbitrary. FIGS. 10A and 10B show the modification examples. Here, in FIG. 10, for an easy way of understanding, only the first magnetization free layer 10, the magnetization fixed layer group 60 and the blocking layer 65 are indicated and the other portions are omitted.

FIG. 10A shows an example of the first modification example. The first magnetization fixed layer group 60 includes a 1st-1st magnetization fixed layer group 60a-1 and a 1st-2nd magnetization fixed layer group 60a-2. The first blocking layer 65a is provided being sandwiched between the 1st-1st magnetization fixed layer group 60a-1 and the 1st-2nd magnetization fixed layer group 60a-2. In this case, since the first blocking layer 65a is provided between the 1st-1st magnetization fixed layer group 60a-1 and the 1st-2nd magnetization fixed layer group 60a-2, the 1st-1st magnetization fixed layer group 60a-1 and the 1st-2nd magnetization fixed layer group 60a-2 are magnetically coupled weakly. Therefore, the memory state of the magnetic memory element 70 can be initialized by the initializing method described using FIGS. 8A to 8J.

FIG. 10B shows another example of the first modification example. The first magnetization fixed layer group 60 includes a 1st-1st magnetization fixed layer group 60a-1 and a 1st-2nd magnetization fixed layer group 60a-2. The first blocking layer 65a includes a 1st-1st blocking layer 65a-1 and a 1st-2nd blocking layer 65a-2. The 1st-2nd blocking layer 65a-2 is provided being sandwiched between the 1st-1st magnetization fixed layer group 60a-1 and the 1st-2nd magnetization fixed layer group 60a-2. The 1st-1nd blocking layer 65a-1 is provided being sandwiched between the 1st-1st magnetization fixed layer group 60a-1 and the first magnetization fixed region 11a in the first magnetization free layer 10. In this case, also, the 1st-1st magnetization fixed layer group 60a-1 and the 1st-2nd magnetization fixed layer group 60a-2, and, the 1 st-1st magnetization fixed layer group 60a-1 and the first magnetization fixed region 11a are magnetically coupled weakly, respectively. Therefore, the memory state of the magnetic memory element 70 can be initialized by the initializing method described using FIGS. 8A to 8J.

As described above, in the present exemplary embodiment, it is enough that the blocking layer 65 is provided being sandwiched between the magnetization fixed layer group 60 and the first magnetization free layer 10, or, in the magnetization fixed layer group 60. The position of the blocking layer 65 and the number of the blocking layers 65 are arbitrary.

Second Modification Example

Figure 11A:
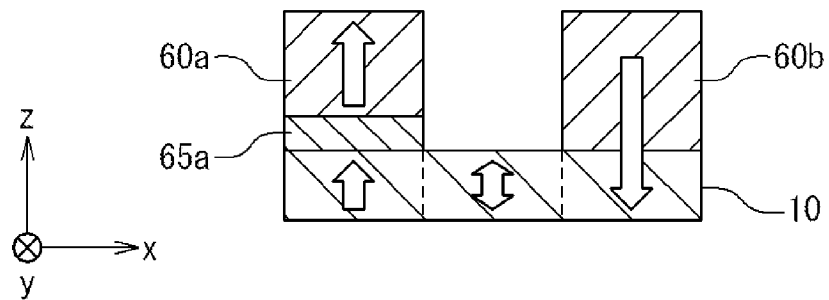
FIG. 11A schematically shows a structure of a second modification example of the magnetic memory element according to the exemplary embodiment of the present invention.
Figure 11B:
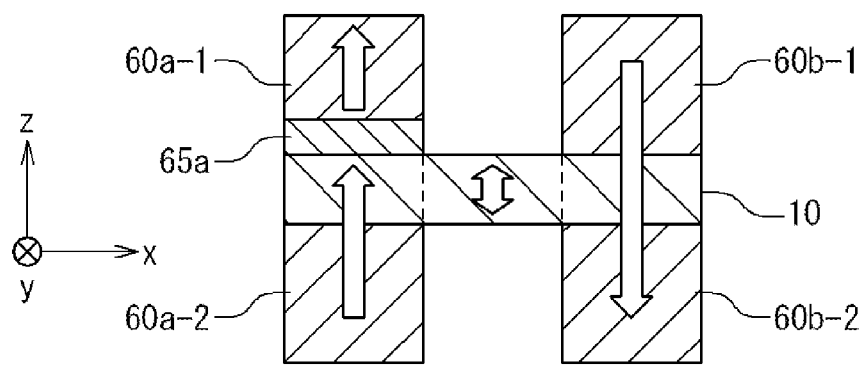
FIG. 11B schematically shows a structure of a second modification example of the magnetic memory element according to the exemplary embodiment of the present invention.
Figure 11C:
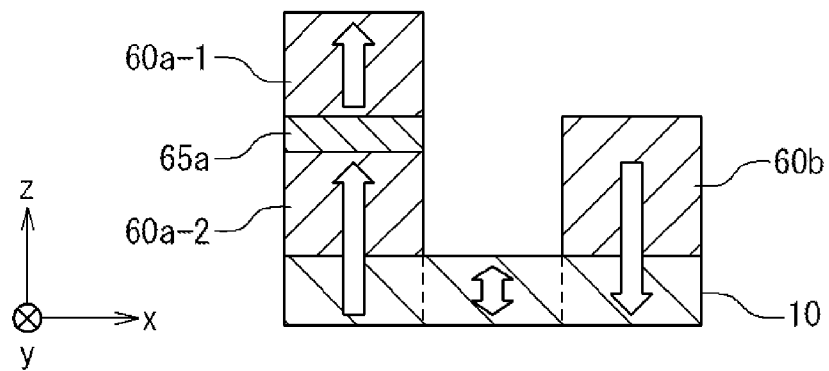
FIG. 11C schematically shows a structure of a second modification example of the magnetic memory element according to the exemplary embodiment of the present invention.

FIGS. 11A to 11C schematically show structures of a second modification example of the magnetic memory element according to the exemplary embodiment of the present invention. The second modification example relates to a position of the magnetization fixed layer group 60.

In the exemplary embodiment shown in FIG. 1, the magnetization fixed layer group 60 is provided at the position in the negative direction of the z axis to the first magnetization free layer 10, namely in the substrate side. However, in the present exemplary embodiment, the position of the magnetization fixed layer group 60 is arbitrary. FIGS. 11A, 11B and 11C show the modification examples. Here, in FIGS. 11A to 11C, for an easy way of understanding, only the first magnetization free layer 10, the magnetization fixed layer group 60 and the blocking layer 65 are indicated and the other portions are omitted.

FIG. 11A indicates an example of the second modification example. The magnetization fixed layer group 60 is provided at the position in the positive direction of the z axis to the first magnetization free layer 10, namely in the side opposite to the substrate. In the example shown in FIG. 11A, the blocking layer 65 is provided being sandwiched between the first magnetization fixed region 11a in the first magnetization free layer 10 and the first magnetization fixed layer group 60a. On the other hand, the second magnetization fixed layer group 60b is provided adjacent to the second magnetization fixed region 11b in the first magnetization free layer 10. In the example shown in FIG. 11A, also, the memory state of the magnetic memory element 70 can be initialized by the initializing method described using FIGS. 8A to 8J.

FIG. 11B indicates another example of the second modification example. The magnetization fixed layer group 60 is provided at positions of lower and upper surfaces of the first magnetization free layer 10. In the example shown in FIG. 11B, the blocking layer 65 is provided being sandwiched between the 1st-1st magnetization fixed layer group 60a-1 and the first magnetization fixed region 11a in the first magnetization free layer 10. The 1st-2nd magnetization fixed layer group 60a-2, the 2nd-1st magnetization fixed layer group 60b-1 and the 2nd-2nd magnetization fixed layer group 60b-2 are provided adjacent to the first magnetization fixed region 11a, the second magnetization fixed region 11b and the second magnetization fixed region 11b in the first magnetization free layer 10, respectively. In the example shown in FIG. 11B, also, the memory state of the magnetic memory element 70 can be initialized by the initializing method described using FIGS. 8A to 8J.

FIG. 11C indicates another example of the second modification example. In FIG. 11C, the magnetization fixed layer group 60 is provided at the position in the positive direction of the z axis to the first magnetization free layer 10, namely in the side opposite to the substrate. In addition, the 1st-2nd magnetization fixed layer group 60a-2 is provided adjacent to the first magnetization fixed region 11a in the first magnetization free layer 10, and the first blocking layer 65a and the 1st-1st magnetization fixed layer group 60a-1 are provided on it in this order. That is, the first blocking layer 65a is provided being sandwiched between the 1st-1st magnetization fixed layer group 60a-1 and the 1st-2nd magnetization fixed layer group 60a-2. Even in such structure, also, the memory state of the magnetic memory element 70 can be initialized by the initializing method described using FIGS. 8A to 8J.

As described above, in the present exemplary embodiment, it is enough for the magnetization fixed layer group 60 to be provided magnetically affecting the first magnetization fixed region 11a and the second magnetization fixed region 11b in the magnetization free layer 10. The position of the magnetization fixed layer group 60 is arbitrary.

Third Modification Example

Figure 12A:
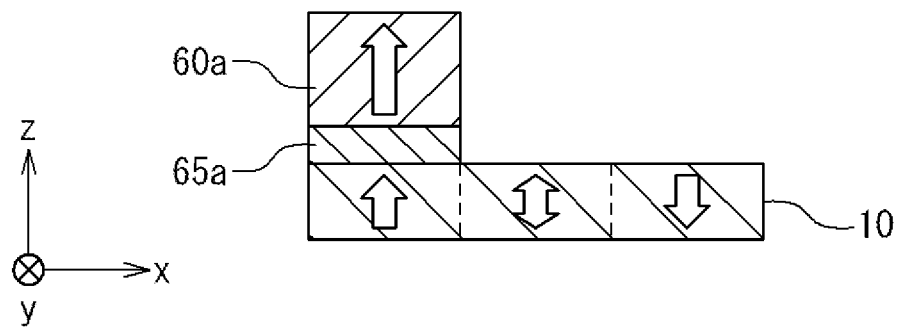
FIG. 12A schematically shows a structure of a third modification example of the magnetic memory element according to the exemplary embodiment of the present invention.
Figure 12B:
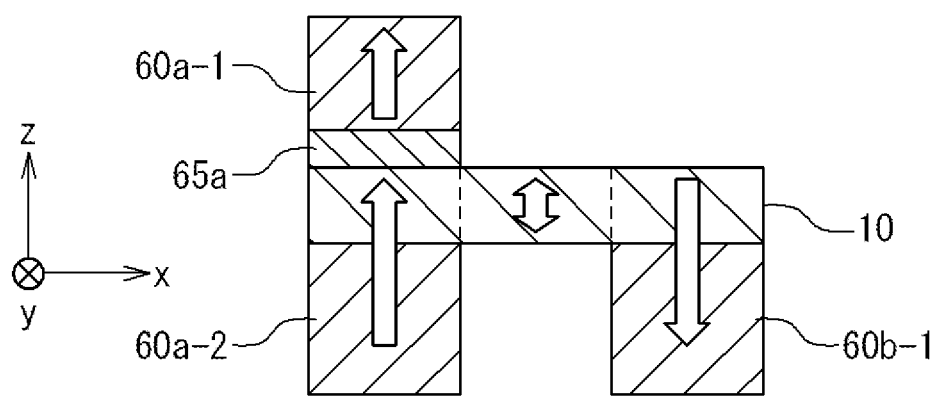
FIG. 12B schematically shows a structure of a third modification example of the magnetic memory element according to the exemplary embodiment of the present invention.

FIGS. 12A to 12B schematically show structures of a third modification example of the magnetic memory element 70 according to the exemplary embodiment of the present invention. The third modification example relates to the number of the magnetization fixed layer groups 60.

In the exemplary embodiment shown in FIG. 1, the example is shown in which, as the magnetization fixed layer group 60, the first magnetization fixed layer group 60a is provided near the first magnetization fixed region 11a in the first magnetization free layer 10, the second magnetization fixed layer group 60b is provided near the second magnetization fixed region 11b, and thereby total of two magnetization fixed layer groups are provided. However, in the present exemplary embodiment, the number of the magnetization fixed layer groups 60 is arbitrary. FIGS. 12A and 12B show the modification example. Here, in FIGS. 12A and 12B, for an easy way of understanding, only the first magnetization free layer 10, the magnetization fixed layer groups 60 and the blocking layer 65 are indicated and the other portions are omitted.

FIG. 12A is an example of the third modification example. In the example shown in FIG. 12A, the magnetization fixed layer group 60 includes a single first magnetization fixed layer group 60a. The first magnetization fixed layer group 60a is connected to and magnetically coupled weakly with the first magnetization fixed region 11a in the first magnetization free layer 10 through the first blocking layer 65a.

FIG. 12B is another example of the third modification example. In the example shown in FIG. 12B, the magnetization fixed layer group 60 includes total of three groups of the 1st-1st magnetization fixed layer group 60a-1, the 1st-2nd magnetization fixed layer group 60a-2 and the 2nd-1st magnetization fixed layer group 60b-1. Theist-1st magnetization fixed layer group 60a-1 is connected to and magnetically coupled weakly with the first magnetization fixed region 11a in the first magnetization free layer 10 through the first blocking layer 65a. The 1st-2nd magnetization fixed layer group 60a-2 is provided adjacent to the first magnetization fixed region 11a in the first magnetization free layer 10. The 2nd- 1st magnetization fixed layer group 60*b*-1 is provided adjacent to the second magnetization fixed region 11*b* in the first magnetization free layer 10.

Figure 13A:
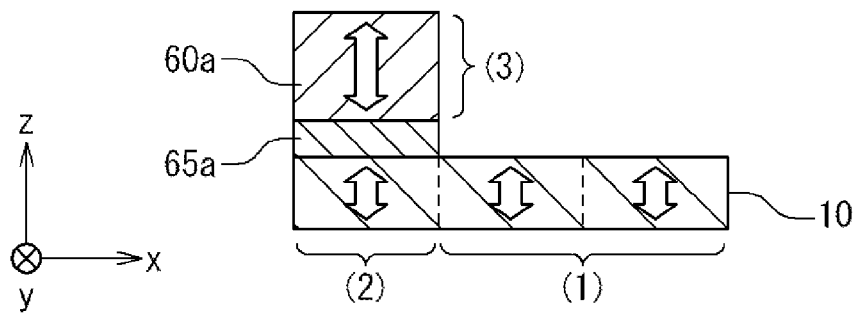
FIG. 13A schematically shows apart of the structure of the third modification example of the magnetic memory element according to the exemplary embodiment of the present invention.
Figure 13B:
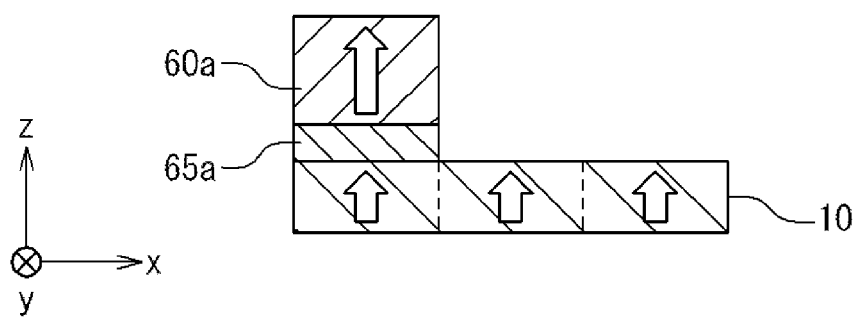
FIG. 13B schematically shows an initializing method of a magnetization state in the third modification example of the magnetic memory element according to the exemplary embodiment of the present invention.
Figure 13C:
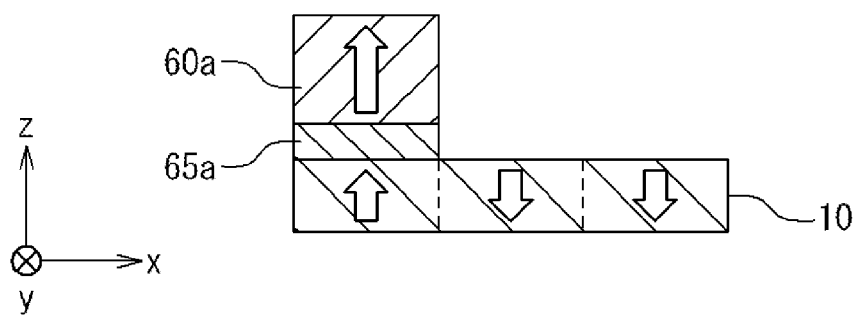
FIG. 13C schematically shows the initializing method of the magnetization state in the third modification example of the magnetic memory element according to the exemplary embodiment of the present invention.
Figure 13D:
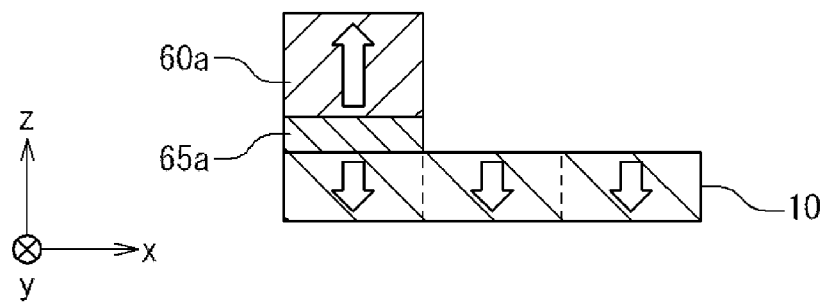
FIG. 13D schematically shows the initializing method of the magnetization state in the third modification example of the magnetic memory element according to the exemplary embodiment of the present invention.
Figure 13E:
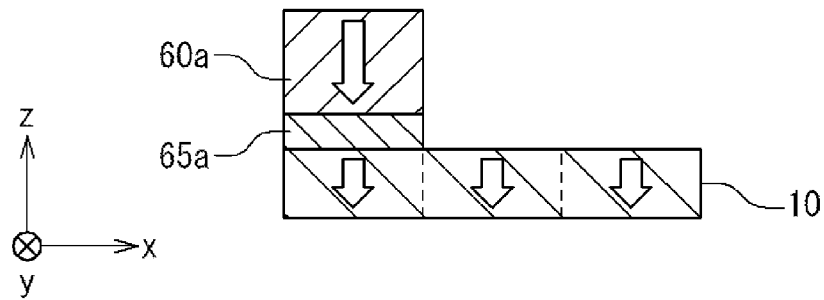
FIG. 13E schematically shows the initializing method of the magnetization state in the third modification example of the magnetic memory element according to the exemplary embodiment of the present invention.
Figure 13F:
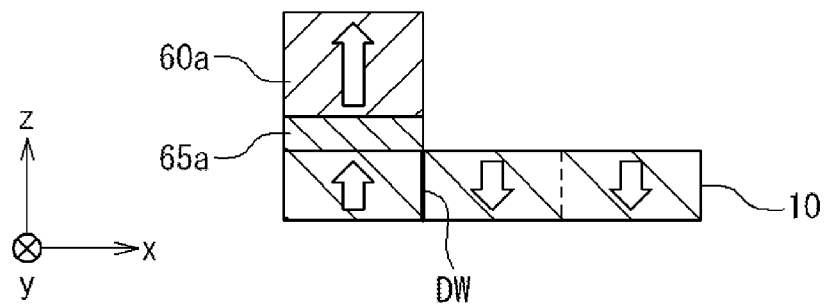
FIG. 13F schematically shows the initializing method of the magnetization state in the third modification example of the magnetic memory element according to the exemplary embodiment of the present invention.
Figure 13G:
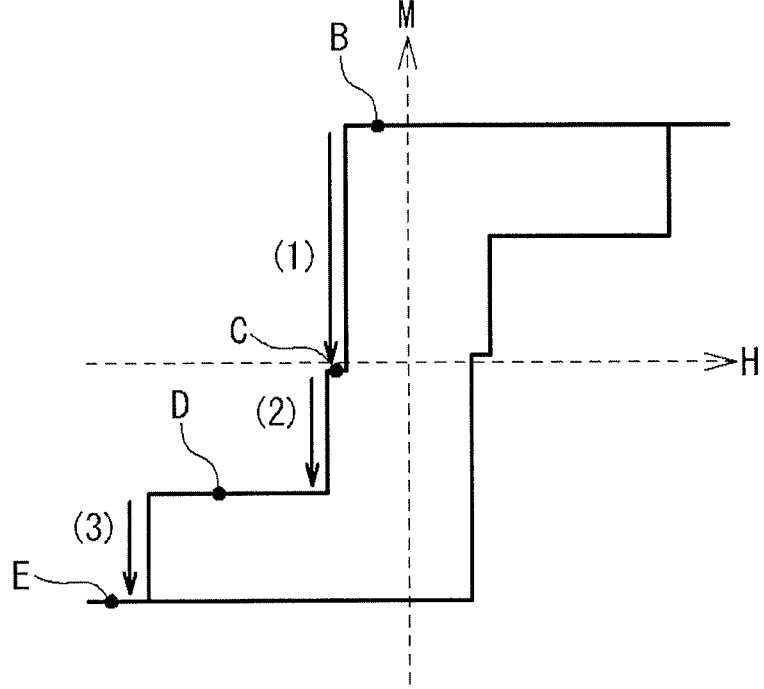
FIG. 13G schematically shows a synthetic magnetization curve of a system composed of a first magnetization free layer and a magnetization fixed layer group in the third modification example of the magnetic memory element according to the exemplary embodiment of the present invention.
Figure 13H:
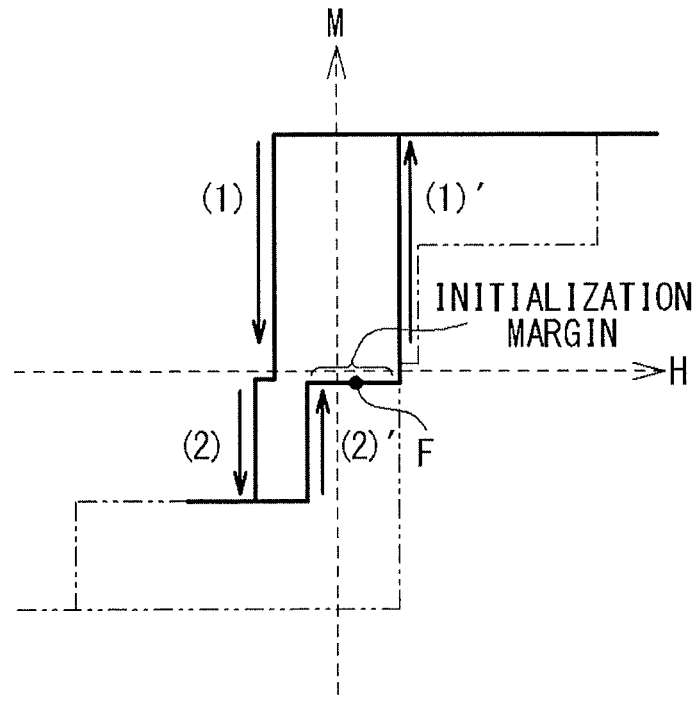
FIG. 13H schematically shows a synthetic magnetization curve of the system composed of the first magnetization free layer and the magnetization fixed layer group in the third modification example of the magnetic memory element according to the exemplary embodiment of the present invention.

FIGS. 13A to 13H schematically shows an initializing method for a system composed of a single magnetization fixed layer group 60 shown in FIG. 12A. FIG. 13A schematically shows apart of the structure of the magnetic memory element 70 shown in FIG. 12A. In FIG. 13A, the first magnetization fixed layer group 60*a* is ferromagnetically coupled with the first magnetization fixed region 11*a*. However, since the blocking layer 65*a* is inserted therebetween, the coupling is weakened. The initializing method for this system will be described with reference to FIGS. 13B to 13H. FIGS. 13B to 13F schematically show magnetization states in the respective steps. FIGS. 13G to 13H schematically show synthetic magnetization curves of a system composed of the first magnetization free layer 10 and the magnetization fixed layer group 60.

In the initializing processes shown in FIGS. 13B to 13F, first, a sufficiently large magnetic field is applied in one direction. Here, it is assumed that the direction of the magnetic field is the +z direction. In this case, the magnetization of all parts turns in the +z direction. This situation is shown in FIG. 13B. Next, a magnetic field in the direction opposite to the first applied direction is being applied. In this case, the direction is the −z direction. As shown in FIG. 13C, the magnetization of the magnetization free region 12 and the second magnetization fixed region 11*b*, of which the reverse magnetic fields are the smallest, firstly turn in the −z direction. Here, a domain wall is formed at the boundary between the first magnetization fixed region 11*a* and the magnetization free region 12.

Then, the magnetic field in the −z direction is being enlarged. Here, the domain wall motion arises only in the first magnetization fixed region 11*a*, of which the reverse magnetic field is smaller next to the magnetization free region 12, and the magnetization of this part also turns in the −z direction. This situation is shown in FIG. 13D. In FIG. 13D, in the first magnetization fixed layer group 60*a*, since the magnetic coupling with the first magnetization fixed region 11*a* is weak, the magnetization reversing does not arise. Next, if the magnetic field in the −z direction is being enlarged further, the magnetization of the first magnetization fixed layer group 60*a* is finally reversed, and all of the magnetization turns in the −z direction. This situation is shown in FIG. 13E.

FIG. 13G schematically shows the transition of the magnetization structure from FIG. 13B to FIG. 13E described above as a magnetization curve. Here, in FIG. 13G, the horizontal axis indicates the magnetic field (H) in the z direction applied from the outside, and the vertical axis indicates the synthetic magnetization (M) of the system composed of the first magnetization free layer 10 and the magnetization fixed layer group 60. In addition, the part of (1) in FIG. 13G indicates that the magnetization reversing arises in the magnetization free layer 12 and the second magnetization fixed region 11*b* as shown in FIG. 13C. The part of (2) indicates that the magnetization reversing further arises in the first magnetization fixed region 11*a* as shown in FIG. 13D. The part of (3) indicates that the magnetization reversing further arises in the first magnetization fixed layer group 60*a* as shown in FIG. 13E. The respective states shown in FIGS. 13B to 13E correspond to the portions of the B to E shown in the magnetization curve of FIG. 13G, respectively. Here, FIG. 13G indicates the full loop of the magnetization curve of the magnetic memory element 70.

Here, the initializing method of the magnetic memory element 70 according to the exemplary embodiment of the present invention is characterized in that a minor loop of the magnetization curve is used. Specific steps for the system indicated in FIG. 13A will be described below. After the state shown in FIG. 13D is provided, the magnetic field in the −z direction is being weakened. At this time, since the first magnetization fixed region 11*a* is ferromagnetically coupled weakly with the first magnetization fixed layer group 60*a*, firstly the magnetization of this region is reversed in the +z direction. This situation is shown in FIG. 13F. In this case, the domain wall is formed at the boundary between the first magnetization fixed region 11*a* and the magnetization free region 12. In the example shown in FIGS. 13B to 13D and FIG. 13F, the initialization of the memory state of the magnetic memory element 70 is performed as described above. Incidentally, if the magnetic field in the +z direction is being enlarged further, the domain wall motion arises in the magnetization free region 12 and the second magnetization fixed region 11*b* at a certain magnetic field and all of the regions is magnetized in the +z direction as shown in FIG. 13B again. Therefore, the initialization margin in this method is the range from the magnetic field in which the magnetization of the first magnetization fixed region 11*a* is reversed to the magnetic field in which the magnetization of the magnetization free region 12 and the second magnetization fixed region 11*b* is reversed.

FIG. 13H schematically shows the transition of the magnetization structure as the magnetization curve in the initializing method using the minor loop described above. Here, in FIG. 13H, the horizontal axis indicates the magnetic field (H) in the z direction applied from the outside, and the vertical axis indicates the synthetic magnetization (M) of the system composed of the first magnetization free layer 10 and the magnetization fixed layer group 60. In addition, the parts of (1) to (2) in FIG. 13H are the same as those in FIG. 13G. The part of (2)' indicates that the magnetization reversing arises in the first magnetization fixed region 11*a* as shown in FIG. 13F. The part of (1)' indicates that the magnetization reversing further arises in the magnetization free region 12 and the second magnetization fixed region 11*b* as shown in FIG. 13B. The state shown in FIG. 13F corresponds to the part indicated as the F in the magnetization curve of FIG. 13H.

In this case, it is difficult to increase the initialization margin. However, in the minor loop of the magnetization curve shown in FIG. 13H, the magnetic field in which the domain wall motion arises in the magnetization free region 12 and the second magnetization fixed region 11*b* shown in (1)' in the system of FIG. 13A is positive (H>0), and the magnetic field in which the magnetization reversing arises in the first magnetization fixed region 11*a* shown in (2)' can be made negative (H<0) by adjusting the magnetic coupling between the first magnetization fixed layer group 60*a* and the first magnetization fixed region 11*a* through the first blocking layer 65*a*. Therefore, by bringing the negative magnetic field back to zero, the initialization state (the state in FIG. 13F) in which the magnetization of the first magnetization fixed region 11*a* and the magnetization of the second magnetization fixed region 11*b* are anti-parallel to each other can be easily achieved.

As described above, in the present exemplary embodiment, it is enough to provide the magnetization fixed layer group 60 magnetically affecting at least one of the first magnetization fixed region 11*a* and the second magnetization fixed region 11*b* in the first magnetization free layer 10, and the number of the magnetization fixed layer groups 60 is arbitrary.

Fourth Modification Example

Figure 14:
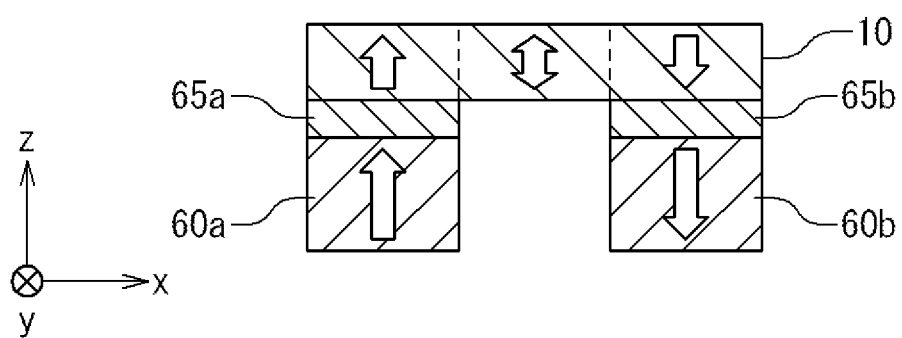
FIG. 14 schematically shows a structure of a fourth modification example of the magnetic memory element according to the exemplary embodiment of the present invention.

FIG. 14 schematically shows a structure of a fourth modification example of the magnetic memory element 70 according to the exemplary embodiment of the present invention.

In the exemplary embodiment shown in FIG. 1, the example is shown in which the single first blocking layer 65a is provided as the blocking layer 65. However, in the present exemplary embodiment, the number of the blocking layers 65 is arbitrary. FIG. 14 shows its modification example. Here, in FIG. 14, for an easy way of understanding, only the first magnetization free layer 10, the magnetization fixed layer groups 60 and the blocking layer 65 are indicated and the other portions are omitted.

FIG. 14 shows the third modification example. In the example shown in FIG. 14, two of the first blocking layer 65a and the second blocking layer 65b are provided as the blocking layer 65. The first blocking layer 65a is provided adjacent to the first magnetization fixed region 11a in the first magnetization free layer 10 and the second blocking layer 65b is provided adjacent to the second magnetization fixed region 11b. The first magnetization fixed layer group 60a and the second magnetization fixed layer group 60b are respectively provided adjacent to the first blocking layer 65a and second blocking layer 65b opposite to the first magnetization free layer 10. In this case, the first magnetization fixed layer group 60a is connected to and magnetically coupled weakly with the first magnetization fixed region 11a in the magnetization free layer 10 through the first blocking layer 65a. The second magnetization fixed layer group 60b is connected to and magnetically coupled weakly with the second magnetization fixed region 11b in the magnetization free layer 10 through the second blocking layer 65b.

Figure 15A:
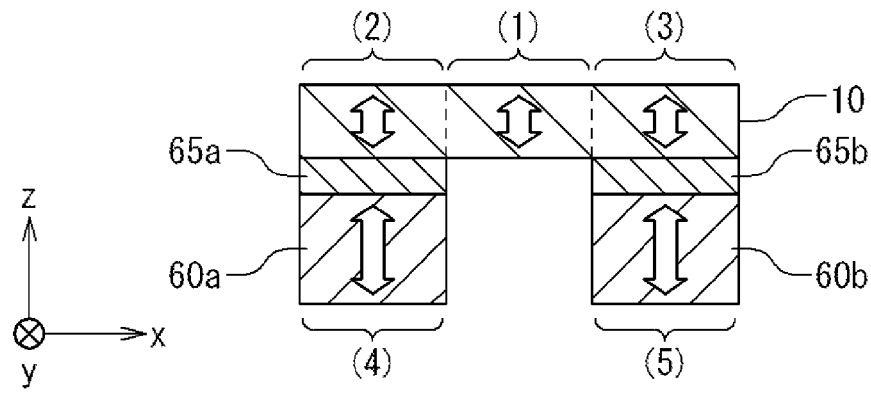
FIG. 15A schematically shows apart of the structure of the fourth modification example of the magnetic memory element according to the exemplary embodiment of the present invention.
Figure 15B:
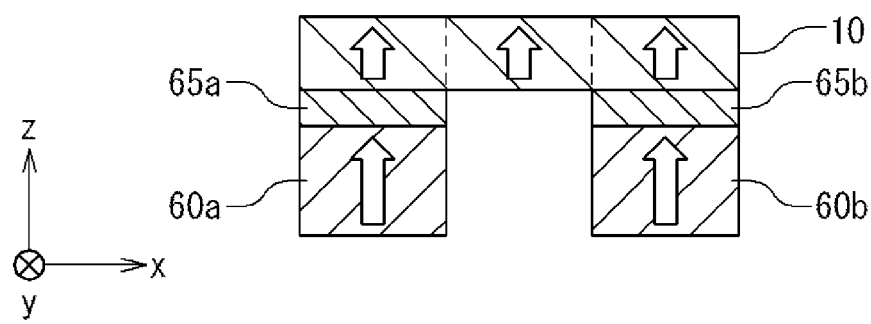
FIG. 15B schematically shows an initializing method of a magnetization state in the fourth modification example of the magnetic memory element according to the exemplary embodiment of the present invention.
Figure 15C:
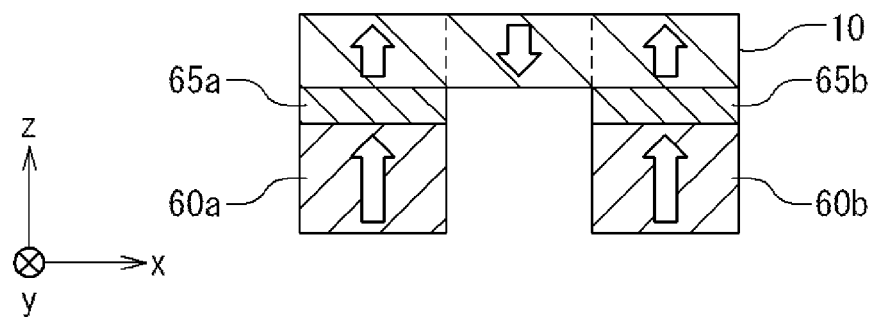
FIG. 15C schematically shows the initializing method of the magnetization state in the fourth modification example of the magnetic memory element according to the exemplary embodiment of the present invention.
Figure 15D:
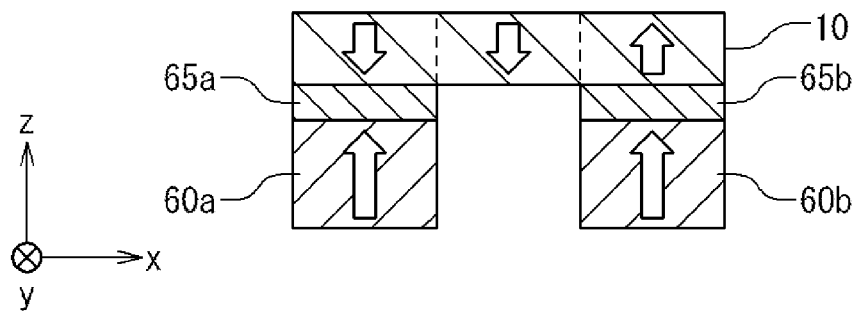
FIG. 15D schematically shows the initializing method of the magnetization state in the fourth modification example of the magnetic memory element according to the exemplary embodiment of the present invention.
Figure 15E:
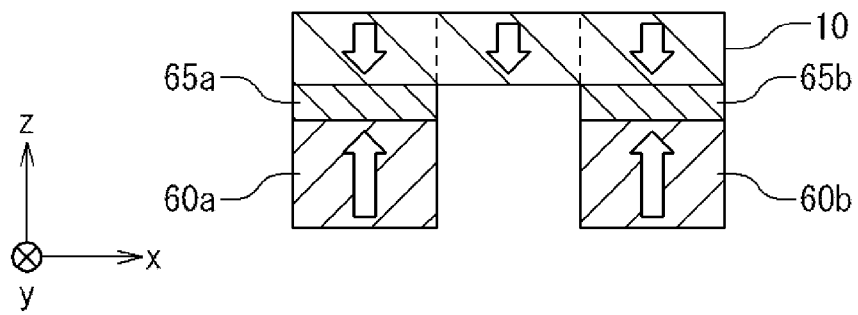
FIG. 15E schematically shows the initializing method of the magnetization state in the fourth modification example of the magnetic memory element according to the exemplary embodiment of the present invention.
Figure 15F:
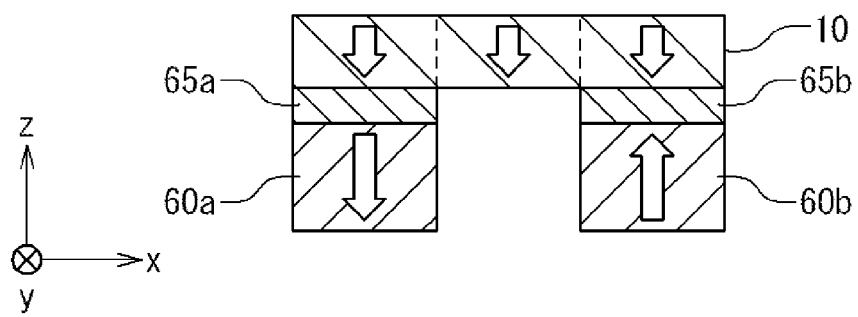
FIG. 15F schematically shows the initializing method of the magnetization state in the fourth modification example of the magnetic memory element according to the exemplary embodiment of the present invention.
Figure 15G:
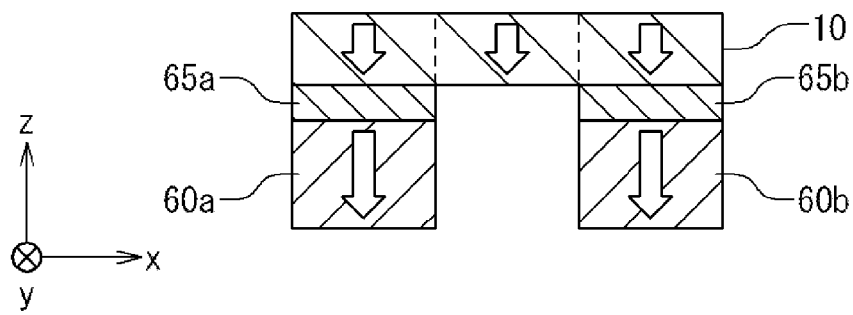
FIG. 15G schematically shows the initializing method of the magnetization state in the fourth modification example of the magnetic memory element according to the exemplary embodiment of the present invention.
Figure 15H:
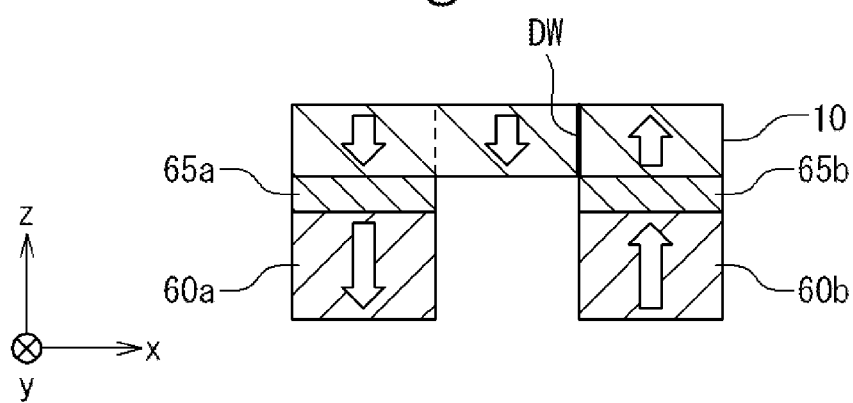
FIG. 15H schematically shows the initializing method of the magnetization state in the fourth modification example of the magnetic memory element according to the exemplary embodiment of the present invention.
Figure 15I:
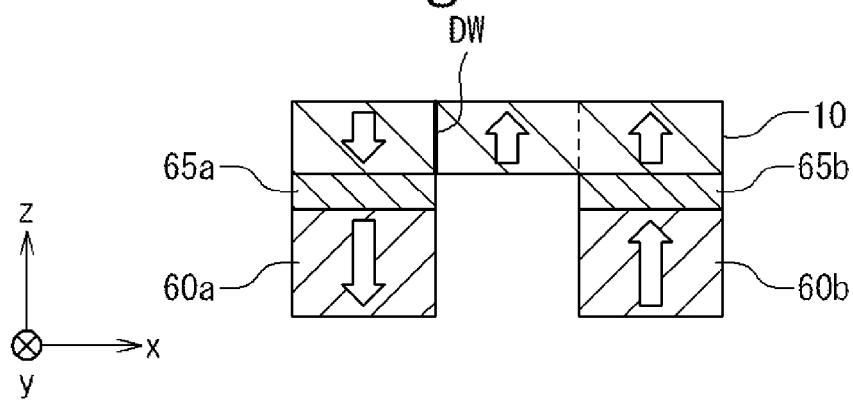
FIG. 15I schematically shows the initializing method of the magnetization state in the fourth modification example of the magnetic memory element according to the exemplary embodiment of the present invention.
Figure 15J:
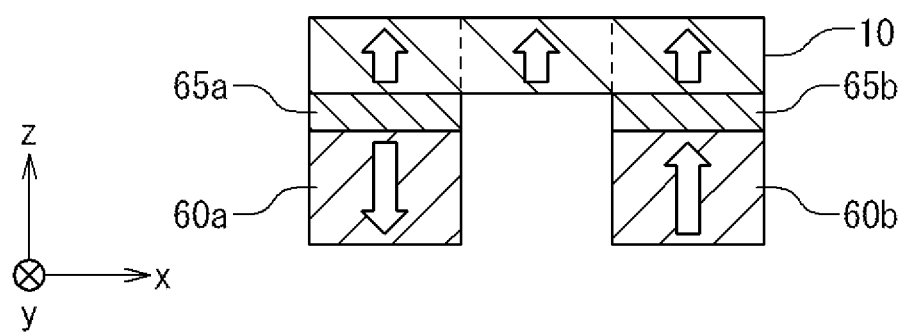
FIG. 15J schematically shows the initializing method of the magnetization state in the fourth modification example of the magnetic memory element according to the exemplary embodiment of the present invention.
Figure 15K:
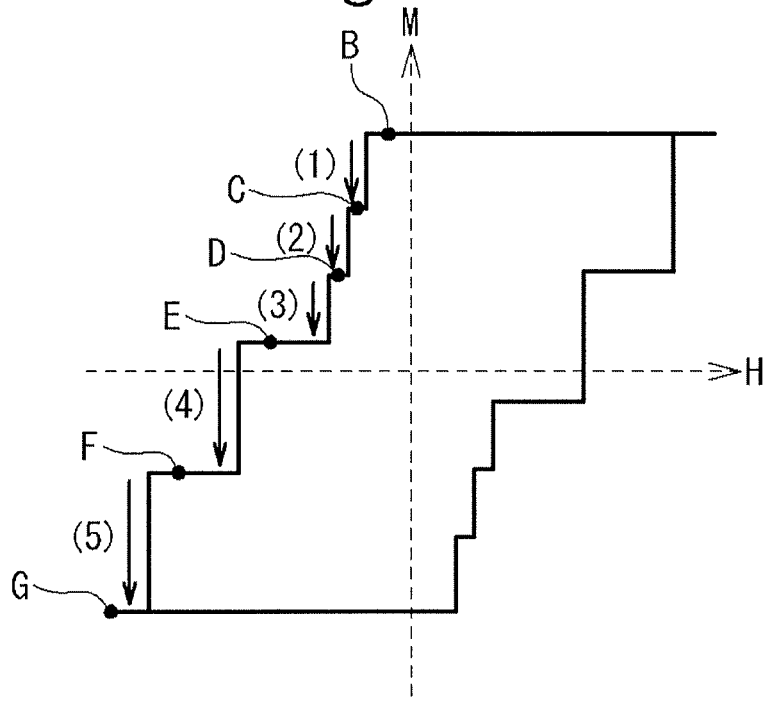
FIG. 15K schematically shows a synthetic magnetization curve of a system composed of a first magnetization free layer and a magnetization fixed layer group in the fourth modification example of the magnetic memory element according to the exemplary embodiment of the present invention.
Figure 15L:
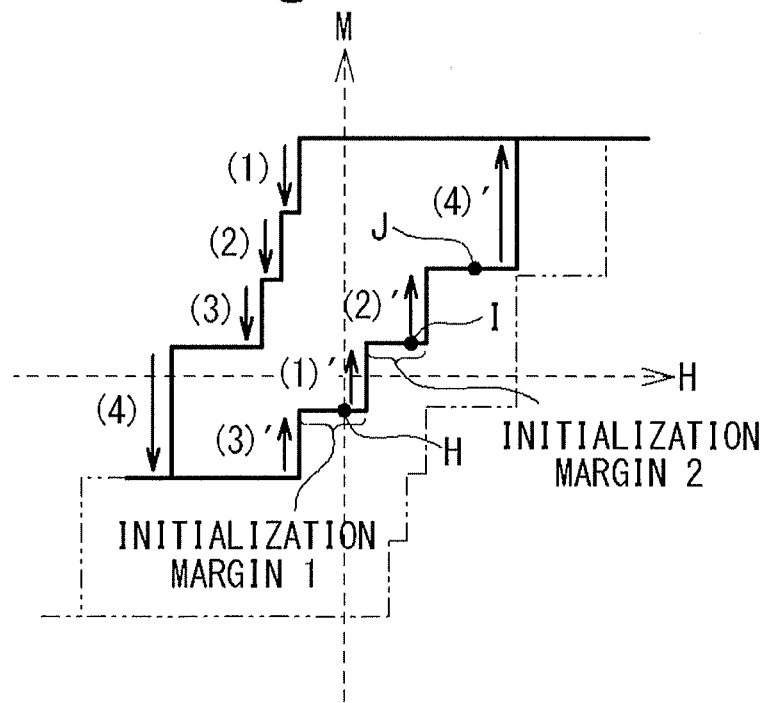
FIG. 15L schematically shows a synthetic magnetization curve of the system composed of the first magnetization free layer and the magnetization fixed layer group in the fourth modification example of the magnetic memory element according to the exemplary embodiment of the present invention.

FIG. 15A to 15L schematically shows an initializing method for the structure having the two blocking layers 65 shown in FIG. 14. FIG. 15A schematically shows a part of the structure of the magnetic memory element 70 shown in FIG. 14. In FIG. 15A, the first magnetization fixed layer group 60a is ferromagnetically coupled with the first magnetization fixed region 11a. However, since the first blocking layer 65a is inserted therebetween, the coupling is weakened. In addition, the second magnetization fixed layer group 60b is ferromagnetically coupled with the second magnetization fixed region 11b. However, since the second blocking layer 65b is inserted therebetween, the coupling is weakened. The initializing method for this system will be described with reference to FIGS. 15B to 15L. FIGS. 15B to 15J schematically show magnetization states in the respective steps. FIGS. 15K to 15L schematically show synthetic magnetization curves of a system composed of the first magnetization free layer 10 and the magnetization fixed layer group 60.

In the initializing processes shown in FIGS. 15B to 15L, first, a sufficiently large magnetic field is applied in one direction. Here, it is assumed that the direction of the magnetic field is the +z direction. In this case, the magnetization of all parts turns in the +z direction. This situation is shown in FIG. 15B. Next, a magnetic field in the direction opposite to the first applied direction is being applied. In this case, the direction is the −z direction. As shown in FIG. 15C, the magnetization of the magnetization free region 12, of which the reverse magnetic field is the smallest, firstly turns in the −z direction. Here, domain walls are formed at the boundary between the first magnetization fixed region 11a and the magnetization free region 12 and the boundary between the second magnetization fixed region 11b and the magnetization free region 12.

Then, the magnetic field in the −z direction is being enlarged. Here, the domain wall motion arises in one of the first magnetization fixed region 11a and the second magnetization fixed region 11b, of which the reverse magnetic fields are smaller next to the magnetization free region 12, and then the domain wall motion arises in the other of the first magnetization fixed region 11a and the second magnetization fixed region 11b. FIGS. 15D and 15E show the magnetization states at the respective steps in the case that the domain wall motion arises in order of the first magnetization fixed region 11a and the second magnetization fixed region 11b. In FIGS. 15D and 15E, in the first magnetization fixed layer group 60a and the second magnetization fixed layer group 60b, since the magnetic coupling with the first magnetization fixed region 11a and the second magnetization fixed region 11b, respectively, is weak, the magnetization reversing does not arise. Next, if the magnetic field in the −z direction is being enlarged further, the magnetization of one of the first magnetization fixed layer group 60a and the second magnetization fixed layer group 60b is reversed (FIG. 15F), and then the magnetization of the other of the first magnetization fixed layer group 60a and the second magnetization fixed layer group 60b is reversed (FIG. 15G). That is, all of the magnetization turns in the −z direction. Here, it is assumed that the reverse magnetic field of the first magnetization fixed layer group 60a is smaller than that of the second magnetization fixed layer group 60b.

FIG. 15K schematically shows the transition of the magnetization structure from FIG. 15B to FIG. 15G described above as a magnetization curve. Here, in FIG. 15K, the horizontal axis indicates the magnetic field (H) in the z direction applied from the outside, and the vertical axis indicates the synthetic magnetization (M) of the system composed of the first magnetization free layer 10 and the magnetization fixed layer group 60. In addition, the part of (1) in FIG. 15K indicates that the magnetization reversing arises in the magnetization free layer 12 as shown in FIG. 15C. The part of (2) indicates that the magnetization reversing further arises in the first magnetization fixed region 11a as shown in FIG. 15D. The part of (3) indicates that the magnetization reversing further arises in the second magnetization fixed region 11b as shown in FIG. 15E. The part of (4) indicates that the magnetization reversing further arises in the first magnetization fixed layer group 60a as shown in FIG. 15F. The part of (5) indicates that the magnetization reversing further arises in the second magnetization fixed layer group 60b as shown in FIG. 15G. The respective states shown in FIGS. 15B to 15G correspond to the portions of the B to G shown in the magnetization curve of FIG. 15K, respectively. Here, FIG. 15K indicates the full loop of the magnetization curve of the magnetic memory element 70.

Here, the initializing method of the magnetic memory element 70 according to the exemplary embodiment of the present invention is characterized in that a minor loop of the magnetization curve is used. Specific steps for the system indicated in FIG. 15A will be described below. After the state shown in FIG. 15F is provided, the magnetic field in the +z direction is being applied. At this time, since the second magnetization fixed region 11b is ferromagnetically coupled weakly with the second magnetization fixed layer group 60b, firstly the magnetization of this region is reversed in the +z direction. This situation is shown in FIG. 15H. In this case, the domain wall is formed at the boundary between the second magnetization fixed region 11b and the magnetization free region 12. Next, when the magnetic field in the +z direction is being enlarged, the domain wall motion arises in the magnetization free region 12 and the magnetization of the magnetization free region 12 is reversed in the +z direction. This situation is shown in FIG. 15I. According to this, the domain wall is formed at the boundary between the magnetization free region 12 and the first magnetization fixed region 11a. In the example shown in FIGS. 15B to 15F and FIGS. 15H to 15I, the initialization of the memory state of the magnetic memory element 70 is performed using the above described steps. Incidentally, if the magnetic field in the +z direction is being enlarged further, the domain wall motion arises in the first magnetization fixed region 11a and its magnetization is reversed in the +z direction as shown in FIG. 15J. If the magnetic field in the +z direction is being enlarged much further, finally, all of the regions is magnetized in the +z direction as shown in FIG. 15B. Therefore, the initialization margin in this method is the range from the magnetic field in which the magnetization of the second magnetization fixed region 11b and the magnetization free region 12 is reversed to the magnetic field in which the first magnetization fixed region 11a is reversed.

FIG. 15L schematically shows the transition of the magnetization structure as the magnetization curve in the initializing method using the minor loop described above. Here, in FIG. 15L, the horizontal axis indicates the magnetic field (H) in the z direction applied from the outside, and the vertical axis indicates the synthetic magnetization (M) of the system composed of the first magnetization free layer 10 and the magnetization fixed layer group 60. In addition, the parts of (1) to (4) in FIG. 15L are the same as those in FIG. 15K. The part of (3)' indicates that the magnetization reversing arises in the second magnetization fixed region 11b as shown in FIG. 15H. The part of (1)' indicates that the magnetization reversing further arises in the magnetization free region 12 as shown in FIG. 15I. The part of (2)' indicates that the magnetization reversing further arises in the first magnetization fixed region 11a as shown in FIG. 15J. The respective states shown in FIGS. 15H to 15J correspond to the parts indicated as the H to J in the magnetization curve of FIG. 15L.

Incidentally, in the present example, to apply the initializing method described with FIG. 15, the magnetic properties of the first magnetization fixed layer group 60a are required to be different from that of the second magnetization fixed layer group 60b. The difference of the magnetic properties can be realized based on the difference of material, a structure (e.g., a film thickness, a shape, a crystal structure, usage of a lamination film, a combination of films) and so on.

Fifth Modification Example

Figure 16A:
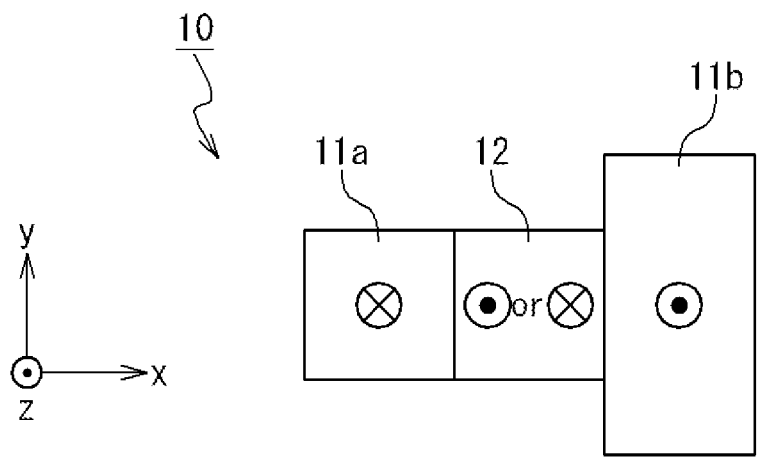
FIG. 16A schematically shows a structure of a fifth modification example of the magnetic memory element according to the exemplary embodiment of the present invention.
Figure 16B:
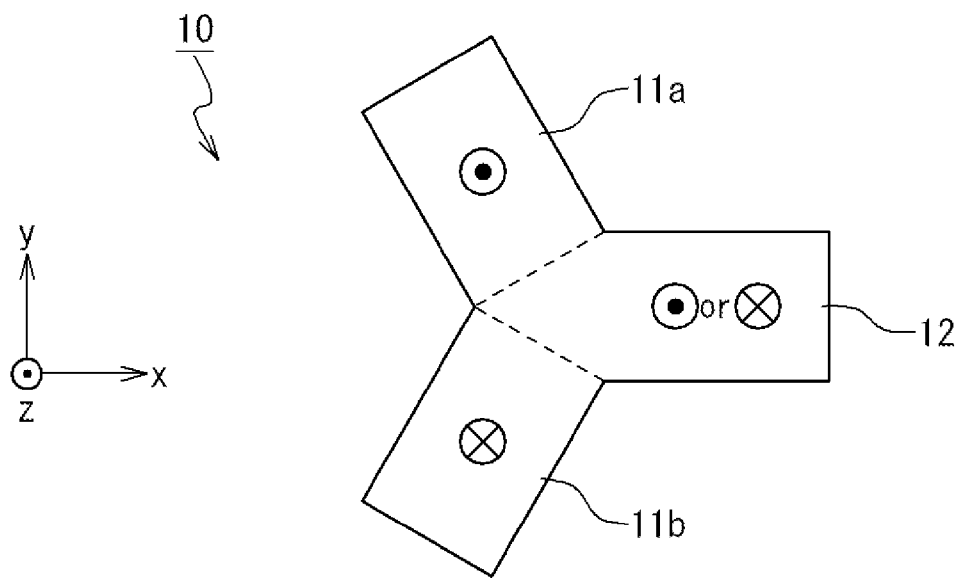
FIG. 16B schematically shows a structure of a fifth modification example of the magnetic memory element according to the exemplary embodiment of the present invention.

FIGS. 16A and 16B schematically show structures of a fifth modification example of the magnetic memory element 70 according to the exemplary embodiment of the present invention. The fifth modification example relates to a shape of the first magnetization free layer 10.

In the present exemplary embodiment, it is described that the first magnetization free layer 10 has a role of information storage layer; the shape of first magnetization free layer 10 is a rectangle in the x-y plane (the plane parallel to the substrate surface); and the first magnetization fixed region 11a is connected to one end of the magnetization free region 12 and the second magnetization fixed region 11b is connected to the other end of the magnetization free region 12. However, the shape of the first magnetization free layer 10 is arbitrary, and the arrangement of the first magnetization fixed region 11a, the second magnetization fixed region 11b and the magnetization free region 12 is arbitrary.

FIG. 16A shows its example. In the present exemplary embodiment, the first magnetization fixed region 11a and the second magnetization fixed region 11b of the first magnetization free layer 10 may be formed such that each width is wider than the width of the magnetization free region 12. FIG. 16A shows an example that the first magnetization free layer 10 is formed such that the width of the second magnetization fixed region 11b is wider than that of the remaining regions.

As shown in FIG. 16A, by forming the first magnetization fixed region 11a and the second magnetization fixed region 11b such that the each of their widths is wider than the width of the magnetization free region 12, the writing operation is made to be more stable. Specifically, for example, in the "0" writing operation described with FIG. 3B, the domain wall moves from the boundary between the first magnetization fixed region 11a and the magnetization free region 12 to the boundary between the second magnetization fixed region 11b and the magnetization free region 12 and stops there. Here, it is preferable that the domain wall stops exactly at the boundary. If the width of the second magnetization fixed region 11b is formed widely as shown in FIG. 16A, the current density sufficiently decreases at the boundary, and the domain wall can stop more exactly at the boundary.

FIG. 16B shows another example. In the present exemplary embodiment, the first magnetization free layer 10 may be formed in a Y shape as shown in FIG. 16B. In FIG. 16B, the first magnetization free layer 10 is formed which is composed of the magnetization free region 12 extending in the x direction, the first magnetization fixed region 11a connected to one end (the −x direction side) and the second magnetization fixed region 11b connected to the same one end. That is, the first magnetization free layer 10 has a shape of a three-way intersection. In this case, also, the magnetization of the first magnetization fixed region 11a and the magnetization of the second magnetization fixed region 11b are fixed anti-parallel to each other in a perpendicular direction at least in a part of each of them. In addition, the magnetization of the magnetization free region 12 has any of an upward direction and a downward direction in the perpendicular direction.

Figure 17A:
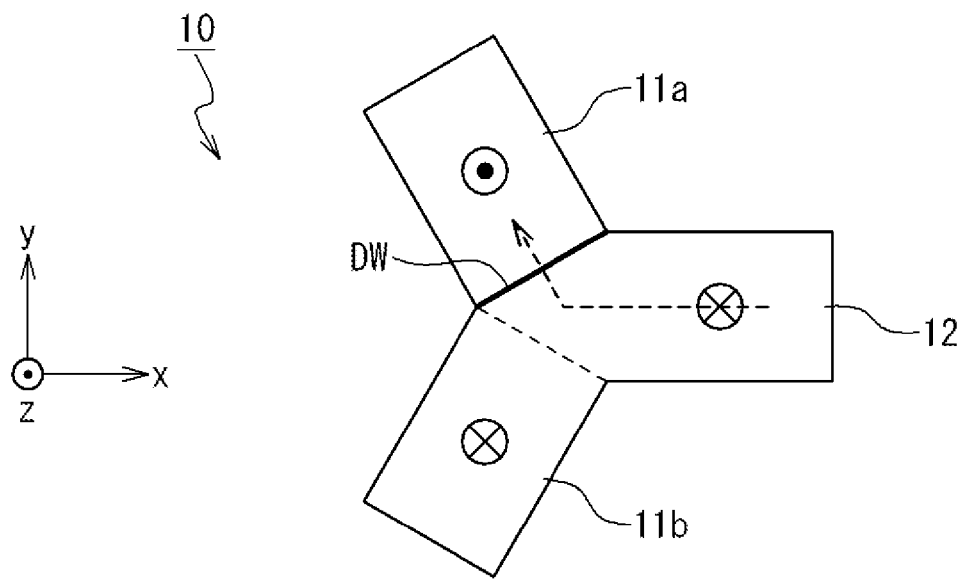
FIG. 17A schematically shows a writing method of the fifth modification example of the magnetic memory element according to the exemplary embodiment of the present invention.
Figure 17B:
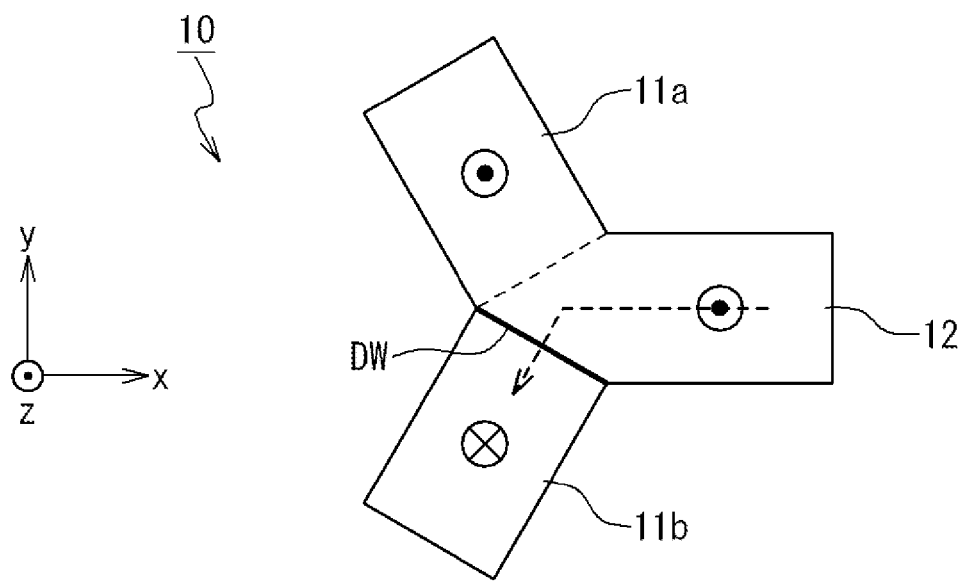
FIG. 17B schematically shows the writing method of the fifth modification example of the magnetic memory element according to the exemplary embodiment of the present invention.
Figure 18A:
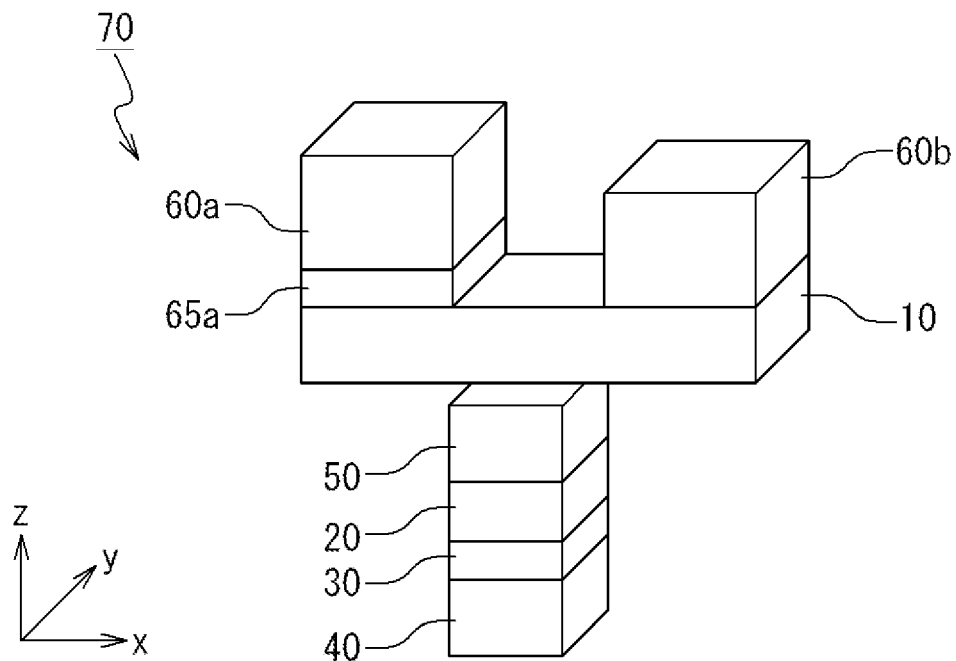
FIG. 18A schematically shows a structure of a sixth modification example of the magnetic memory element according to the exemplary embodiment of the present invention.
Figure 18B:
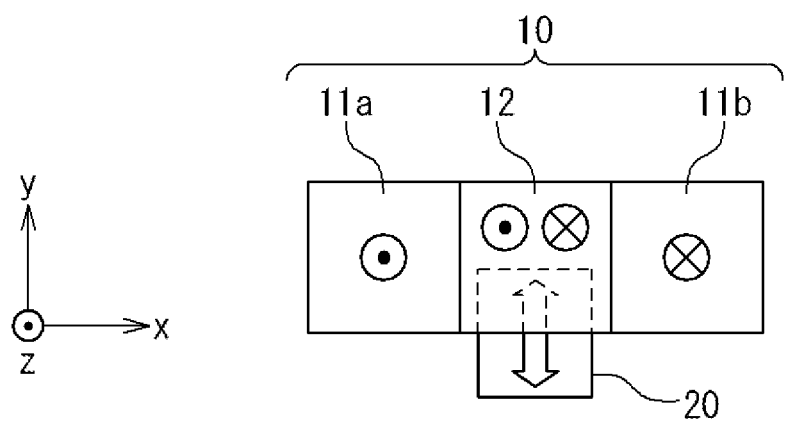
FIG. 18B schematically shows a structure of the sixth modification example of the magnetic memory element according to the exemplary embodiment of the present invention.
Figure 18C:
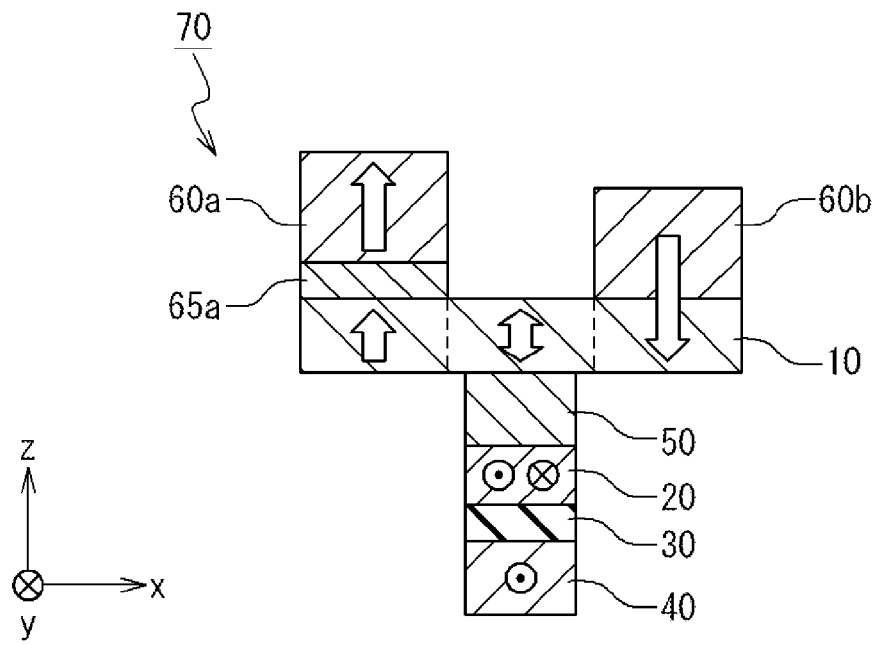
FIG. 18C schematically shows a structure of the sixth modification example of the magnetic memory element according to the exemplary embodiment of the present invention.
Figure 18D:
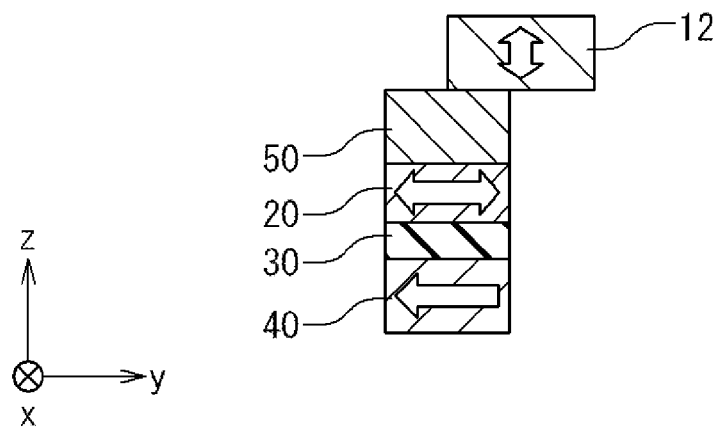
FIG. 18D schematically shows a structure of the sixth modification example of the magnetic memory element according to the exemplary embodiment of the present invention.

A writing method in the case that the first magnetization free layer 10 has the Y shape shown in FIG. 16B will be described with reference to FIGS. 17A and 17B. FIG. 17A schematically shows the method of writing "1" in the "0" state, and FIG. 17B schematically shows the method of writing "0" in the "1" state. Here, it is assumed that the first magnetization fixed region 11a has the magnetization fixed in the upward direction and the second magnetization fixed region 11b has the magnetization fixed in the downward direction. The state where the magnetization free region 12 is magnetized in the downward direction is defined as the "0" state, and the state where the magnetization free region 12 is magnetized in the upward direction is defined as the "1" state. In this case, in the "0" state shown in FIG. 17A, the domain wall (DW) is formed at the boundary between the first magnetization fixed region 11a and the magnetization free region 12. Here, if the current is made to flow in the dashed line direction (from the magnetization free region 12 to the first magnetization fixed region 11a) in FIG. 17A, the domain wall (DW) moves to the side opposite to the end connected to the first magnetization fixed region 11a in the magnetization free region 12 due to the current induced domain wall motion effect, thereby making the transition to the "1" state as shown in FIG. 17B. Similarly, in this case, in the "1" state shown in FIG. 17B, the domain wall (DW) is formed at the boundary between the second magnetization fixed region 11b and the magnetization free region 12. Here, if the current is made to flow in the dashed line direction (from the magnetization free region 12 to the second magnetization fixed region 11b) in FIG. 17B, the domain wall (DW) moves to the side opposite to the end connected to the second magnetization fixed region 11b in the magnetization free region 12 due to the current induced domain wall motion effect, thereby making the transition to the "0" state as shown in FIG. 17A.

By forming the first magnetization free layer 10 in the shape of the three-way intersection as shown in FIG. 16B, the domain wall is drawn from the end of the magnetization free region 12, thereby performing the data writing. The stable writing operation can be achieved using the above writing processes.

Sixth Modification Example

FIGS. 18A to 18D, FIGS. 19A to 19B, FIGS. 20A to 20C and FIGS. 21A to 21B schematically show structures of a sixth modification example of the magnetic memory element 70 according to the exemplary embodiment of the present invention. The sixth modification example relates to a reading method.

In the present exemplary embodiment, the non-magnetic layer 30 and the reference layer 40 are provided to read information from the first magnetization free layer 10 as the information storage layer. In the description above, the non-magnetic layer 30 and the reference layer 40 is provided adjacent to the first magnetization free layer 10. The sixth modification example relates to other reading configurations.

In the sixth modification example, a second magnetization free layer 20 is newly provided. In addition, a contact layer 50 is preferably provided. The second magnetization free layer 20, non-magnetic layer 30 and the reference layer 40 are provided adjacent in this order, thereby forming the magnetic tunnel junction (the MTJ).

In addition, preferably, the centroid of the second magnetization free layer 20 positionally differs from that of the magnetization free region 12 in the first magnetization free layer 10 within the x-y plane. Here, the direction of the centroid positional difference is defined as a first direction. The second magnetization free layer 20 and the reference layer 40 are composed of ferromagnetic material with in-plane magnetic anisotropy. In addition, the direction of the magnetic anisotropy of the second magnetization free layer 20 is arbitrary within the in-plane direction. On the other hand, the magnetization of the reference layer 40 is substantially fixed in one direction. It is preferable that this direction is the first direction.

Figure 20A:
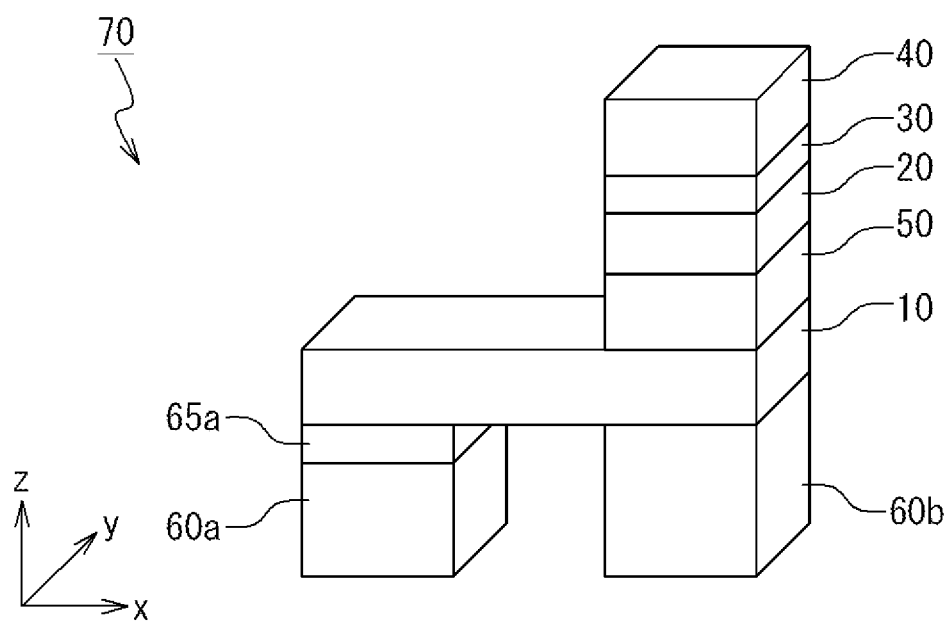
FIG. 20A schematically shows another structure of a sixth modification example of the magnetic memory element according to the exemplary embodiment of the present invention.
Figure 20B:
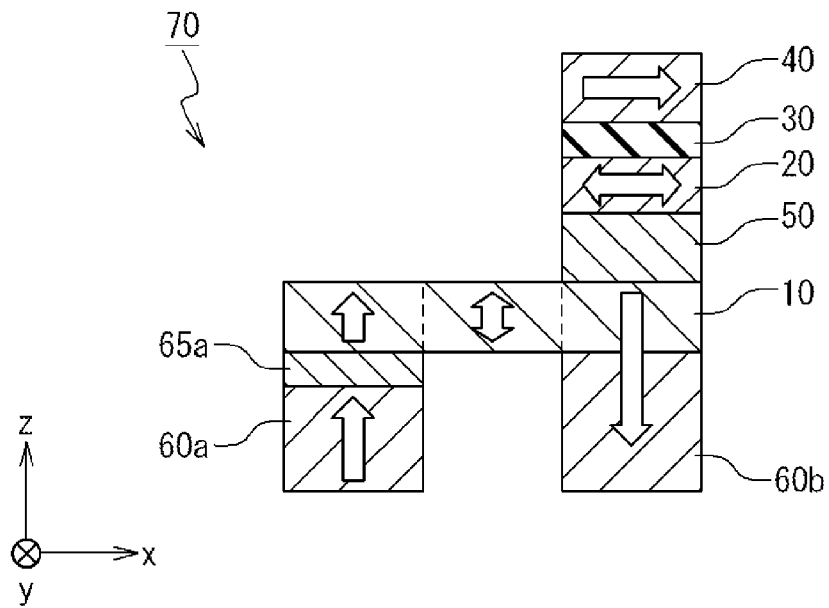
FIG. 20B schematically shows the other structure of the sixth modification example of the magnetic memory element according to the exemplary embodiment of the present invention.
Figure 20C:
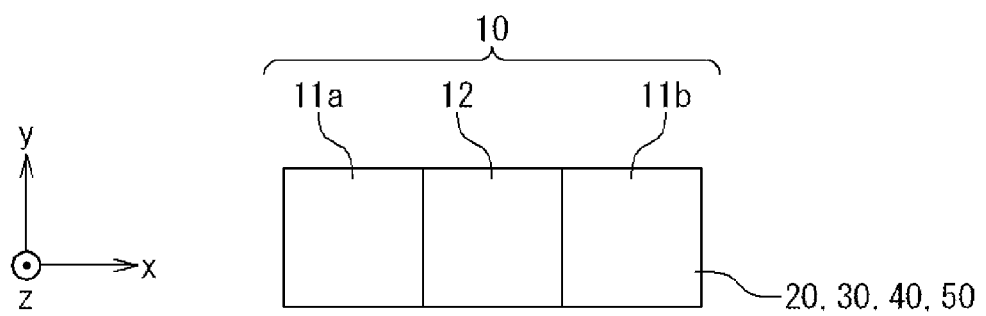
FIG. 20C schematically shows the other structure of the sixth modification example of the magnetic memory element according to the exemplary embodiment of the present invention.

FIG. 18A to 18D show an example that the first direction is the y direction, namely the first direction is perpendicular to a longitudinal direction of the first magnetization free layer 10. On the other hand, FIG. 20A to 20C show an example that the first direction is the x direction, namely the first direction is parallel to the longitudinal direction of the first magnetization free layer 10.

Figure 19A:
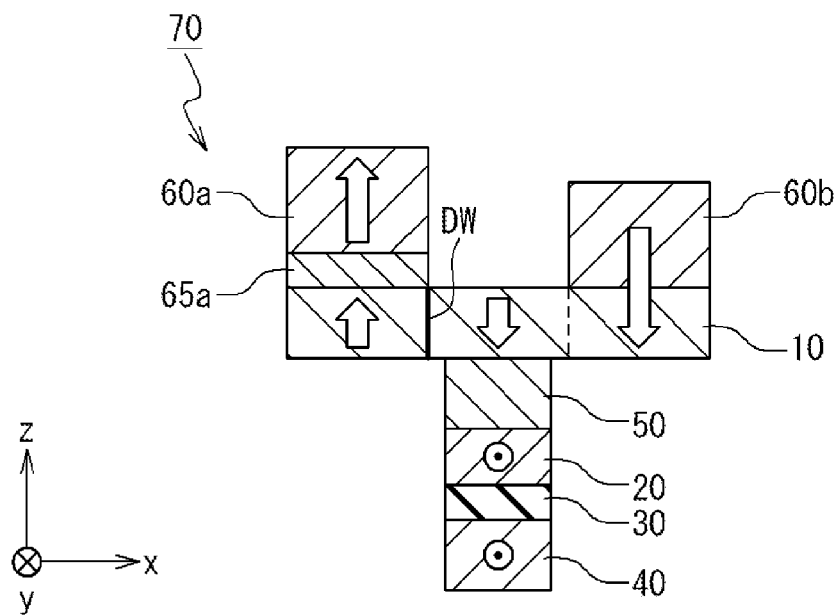
FIG. 19A schematically shows a writing method of the sixth modification example of the magnetic memory element according to the exemplary embodiment of the present invention.
Figure 19B:
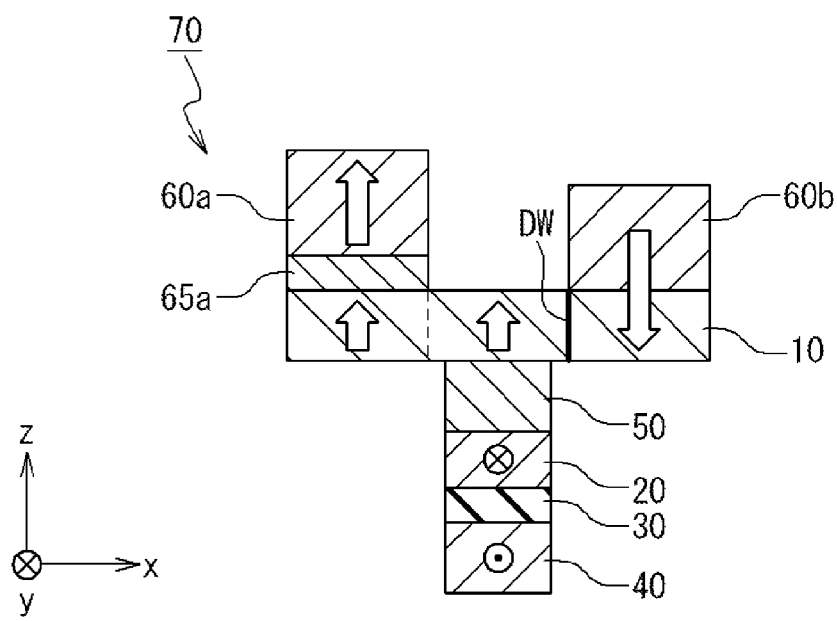
FIG. 19B schematically shows the writing method of the sixth modification example of the magnetic memory element according to the exemplary embodiment of the present invention.
Figure 21A:
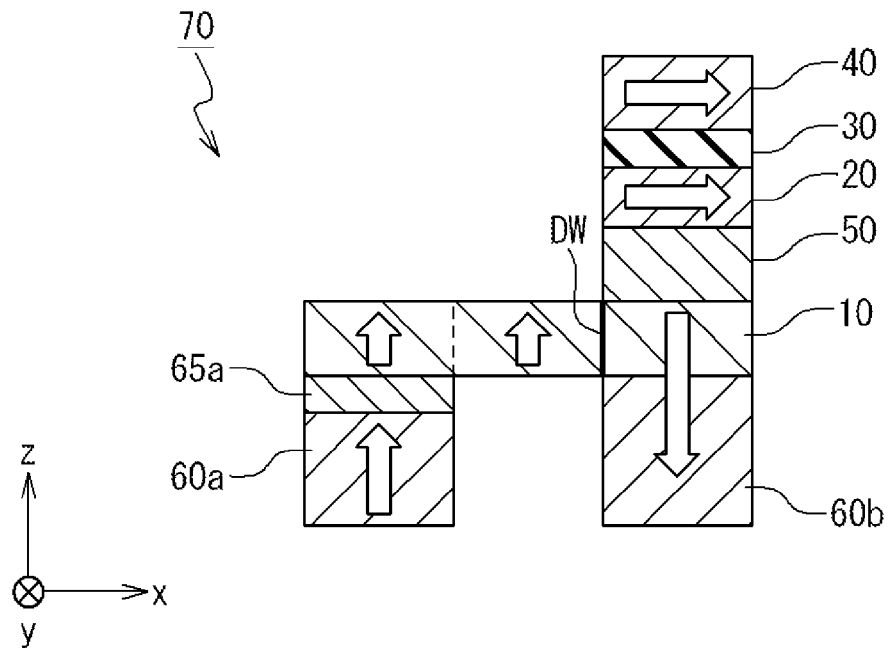
FIG. 21A schematically shows another writing method of the sixth modification example of the magnetic memory element according to the exemplary embodiment of the present invention.
Figure 21B:
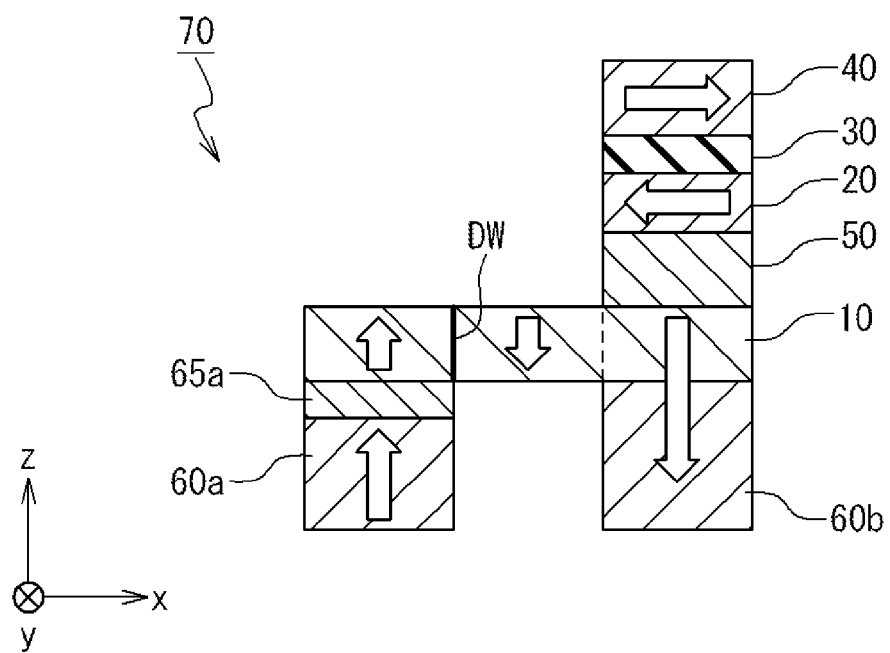
FIG. 21B schematically shows the other writing method of the sixth modification example of the magnetic memory element according to the exemplary embodiment of the present invention.

In the present modification example, the information stored by using the magnetization direction in the perpendicular direction in the magnetization free region 12 can be read by using the MTJ with the in-plane magnetization composed of the second magnetization free layer 20, the non-magnetic layer 30 and the reference layer 40. The principle will be described with FIGS. 19A to 19B, FIGS. 21A to 21B. Here, FIGS. 19A and 19B schematically show the magnetization states in the respective data states in the structure shown in FIGS. 18A to 18D. FIGS. 21A and 21B schematically show the magnetization states in the respective data states in the structure shown in FIGS. 20A to 20D.

FIG. 19A shows the magnetization states of the respective layers in the "0" state by using the arrows. FIG. 19B shows the magnetization states of the respective layers in the "1" state by using the arrows. Here, the magnetization of the first magnetization fixed region 11a, the magnetization of the second magnetization fixed region 11b and the magnetization of the reference layer 40 are fixed in the positive direction of the z axis, the negative direction of the z axis and the negative direction of the y axis, respectively. However, the magnetization of the first magnetization fixed region 11a, the magnetization of the second magnetization fixed region 11b and the magnetization of the reference layer 40 are arbitrary. Since the arbitrary is obvious, its description is omitted.

In the "0" state that the magnetization free region 12 is magnetized in the downward direction as shown in FIG. 19A, the magnetization of the second magnetization free layer 20 is turned in the negative direction of the y axis due to the leakage magnetic flux caused by the magnetization of the magnetization free region 12 with the downward direction. This is because the second magnetization free layer 20 is arranged below the magnetization free region 12 (in the negative direction of the z axis) and the centroid of the second magnetization free layer 20 positionally differs from that of the magnetization free region 12 in the negative direction of the y axis. According to this, the magnetization of the second magnetization free layer 20 is parallel to that of the reference layer 40, and thus, the MTJ becomes in the low resistance state.

In the "1" state that the magnetization free region 12 is magnetized in the upward direction as shown in FIG. 19B, the magnetization of the second magnetization free layer 20 is turned in the positive direction of the y axis due to the leakage magnetic flux caused by the magnetization of the magnetization free region 12 with the upward direction. According to this, the magnetization of the second magnetization free layer 20 is anti-parallel to that of the reference layer 40, and thus, the MTJ becomes in the high resistance state. Consequently, the information stored by using the magnetization in the perpendicular direction in the magnetization free region 12 is transmitted to the magnetization of the second magnetization free layer 20 with the in-plane magnetization, and the information can be read by using the MTJ with the in-plane magnetization.

FIG. 21A shows the magnetization states of the respective layers in the "0" state by using the arrows. FIG. 21B shows the magnetization states of the respective layers in the "1" state by using the arrows. Here, the magnetization of the first magnetization fixed region 11a, the magnetization of the second magnetization fixed region 11b and the magnetization of the reference layer 40 are fixed in the positive direction of the z axis, the negative direction of the z axis and the positive direction of the x axis, respectively. However, the magnetization of the first magnetization fixed region 11a, the magnetization of the second magnetization fixed region 11b and the magnetization of the reference layer 40 are arbitrary. Since the arbitrary is obvious, its description is omitted.

In the "0" state that the magnetization free region 12 is magnetized in the upward direction as shown in FIG. 21A, the magnetization of the second magnetization free layer 20 is turned in the positive direction of the x axis due to the leakage magnetic flux caused by the magnetization of the magnetization free region 12 with the upward direction. This is because the second magnetization free layer 20 is arranged above the magnetization free region 12 (in the positive direction of the z axis) and the centroid of the second magnetization free layer 20 positionally differs from that of the magnetization free region 12 in the positive direction of the x axis. According to this, the magnetization of the second magnetization free layer 20 is parallel to that of the reference layer 40, and thus, the MTJ becomes in the low resistance state.

In the "1" state that the magnetization free region 12 is magnetized in the downward direction as shown in FIG. 21B, the magnetization of the second magnetization free layer 20 is turned in the negative direction of the x axis due to the leakage magnetic flux caused by the magnetization of the magnetization free region 12 with the downward direction. According to this, the magnetization of the second magnetization free layer 20 is anti-parallel to that of the reference layer 40, and thus, the MTJ becomes in the high resistance state. Consequently, the information stored by using the magnetization in the perpendicular direction in the magnetization free region 12 is transmitted to the magnetization of the second magnetization free layer 20 with the in-plane magnetization, and the information can be read by using the MTJ with the in-plane magnetization.

In a MTJ having in-plane magnetization, generally, high magnetoresistive effect ratio (MR ratio) can be obtained. By using this, a large reading signal can be obtained. Here, the second magnetization free layer 20 and the reference layer 40 are composed of material with in-plane magnetic anisotropy. Specifically, Co—Fe—B and so on are exemplified. The non-magnetic layer 30 is preferably composed of non-magnetic material. Specifically, Mg-0 and so on are exemplified.

Seventh Modification Example

FIGS. 22A and 22B and FIGS. 23A and 23B schematically show structures of a seventh modification example of the magnetic memory element 70 according to the exemplary embodiment of the present invention. The seventh modification example relates to a positional relationship between the non-magnetic layer 30 and the reference layer 40 for reading and the blocking layer 65 and the magnetization fixed layer group 60 for initializing.

In the exemplary embodiment shown in FIGS. 1A to 1C, FIGS. 18A to 18D and FIGS. 20A to 20C, the non-magnetic layer 30 and the reference layer 40 for reading and the blocking layer 65 and the magnetization fixed layer group 60 for initializing are provided in the opposite side of the first magnetization free layer 10 to each other. However, in the present exemplary embodiment, the relationship of these positions is arbitrary. FIGS. 22A and 22B and FIGS. 23A and 23B show the modification examples.

Figure 22A:
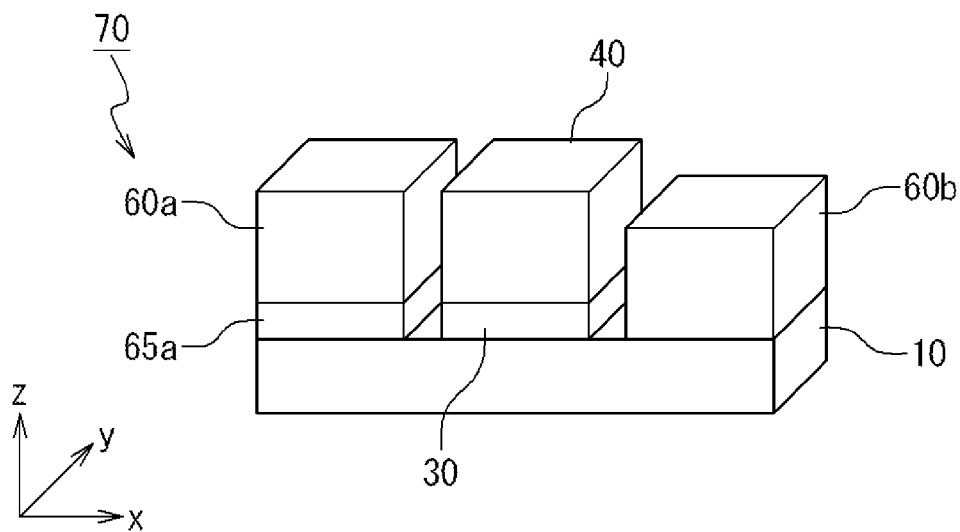
FIG. 22A schematically shows a structure of a seventh modification example of the magnetic memory element according to the exemplary embodiment of the present invention.
Figure 22B:
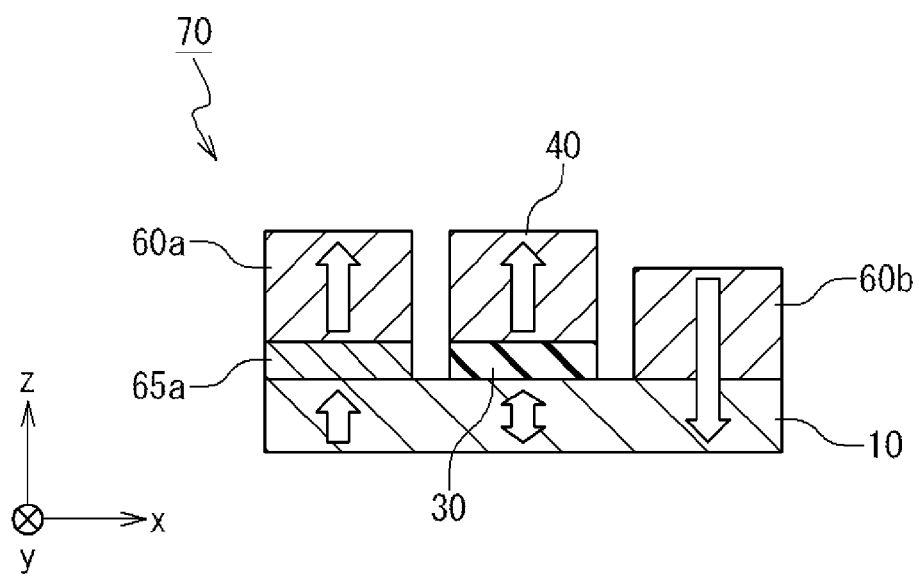
FIG. 22B schematically shows the structure of the seventh modification example of the magnetic memory element according to the exemplary embodiment of the present invention.

FIGS. 22A and 22B show an example of the seventh modification example. It shows the example that both of the non-magnetic layer 30 and the reference layer 40 for reading and the blocking layer 65 and the magnetization fixed layer group 60 for initializing are provided in the same side of the first magnetization free layer 10. FIG. 22A shows its perspective view and FIG. 22B shows its sectional view. In FIG. 22B, examples of magnetization directions are shown as arrows. In the example shown in FIGS. 22A and 22B, the non-magnetic layer 30 is provided adjacent to the upper surface of the first magnetization free layer 10, and the reference layer 40 is provided adjacent to the upper surface of the non-magnetic layer 30. The first blocking layer 65a is provided adjacent to the upper surface of the first magnetization fixed region 11a, and the first magnetization fixed layer group 60a is provided adjacent to the upper surface of the first blocking layer 65a. The second magnetization fixed layer group 60b is provided adjacent to the upper surface of the second magnetization fixed region 11b.

Figure 23A:
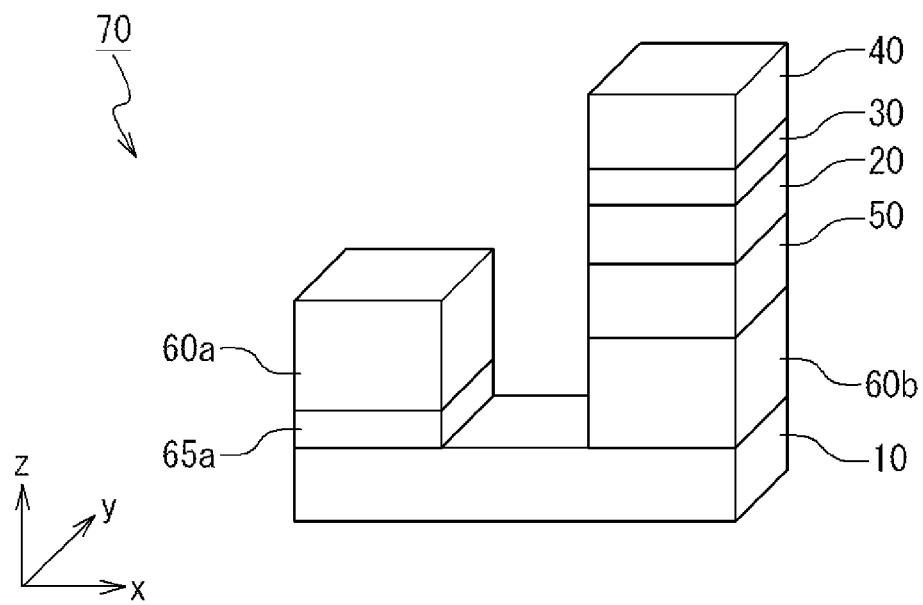
FIG. 23A schematically shows another structure of the seventh modification example of the magnetic memory element according to the exemplary embodiment of the present invention.
Figure 23B:
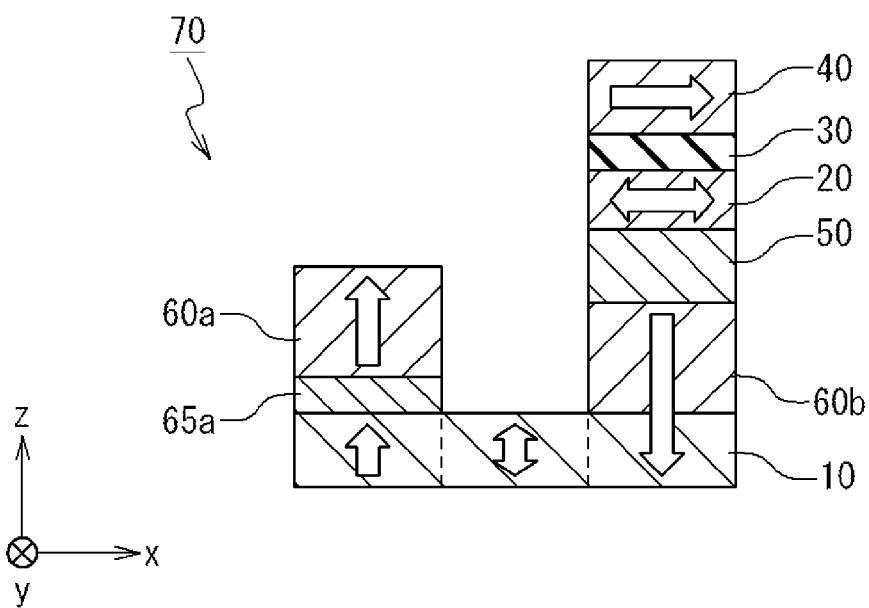
FIG. 23B schematically shows the other structure of the seventh modification example of the magnetic memory element according to the exemplary embodiment of the present invention.

FIGS. 23A and 23B show another example of the seventh modification example. Similarly, it shows the example that both of the non-magnetic layer 30 and the reference layer 40 for reading and the blocking layer 65 and the magnetization fixed layer group 60 for initializing are provided in the same side of the first magnetization free layer 10. FIG. 23A shows its perspective view and FIG. 23B shows its sectional view. In FIG. 23, examples of magnetization directions are shown as arrows. In the example shown in FIGS. 23A and 23B, the first blocking layer 65a is provided adjacent to the upper surface of the first magnetization fixed region 11a, and the first magnetization fixed layer group 60a is provided adjacent to the upper surface of the first blocking layer 65a. The second magnetization fixed layer group 60b is provided adjacent to the upper surface of the second magnetization fixed region 11b. Further, the contact layer 50 is provided adjacent to the upper surface of the second magnetization fixed layer group 60b, and the second magnetization free layer 20, the non-magnetic layer 30 and the reference layer 40 are provided adjacent to the upper surface of the contact layer 50 in this order.

In this way, the positional relationship between the non-magnetic layer 30 and the reference layer 40 for reading and the blocking layer 65 and the magnetization fixed layer group 60 for initializing is arbitrary. They may be provided in the same side and may be provided in the different side.

Eighth Modification Example

FIGS. 24A and 24B, FIGS. 25A and 25B and FIG. 26 schematically show structures of an eighth modification example of the magnetic memory element 70 according to the exemplary embodiment of the present invention. The eighth modification example relates to pinning sites of the first magnetization free layer 10.

In the magnetic memory element 70 according to the exemplary embodiment, information is stored as the position of the domain wall. Therefore, the stability of the stored information depends on the depth of the pin potential of the pinning site of the domain wall. The exemplary embodiments described above show the examples that the pinning site of the domain wall is not formed consciously. However, in the present exemplary embodiment, the pinning site of the domain wall may be formed consciously in the first magnetization free layer 10. FIGS. 24A and 24B, FIGS. 25A and 25B and FIG. 26 show the examples.

Figure 24A:
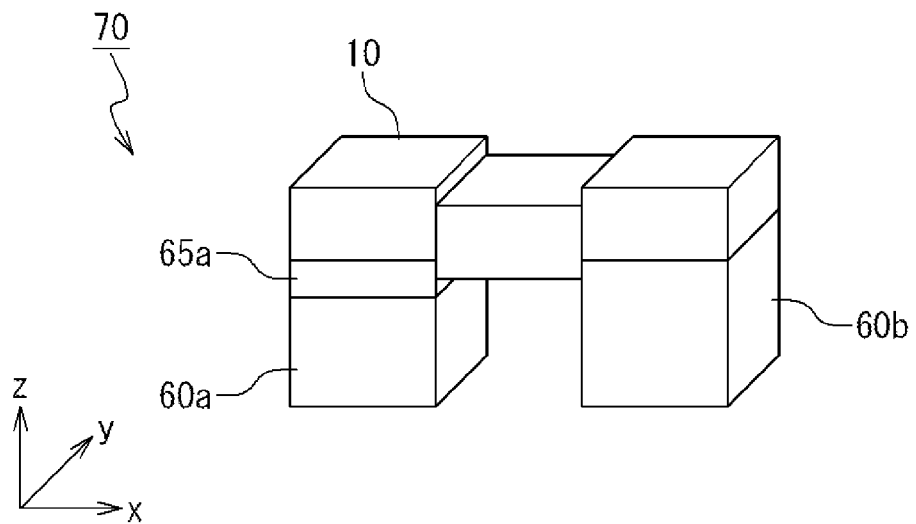
FIG. 24A schematically shows a structure of an eighth modification example of the magnetic memory element according to the exemplary embodiment of the present invention.
Figure 24B:
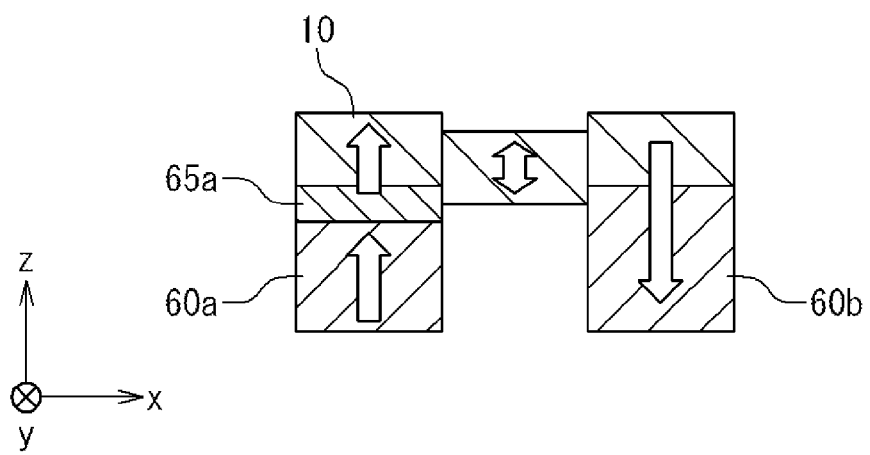
FIG. 24B schematically shows the structure of the eighth modification example of the magnetic memory element according to the exemplary embodiment of the present invention.
Figure 25A:
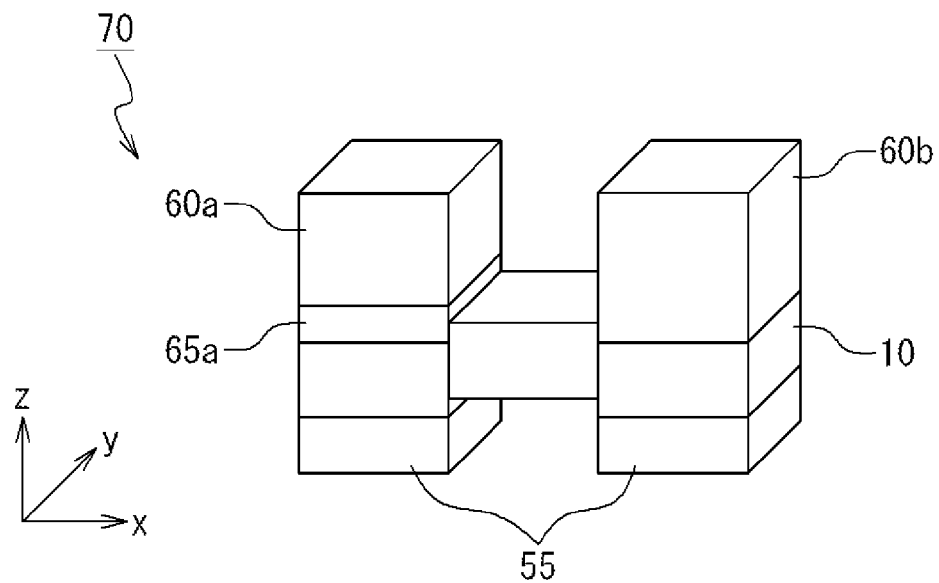
FIG. 25A schematically shows another structure of the eighth modification example of the magnetic memory element according to the exemplary embodiment of the present invention.
Figure 25B:
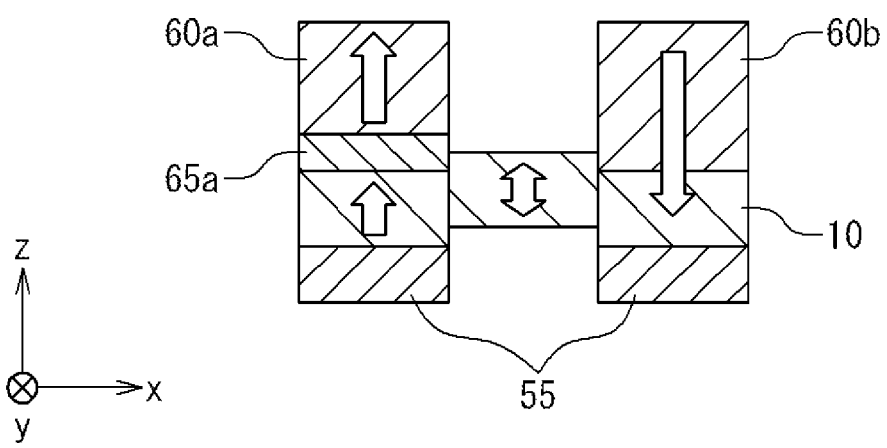
FIG. 25B schematically shows the other structure of the eighth modification example of the magnetic memory element according to the exemplary embodiment of the pre sent invention, and FIG. 26 schematically shows still another structure of the eighth modification example of the magnetic memory element according to the exemplary embodiment of the pre sent invention.

FIGS. 24A and 24B and FIGS. 25A and 25B show examples of the modification example. They shows the examples that steps are formed in the cross section of the first magnetization free layer 10 for the pinning sites of the domain wall. FIG. 24A and FIG. 25A show perspective views, and FIG. 24B and FIG. 25B show sectional views. As respectively shown in FIGS. 24A and 24B and FIGS. 25A and 25B, by forming the steps in the first magnetization free layer 10, the positions of the steps become the pinning sites of the domain wall, thereby improving the stability of the stored information. Incidentally, as shown in FIGS. 25A and 25B, to form such steps, step adjusting layers 55 may be provided.

Figure 26:
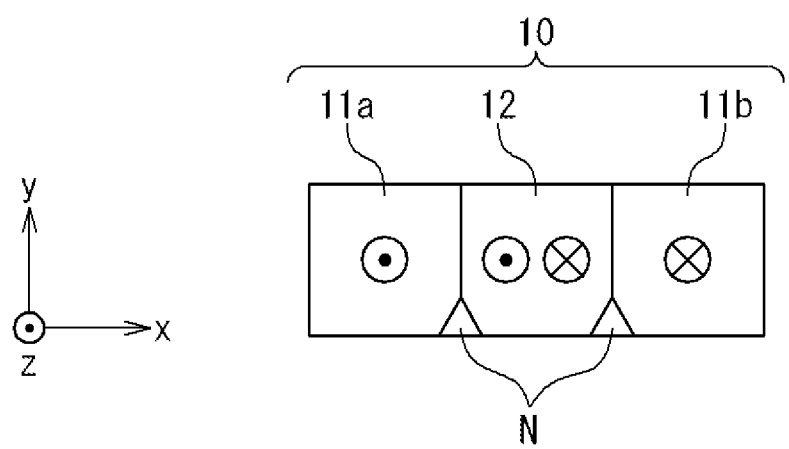

FIG. 26 shows another example of the eighth modification example. It shows the example that the plane shape of the first magnetization free layer 10 is modified for the pinning sites of the domain wall. In the example of FIG. 26, the notches N are provided as the modification. As shown in FIG. 26, by providing the notches N in the first magnetization free layer 10, the positions of these notches N become the pinning sites of the domain wall, thereby improving the stability of the stored information.

As application examples of the above described exemplary embodiment (including the modification examples), a nonvolatile semiconductor memory device used for a cellular phone, a mobile personal computer and a PDA, and a microcomputer in which a nonvolatile memory is embedded used for an automobile are exemplified.

As described in the exemplary embodiment (including the modification examples) according to the present invention, in the MRAM that the current induced domain wall motion is used for the information writing method and the layer where the domain wall motion arises is composed of material with perpendicular magnetic anisotropy, the structure and the initializing method in which the large initialization margin can be acquired can be provided. In addition, in the MRAM that the current induced domain wall motion is used for the information writing method, the layer where the domain wall motion arises is composed of material with perpendicular magnetic anisotropy and the large initialization margin can be acquired, the structure in which the MRAM can be easily manufactured can be provided.

While the invention has been particularly shown and described with reference to exemplary embodiments (including modification examples) thereof, the invention is not limited to these exemplary embodiments. It will be understood by those of ordinary skill in the art that various changes in form and details may be made therein without departing from the spirit and scope of the present invention as defined by the claims.

This application is based upon and claims the benefit of priority from Japanese patent application No. 2009-245947 filed on Oct. 26, 2009, the disclosure of which is incorporated herein in its entirety by reference.

The invention claimed is:

1. A magnetic memory element comprising:
a first magnetization free layer configured to be composed of ferromagnetic material with perpendicular magnetic anisotropy and include a first magnetization fixed region, a second magnetization fixed region and a magnetization free region coupled to the first magnetization fixed region and the second magnetization fixed region;
a non-magnetic layer configured to be provided near the first magnetization free layer;
a reference layer configured to be composed of ferromagnetic material and provided on the non-magnetic layer;
a first magnetization fixed layer group configured to be provided near the first magnetization fixed region; and
a first blocking layer configured to be provided being sandwiched between the first magnetization fixed layer group and the first magnetization fixed region or in the first magnetization fixed layer group.

2. The magnetic memory element according to claim 1, further comprising:
a second magnetization fixed layer group configured to be provided near the second magnetization fixed region.

3. The magnetic memory element according to claim 2, wherein the second magnetization fixed layer group is provided adjacent to the second magnetization fixed region.

4. The magnetic memory element according to claim 2, further comprising:
a second blocking layer configured to be provided being sandwiched between the second magnetization fixed layer group and the second magnetization fixed region or in the second magnetization fixed layer group,
wherein the first magnetization fixed layer group and the second magnetization fixed layer group have configurations different from each other.

5. The magnetic memory element according to claim 2, wherein the first magnetization fixed layer group and the second magnetization fixed layer group are provided in the same side of the first magnetization free layer, and
wherein the non-magnetic layer and the reference layer is provided in the opposite side of the first magnetization free layer from the first magnetization fixed layer group and the second magnetization fixed layer group.

6. The magnetic memory element according to claim 1, wherein the non-magnetic layer is provided adjacent to the magnetization free region,
wherein the reference layer is provided adjacent to the non-magnetic layer and in the opposite side to the magnetization free region, and
wherein the reference layer is composed of ferromagnetic material with perpendicular magnetic anisotropy.

7. The magnetic memory element according to claim 1, further comprising:
a second magnetization free layer configured to be provided positionally differing from the magnetization free region in a first direction within a surface plane parallel to a substrate,
wherein the second magnetization free layer and the reference layer are composed of ferromagnetic material with in-plane magnetic anisotropy, and
wherein the reference layer has magnetization fixed in a direction approximately parallel to the first direction.

8. A magnetic memory comprising:
a plurality of magnetic memory elements configured to be arranged in a matrix; and
a control circuit configured to control writing and reading of data to and from each of the plurality of magnetic memory elements,
wherein each of the plurality of magnetic memory elements includes:
a first magnetization free layer configured to be composed of ferromagnetic material with perpendicular magnetic anisotropy and include a first magnetization fixed region, a second magnetization fixed region and a magnetization free region coupled to the first magnetization fixed region and the second magnetization fixed region;
a non-magnetic layer configured to be provided near the first magnetization free layer;
a reference layer configured to be composed of ferromagnetic material and provided on the non-magnetic layer;
a first magnetization fixed layer group configured to be provided near the first magnetization fixed region; and
a first blocking layer configured to be provided being sandwiched between the first magnetization fixed layer group and the first magnetization fixed region or in the first magnetization fixed layer group.

9. An initializing method of a magnetic memory element, wherein the magnetic memory element includes:
a first magnetization free layer configured to be composed of ferromagnetic material with perpendicular magnetic anisotropy and include a first magnetization fixed region, a second magnetization fixed region and a magnetization free region coupled to the first magnetization fixed region and the second magnetization fixed region,
a non-magnetic layer configured to be provided near the first magnetization free layer,
a reference layer configured to be composed of ferromagnetic material and provided on the non-magnetic layer,
a first magnetization fixed layer group configured to be provided near the first magnetization fixed region, and
a first blocking layer configured to be provided being sandwiched between the first magnetization fixed layer group and the first magnetization fixed region or in the first magnetization fixed layer group,
the initializing method of a magnetic memory element comprising:
applying a first magnetic field to the magnetic memory element in a direction approximately perpendicular to an upper surface of the first magnetization free layer; and
applying a second magnetic field whose absolute value is smaller than that of the first magnetic field to the magnetic memory element in a direction opposite to that of the first magnetic field.

10. The initializing method of a magnetic memory element according to claim 9, wherein a magnitude of the second magnetic field is set such that magnetization of at least a part of the first magnetization fixed layer group is not reversed.

11. The initializing method of a magnetic memory element according to claim 9, further comprising:
applying a third magnetic field whose absolute value is smaller than that of the first magnetic field to the magnetic memory element in the same direction as that of the first magnetic field, after the applying the second magnetic field.

12. An initializing method of a magnetic memory, wherein the magnetic memory includes:
a plurality of magnetic memory elements configured to be arranged in a matrix,
wherein each of the plurality of magnetic memory elements includes:
a first magnetization free layer configured to be composed of ferromagnetic material with perpendicular magnetic anisotropy and include a first magnetization fixed region, a second magnetization fixed region and a magnetization free region coupled to the first magnetization fixed region and the second magnetization fixed region,
a non-magnetic layer configured to be provided near the first magnetization free layer,
a reference layer configured to be composed of ferromagnetic material and provided on the non-magnetic layer,
a first magnetization fixed layer group configured to be provided near the first magnetization fixed region, and
a first blocking layer configured to be provided being sandwiched between the first magnetization fixed layer group and the first magnetization fixed region or in the first magnetization fixed layer group,
the initializing method of a magnetic memory comprising:
performing an initializing method of a magnetic memory element on the plurality of magnetic memory elements,
wherein the initializing method of a magnetic memory element includes:
applying a first magnetic field to the magnetic memory element in a direction approximately perpendicular to an upper surface of the first magnetization free layer; and
applying a second magnetic field whose absolute value is smaller than that of the first magnetic field to the magnetic memory element in a direction opposite to that of the first magnetic field.

13. The magnetic memory according to claim 8, wherein the magnetic memory element further includes:
a second magnetization fixed layer group configured to be provided near the second magnetization fixed region.

14. The magnetic memory according to claim 13, wherein the second magnetization fixed layer group is provided adjacent to the second magnetization fixed region.

15. The magnetic memory according to claim 13, wherein the magnetic memory element further includes:
a second blocking layer configured to be provided being sandwiched between the second magnetization fixed layer group and the second magnetization fixed region or in the second magnetization fixed layer group,
wherein the first magnetization fixed layer group and the second magnetization fixed layer group have configurations different from each other.

16. The magnetic memory according to claim 13, wherein the first magnetization fixed layer group and the second magnetization fixed layer group are provided in the same side of the first magnetization free layer, and
wherein the non-magnetic layer and the reference layer is provided in the opposite side of the first magnetization free layer from the first magnetization fixed layer group and the second magnetization fixed layer group.

17. The magnetic memory element according to claim 8, wherein the non-magnetic layer is provided adjacent to the magnetization free region,
wherein the reference layer is provided adjacent to the non-magnetic layer and in the opposite side to the magnetization free region, and
wherein the reference layer is composed of ferromagnetic material with perpendicular magnetic anisotropy.

18. The magnetic memory element according to claim 8, wherein the magnetic memory element further includes:
a second magnetization free layer configured to be provided positionally differing from the magnetization free region in a first direction within a surface plane parallel to a substrate,
wherein the second magnetization free layer and the reference layer are composed of ferromagnetic material with in-plane magnetic anisotropy, and
wherein the reference layer has magnetization fixed in a direction approximately parallel to the first direction.

19. The initializing method of a magnetic memory according to claim 12, wherein a magnitude of the second magnetic field is set such that magnetization of at least a part of the first magnetization fixed layer group is not reversed.

20. The initializing method of a magnetic memory according to claim 12, wherein the initializing method of a magnetic memory element further includes:
applying a third magnetic field whose absolute value is smaller than that of the first magnetic field to the magnetic memory element in the same direction as that of the first magnetic field, after the applying the second magnetic field.

* * * * *